United States Patent
Kim et al.

(10) Patent No.: US 9,865,540 B2
(45) Date of Patent: Jan. 9, 2018

(54) VERTICAL MEMORY DEVICES AND METHODS OF MANUFACTURING THE SAME

(71) Applicant: SAMSUNG ELECTRONICS CO., LTD., Suwon-si, Gyeonggi-do (KR)

(72) Inventors: Hyuk Kim, Seongnam-si (KR); Jae-Ho Min, Suwon-si (KR); Jong-Kyoung Park, Suwon-si (KR); Seung-Pil Chung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/207,610

(22) Filed: Jul. 12, 2016

(65) Prior Publication Data

US 2017/0117222 A1 Apr. 27, 2017

(30) Foreign Application Priority Data

Oct. 22, 2015 (KR) ........................ 10-2015-0147061

(51) Int. Cl.
| | |
|---|---|
| *H01L 29/792* | (2006.01) |
| *H01L 23/528* | (2006.01) |
| *H01L 21/768* | (2006.01) |
| *H01L 23/522* | (2006.01) |
| *H01L 27/11573* | (2017.01) |
| *H01L 27/11582* | (2017.01) |
| *H01L 27/11575* | (2017.01) |
| *H01L 27/1157* | (2017.01) |

(52) U.S. Cl.
CPC .... *H01L 23/5283* (2013.01); *H01L 21/76816* (2013.01); *H01L 21/76829* (2013.01); *H01L 21/76877* (2013.01); *H01L 23/5226* (2013.01); *H01L 27/11573* (2013.01); *H01L 27/11575* (2013.01); *H01L 27/11582* (2013.01); *H01L 27/1157* (2013.01)

(58) Field of Classification Search
CPC ..................... H01L 23/5283; H01L 23/5226
USPC ......................................... 257/324
See application file for complete search history.

(56) References Cited

U.S. PATENT DOCUMENTS

| | | | |
|---|---|---|---|
| 7,679,133 B2 | 3/2010 | Son et al. | |
| 7,799,672 B2 | 9/2010 | Hashimoto et al. | |
| 8,193,571 B2 | 6/2012 | Katsumata et al. | |
| 8,553,466 B2 | 10/2013 | Han et al. | |
| 8,559,235 B2 | 10/2013 | Yoon | |
| 8,592,912 B2 | 11/2013 | Hwang et al. | |
| 8,654,587 B2 | 2/2014 | Yoon | |
| 8,736,069 B2 | 5/2014 | Chiu et al. | |
| 8,912,593 B2 | 12/2014 | Matsuda | |
| 8,928,149 B2 | 1/2015 | Chen | |

(Continued)

FOREIGN PATENT DOCUMENTS

KR 10-2015-0051841 A 5/2015

*Primary Examiner* — Anthony Ho
(74) *Attorney, Agent, or Firm* — Lee & Morse, P.C.

(57) ABSTRACT

A vertical memory device includes a plurality of gate lines, at least one etch-stop layer, channels, and contacts. The gate lines are stacked and spaced apart from each other along a first direction with respect to a surface of substrate. Each of the gate lines includes step portion protruding in a second direction. The at least one etch-stop layer covers the step portion of at least one of the gate lines and includes conductive material. The channels extend through the gate lines in the first direction. The contacts extend through the at least one etch-stop layer and are on the step portions of the gate lines.

19 Claims, 43 Drawing Sheets

(56) References Cited

U.S. PATENT DOCUMENTS

| | | |
|---|---|---|
| 2011/0199813 A1 | 8/2011 | Yoo et al. |
| 2011/0233648 A1 | 9/2011 | Seol et al. |
| 2012/0070944 A1 | 3/2012 | Kim et al. |
| 2013/0234232 A1 | 9/2013 | Yahashi |
| 2015/0179663 A1 | 6/2015 | Lee et al. |

VERTICAL MEMORY DEVICES AND METHODS OF MANUFACTURING THE SAME

CROSS-REFERENCE TO RELATED APPLICATION

Korean Patent Application No. 10-2015-0147061, filed on Oct. 22, 2015, and entitled, "Vertical Memory Devices and Methods of Manufacturing the Same," is incorporated by reference herein in its entirety.

BACKGROUND

1. Field

One or more embodiments described herein relate to vertical memory devices and methods for manufacturing vertical memory devices.

2. Description of the Related Art

A vertical memory device has been developed having a relatively high degree of integration. Such a memory device includes memory cells stacked vertically with respect to the surface of a substrate. A channel having a pillar or cylindrical shape protrudes vertically from the substrate surface, and gate lines and insulation layers surrounding the channel are repeatedly stacked.

As the degree of integration of the vertical memory device increases, the numbers of the gate lines and insulation layers increase. Thus, structural and electrical reliability of the vertical memory device may not be easily achieved.

SUMMARY

In accordance with one or more embodiments, a vertical memory device includes a substrate; gate lines stacked and spaced apart from each other along a first direction with respect to a surface of the substrate, each of the gate lines including a step portion protruding in a second direction; at least one etch-stop layer covering the step portion of at least one of the gate lines and including a conductive material; channels extending through the gate lines in the first direction; and contacts extending through the at least one etch-stop layer and on the step portions of the gate lines.

The vertical memory device may include insulating interlayer patterns spaced apart from each other by the gate lines along the first direction, each of the insulating interlayer patterns including a step portion protruding in the second direction. The at least one etch-stop layer may include a first etch-stop layer arranged along the step portions of the insulating interlayer patterns, the first etch-stop layer including an oxide; and a second etch-stop layer on the first etch-stop layer and including a conductive material. The second-etch stop layer may include a same metal as in the gate lines. The first etch-stop layer may include a same oxide as in the insulating interlayer patterns. The second etch-stop layer may be divided per each step portion of the insulating interlayer patterns. The contacts may be physically separated from the at least one etch-stop layer. The vertical memory device may include a plurality of contact spacers surrounding sidewalls of the contacts.

The at least one etch-stop layer may cover step portions of at least some of the gate lines. The gate lines may include a ground selection line (GSL), word lines, and a string selection line (SSL) sequentially stacked from the top surface of the substrate. The at least one etch-stop layer may only cover step portions of the GSL and the word lines. The at least one etch-stop layer may only cover step portions of predetermined ones of the word lines. The substrate may include a cell region on which the channels are disposed; an extension region on which the step portions of the gate lines are disposed; and a peripheral circuit region, wherein the at least one etch-stop layer is only on the cell region and the extension region.

In accordance with one or more other embodiments, a vertical memory device includes a substrate; a gate line stack structure on the substrate and including: gate lines stacked and spaced apart from each other in a first direction with respect to a surface of the substrate; insulating interlayer patterns stacked and spaced apart from each other by the gate lines in the first direction; and channels extending through the insulating interlayer patterns and the gate lines in the first direction; a first etch-stop layer on the gate line stack structure and including an insulation material; a second etch-stop layer on the first etch-stop layer and including a conductive material; and contacts extending through the second etch-stop layer and the first etch-stop layer and electrically connected to the gate lines. The insulating interlayer patterns and the gate lines may be alternately stacked along the first direction in a stepped shape, the insulating interlayer patterns and gate lines may include step portions protruding in a second direction, and step portions of the gate lines may be covered by step portions of the insulating interlayer patterns.

In accordance with one or more other embodiments, a memory device includes a substrate; a plurality of gate lines stacked on the substrate; a plurality of insulating layers between the gate lines respectively, the gate lines and insulating layers arranged in steps; a first etch-stop layer on the steps and including a first material; a second etch-stop layer on the first etch-stop layer and including a second material different from the first material; channels extending through the gate lines; and contacts extending through the first and second etch-stop layers to contact respective ones of the gate lines through corresponding ones of the insulating layers. The first material may be an oxide, and the second material may be a conductive material. The first etch-stop layer may include the first material, and the second-etch stop layer may include the second material. The gate lines may include a ground selection line, word lines, and a string selection line sequentially stacked from the surface of the substrate. The first and second etch-stop layers may cover only step portions of predetermined ones of the GSL and the word lines.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
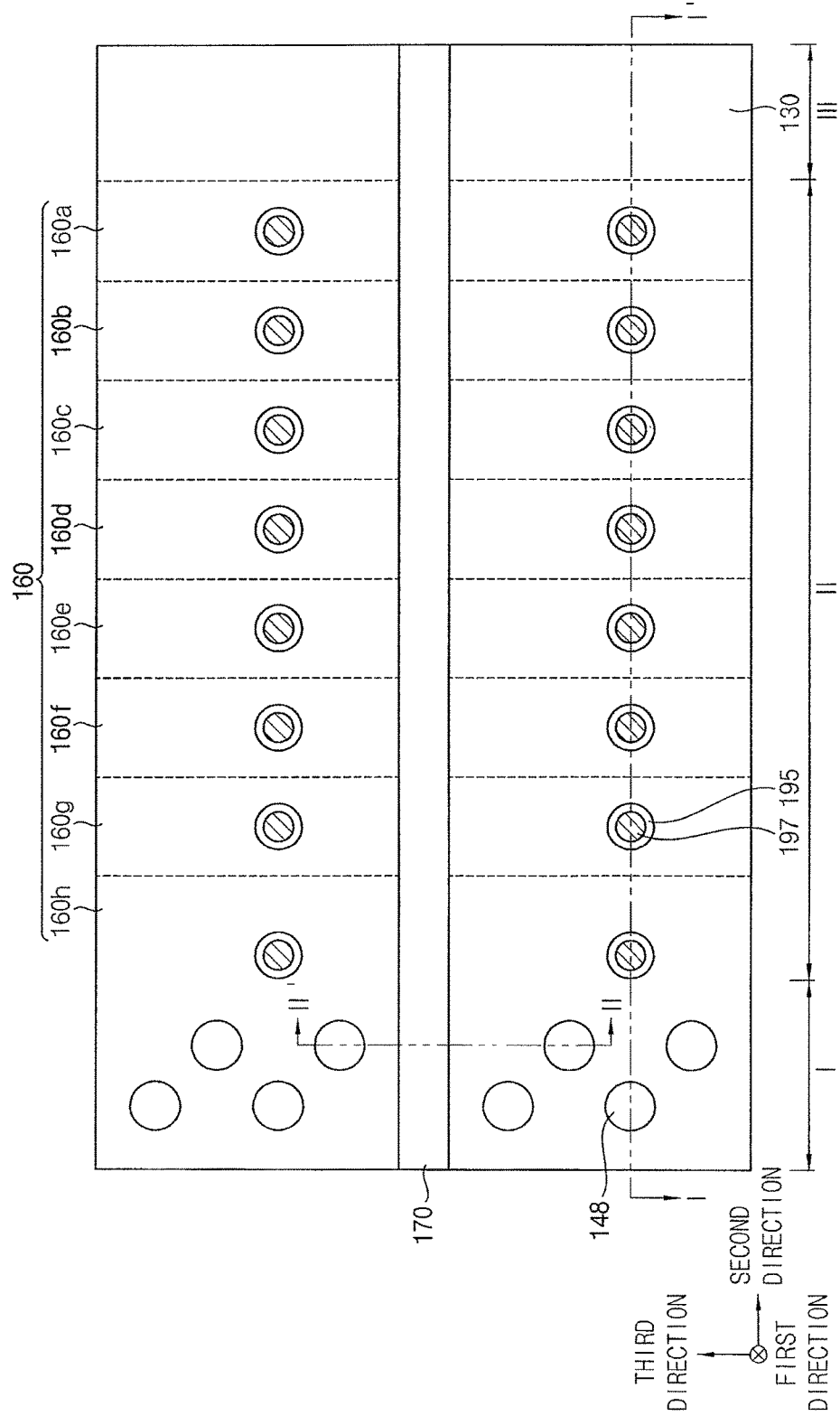
FIGS. 1 to 3 illustrate an embodiment of a vertical memory device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
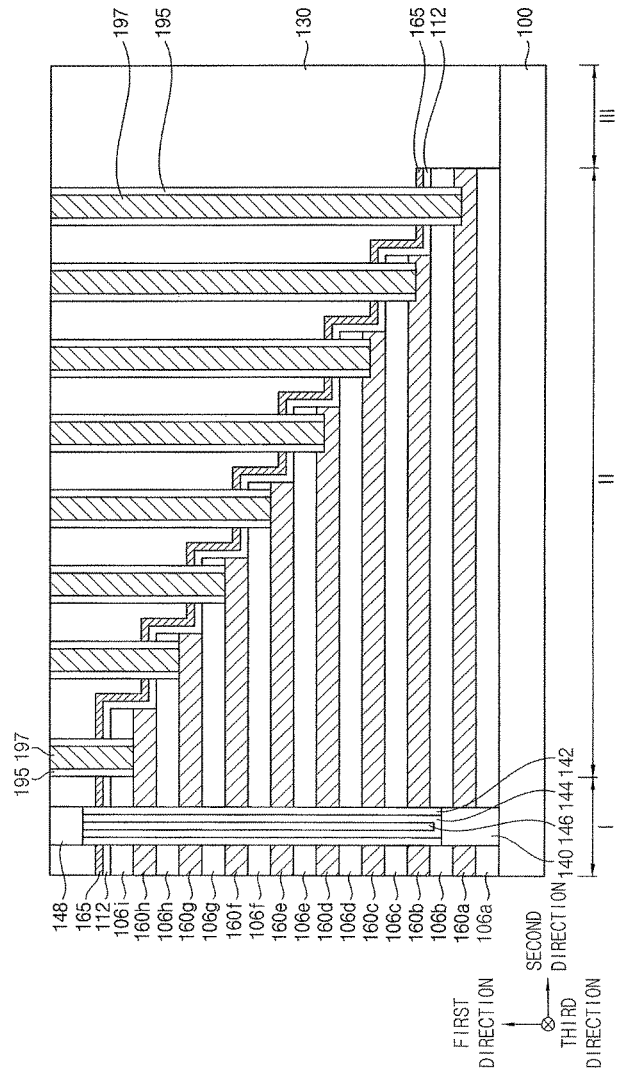
Figure 3:
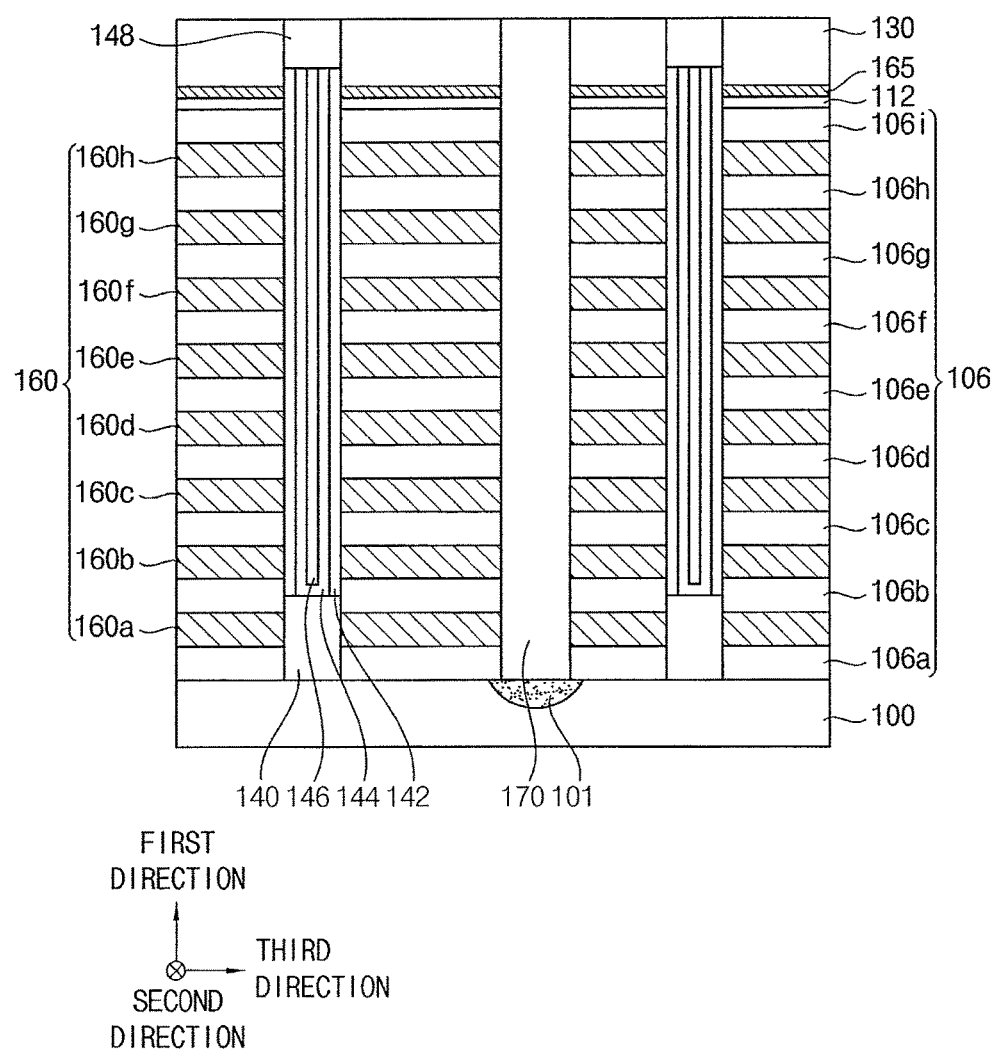

FIG. 1 illustrates a top plan view of an embodiment of a vertical memory device, and FIGS. 2 and 3 illustrate cross-sectional views taken along lines I-I' and II-II' in FIG. 1, respectively. In FIGS. 1 to 3, a direction substantially vertical to a top surface of a substrate is a first direction, and two directions substantially parallel to the top surface of the substrate and crossing each other are second and third directions. For example, the second and third directions are substantially perpendicular to each other. Additionally, a direction indicated by an arrow and a reverse direction thereof are considered as the same direction. The above mentioned definitions of the directions are the same throughout all the figures in this specification. (For convenience of descriptions, an illustration of some insulative structures is omitted in FIG. 1).

Referring to FIGS. 1 to 3, the vertical memory device may include a vertical channel structure, including a channel 144, a dielectric layer structure 142, and a filling insulation pattern 146, extending in the first direction from a top surface of a substrate 100. The vertical memory device may also include gate lines 160, e.g., gate lines 160a to 160h, surrounding the vertical channel structure and stacked in a stepped shape along the first direction. Contacts 197 are electrically connected to the gate lines 160 and may extend through a mold protection layer 130, a second etch-stop layer pattern 165, a first etch-stop layer pattern 112, and an insulating interlayer pattern 106 at each level. The contacts 197 may be electrically connected to a step portion of the gate line 160 at each level.

In particular, the gate lines 160a-160h may be stacked on one another in the first direction and may extend along the second direction such that the gate line 106a extends further away in the second direction than adjacent gate line 106b, and so forth. The decrease in length in the second direction among the gate lines 160a-160h may be the same or different among various embodiments to thereby form a step pattern.

The substrate 100 may include a semiconductor material, e.g., silicon and/or germanium. In example embodiments, the substrate 100 may include single crystalline silicon, e.g., a p-type well of the vertical memory device.

The vertical memory device may include a first region I, a second region II, and a third region III. Accordingly, the substrate 100 may be divided into the first region I, the second region II, and the third region III. In example embodiments, the first region I, the second region II, and the third region III may correspond to a cell region, an extension region, and a peripheral circuit region, respectively.

Memory cells of the vertical memory device may be on the cell region. For example, a cell string may be defined by the vertical channel structure and the gate lines 160 surrounding the vertical channel structure. The gate lines 160 may extend in the second direction, and the step portions of the gate lines 160 may be on the extension region. A peripheral circuit to drive the vertical memory device may be on the peripheral circuit region. In some embodiments, a pair of second regions II may be located symmetrically with respect to the first region I.

The channel 144 may be on the first region I of the substrate 100 and may have a hollow cylindrical shape or a cup shape. The channel 144 may include polysilicon or single crystalline silicon, and may include p-type impurities such as boron (B) in a portion thereof.

The filling insulation pattern 146 may fill an inner space of the channel 144, and may have a solid cylindrical shape or a pillar shape. The filling insulation pattern 146 may include an insulation material such as silicon oxide. In an embodiment, the channel 144 may have a pillar shape or a solid cylindrical shape, and the filling insulation pattern 146 may be omitted.

The dielectric layer structure 142 may be formed on an outer sidewall of the channel 144 and may have a straw shape. The dielectric layer structure 142 may include a tunnel insulation layer, a charge storage layer, and a blocking layer sequentially stacked from the outer sidewall of the channel 144. The blocking layer may include silicon oxide or a metal oxide such as hafnium oxide or aluminum oxide. The charge storage layer may include a nitride such as silicon nitride or a metal oxide. The tunnel insulation layer may include an oxide such as silicon oxide. For example, the dielectric layer structure 142 may have an oxide-nitride-oxide (ONO) layered structure.

As illustrated in FIGS. 2 and 3, a semiconductor pattern 140 may be between the top surface of the substrate 100 and the vertical channel structure. In example embodiments, a channel hole may be formed through the gate lines 160 and the insulating interlayer patterns 106. The top surface of the substrate 100 may be exposed through the channel hole. The semiconductor pattern 140 may be formed at a lower portion of the channel hole to be in contact with the top surface of the substrate 100. The channel 144 may be on a top surface of the semiconductor pattern 140. The dielectric layer structure 142 may be on a peripheral portion of the top surface of the semiconductor pattern 140.

A pad 148 may be formed on the dielectric layer structure 142, the channel 144, and the filling insulation pattern 146. For example, an upper portion of the channel hole may be capped by the pad 148. For example, the pad 148 may be electrically connected to, e.g., a bit line, and may serve as a source/drain region through which charges are moved or transferred to the channel 144. The semiconductor pattern 140 and the pad 148 may include polysilicon or single crystalline silicon. In some embodiments, the pad 148 may be optionally doped with n-type impurities such as phosphorus (P) or arsenic (As).

In example embodiments, a plurality of the pads 148 may be arranged along the second direction on the first region I in a pad row. A plurality of pad rows may be arranged in the third direction. For convenience of descriptions, only one pad 148 is illustrated per each pad row in FIG. 1.

The vertical channel structures may also be arranged according to an arrangement of the pads 148. For example, a plurality of the vertical channel structures may be arranged along the second direction on the first region I to form a channel row, and a plurality of the channel rows may be arranged in the third direction.

The gate lines 160 (e.g., 160a through 160h) may be formed on an outer sidewall of the dielectric layer structure 142 or the semiconductor pattern 140. The gate lines 160 may be spaced apart from each other along the first direction. In example embodiments, each gate line 160 may partially surround the channels 144 or the vertical channel structures in at least one of the channel rows, and may extend in the second direction.

In some embodiments, each gate line 160 may surround the predetermined number of the channel rows, e.g., 4 channel rows. In this case, a gate line stack structure may be defined by the 4 channel rows and the gate lines 160 surrounding the 4 channel rows. A plurality of the gate line stack structures may be arranged along the third direction.

In example embodiments, widths or length of the gate lines 160 in the second direction may be reduced along the first direction from the top surface of the substrate 100. For example, as illustrated in FIGS. 1 and 2, a plurality of the gate lines 160 may be stacked in a pyramidal shape or a stepped shape. Accordingly, the gate line 160 of each level may include the step portion protruding in the second direction from the gate line 160 at an upper level thereof. The step portion of the gate line 160 may serve as a pad on which the contact 197 may be disposed. The step portions of the gate lines 160 may be arranged on the second region II.

The gate lines 160 may include a ground selection line (GSL), a word line, and a string selection line (SSL). For example, a lowermost gate line 160a may serve as the GSL, an uppermost gate line 160h may serve as the SSL, and the gate lines 160b to 160g between the GSL and the SSL may serve as the word lines. The GSL (e.g., gate line 160a) may laterally surround the semiconductor pattern 140. The word lines (e.g., gate lines 160b to 160g) and the SSL (e.g., gate line 160h) may laterally surround the channel 144 or the dielectric layer structure 142.

The gate lines 160 may be formed at increased levels in consideration of circuit design and/or degree of integration of the vertical memory device, e.g. 16 levels, 24 levels, 32 levels, 48 levels, etc. The SSLs may be formed at two or more levels.

The gate line 160 may include a metal such as tungsten (W), a metal nitride, and/or a metal silicide. In some example embodiments, the gate line 160 may include tungsten. In some embodiments, the gate line 160 may have a multi-layered structure of a metal nitride/metal, e.g., tungsten nitride/tungsten.

The gate line stack structure may further include the insulating interlayer patterns 106 (e.g., 106a through 106i). The insulating interlayer patterns 106 may be between the gate lines 160 neighboring in the first direction.

A lowermost insulating interlayer pattern 106a may be formed between the GSL 160a and the top surface of the substrate 100. As illustrated in FIG. 2, the lowermost insulating interlayer pattern 106a may cover the first region I and the second region II of the substrate 100. In some embodiments, the lowermost insulating interlayer pattern 106a may commonly cover the first region I, the second region II, and the third region III of the substrate 100. An uppermost insulating interlayer pattern 106i may be on the SSL 160h.

The insulating interlayer pattern 106 may include a silicon oxide-based material, e.g., silicon dioxide ($SiO_2$), silicon oxycarbide (SiOC), or silicon oxyfluoride (SiOF). The gate lines 160 in one gate line stack structure may be insulated from each other by the insulating interlayer patterns 106. In example embodiments, the insulating interlayer patterns 106 may be stacked along the first direction, for example, in a pyramidal shape or a stepped shape, substantially the same as or similar to that of the gate lines 160.

The insulating interlayer pattern 106 at each level may also include, for example, a step portion protruding in the second direction on the second region II. For example, a top surface of the step portion of the gate line 160 may be covered by the step portion of the insulating interlayer pattern 106.

In example embodiments, a multi-layered etch-stop layer pattern including a first etch-stop layer pattern 112 and a second etch-stop layer pattern 165 may be formed on the gate line stack structure.

The first etch-stop layer pattern 112 may be formed conformally along top surfaces of the insulating interlayer patterns 106, sidewalls in the second direction of the insulating interlayer patterns 106, and sidewalls in the second direction of the gate lines 160. In some embodiments, the first etch-stop layer pattern 112 may not be formed on sidewalls in the third direction of insulating interlayer patterns 106 and gate lines 160.

In example embodiments, the first etch-stop layer pattern 112 may cover all the step portions of the insulating interlayer patterns 106 and the gate lines 160 in the gate line stack structure. In example embodiments, the first etch-stop layer pattern 112 may include an oxide substantially the same as or similar to that included in the insulating interlayer pattern 106.

The second etch-stop layer pattern 165 may be formed on the first etch-stop layer pattern 112. For example, the second etch-stop layer patter 165 may be in contact with a substantially entire top surface of the first etch-stop layer pattern 112. Accordingly, the second etch-stop layer pattern 165 may also cover all the step portions of insulating interlayer patterns 106 and gate lines 160 in the gate line stack structure.

In example embodiments, the second etch-stop layer pattern 165 may include a conductive material substantially the same as or similar to that included in the gate line 160. In some embodiments, the gate line 160 and the second etch-stop layer pattern 165 may include tungsten.

In some embodiments, the vertical channel structure may extend through the second and first etch-stop layer patterns 165 and 112 on the first region I.

The mold protection layer 130 may be formed on the substrate 100, and may cover the gate line stack structure. In example embodiments, the mold protection layer 130 may be formed commonly on the first region I, the second region II, and the third region III, and may be formed on top surfaces of the substrate 100 and the second etch-stop layer pattern 165.

In some embodiments, if the lowermost insulating interlayer pattern 106a extends on the third region III, the mold protection layer 130 may be formed on a top surface of the lowermost insulating interlayer pattern 106a. In example embodiments, the mold protection layer 130 may include an oxide substantially the same as or similar to that included in the insulating interlayer pattern 106 and/or the first etch-stop layer pattern 112 (e.g., silicon oxide).

A cutting pattern 170 may be between the gate line stack structures. For example, the cutting pattern 170 may intersect the gate lines 160, the insulating interlayer patterns 106, the etch-stop layer pattern, and the mold protection layer 130, and may have a fence shape extending in the second direction. The gate line stack structure including the predetermined number of the channel rows (e.g., the four channel rows) may be defined by the cutting pattern 170. The cutting pattern 170 may include an insulation material, e.g., silicon oxide.

An impurity region 101 (see, e.g., FIG. 3) may be formed at an upper portion of the substrate 100 under the cutting pattern 170. The impurity region 101 may include, e.g., n-type impurities. In some embodiments, the impurity region 101 may extend in the second direction and may serve as a common source line (CSL) of the vertical memory device. In some embodiments, a CSL contact or a CSL pattern may be formed through the cutting pattern 170 and electrically connected to the impurity region 101.

The contacts 197 may extend through the mold protection layer 130, the second etch-stop layer pattern 165, the first etch-stop layer pattern 112, and the step portion of the insulating interlayer pattern 106 at each level. The contact 197 may be in contact with or electrically connected to the step portion of the gate line 160 at each level.

In some embodiments, as illustrated in FIG. 2, the contacts 197 may be partially inserted in some gate lines at lower levels of the gate line stack structure (e.g., the GSL 160a and some word lines 160b through 160d). The contacts 197 may include a metal, a metal nitride, doped polysilicon, and/or a metal silicide.

A contact spacer 195 may be formed on a sidewall of each contact 197. The contact spacer 195 may have a straw shape surrounding the sidewall of the contact 197. The second etch-stop layer pattern 165 and the contact 197 may be insulated from each other by the contact spacer 195. For example, the contact spacer 195 may include silicon nitride or silicon oxynitride.

In some embodiments, as illustrated in FIG. 1, the contacts 197 may be arranged in a substantially linear line along the second direction in a plane view. In some embodiments, the contacts 197 may be arranged in a different (e.g., zigzag) configuration along the second direction in the plane view.

In some embodiments, a bit line may be on the first region I and electrically connected to the pads 148. Wirings may be on the mold protection layer 130 and electrically connected to the contacts 197. The wirings may extend from the second region II to the third region III and may be electrically connected to the peripheral circuit.

According to example embodiments as described above, the multi-layered etch-stop layer pattern including the first etch-stop layer pattern 112 and the second etch-stop layer pattern 165 may be formed along top and lateral surfaces of the gate line stack structure. For example, the first etch-stop layer pattern 112 may include silicon oxide substantially the same as or similar to that in the insulating interlayer pattern 106. The second etch-stop layer pattern 165 may include a metal substantially the same as or similar to that in the gate line 160.

Thus, while forming contact holes in which the contacts 197 may be formed and through which the step portions of the gate lines 160 may be exposed, defects such as a punching of the gate line 160 or a not-open failure of the step portion may be prevented throughout all levels of the gate line stack structure utilizing the etch-stop layer pattern.

FIGS. 4 to 30 illustrate top plan views and cross-sectional views of an embodiment of a method of manufacturing a vertical memory device, which, for example, may be the vertical memory device in FIGS. 1 to 3. FIGS. 9, 13, 18 and 21 are top plan views illustrating the method. FIGS. 4 to 8, 10 to 12, 14, 16, 19, and 23 to 30 are cross-sectional views taken along line I-I' in FIGS. 9, 13, 18 and 21. FIGS. 15, 17, 20 and 22 are cross-sectional views taken along line II-II' in 9, 13, 18 and 21. For convenience of descriptions, an illustration of insulative structures is omitted in some of the top plan views.

Figure 4:
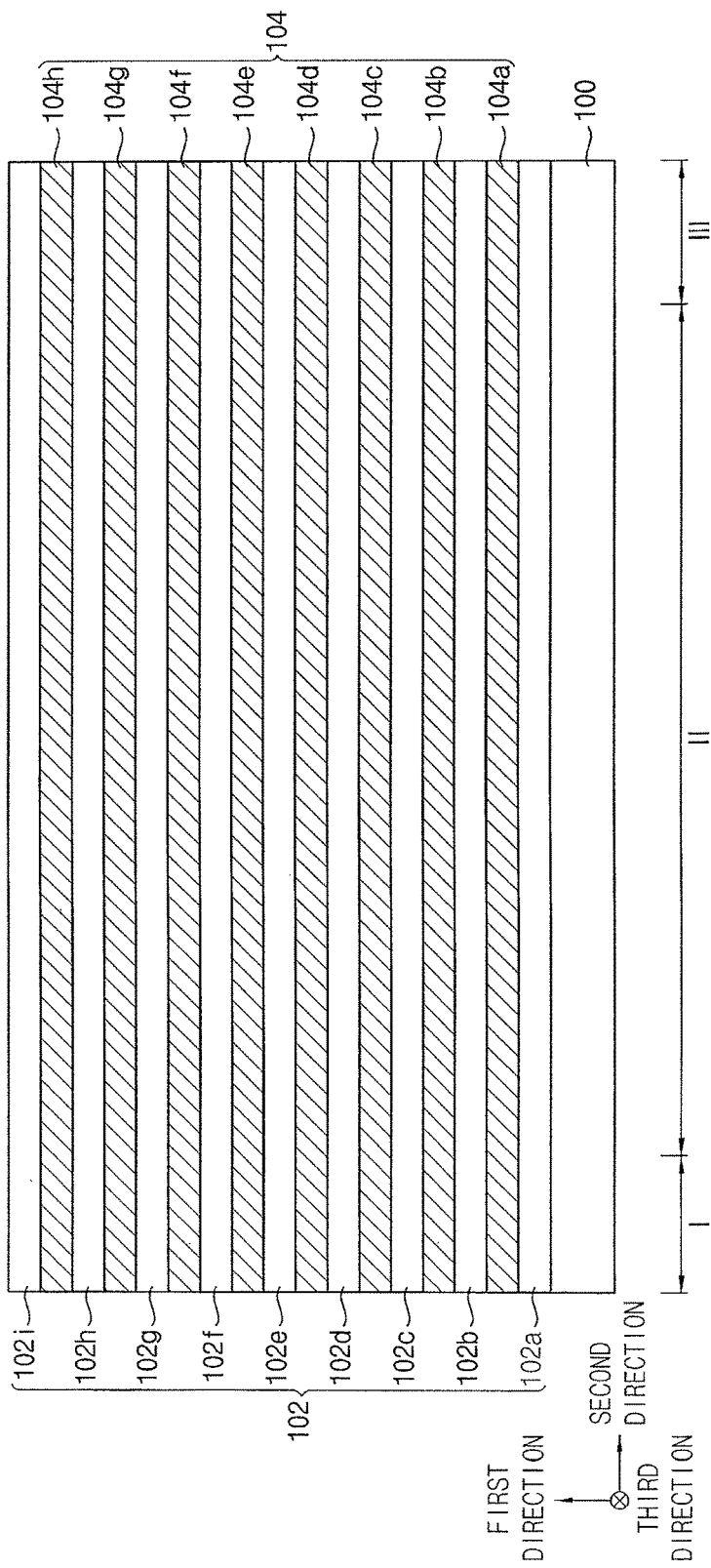
FIGS. 4 to 30 illustrate various stages in an embodiment of a method for manufacturing a vertical memory device.

Referring to FIG. 4, insulating interlayers 102 (e.g., 102a through 102i) and sacrificial layers 104 (e.g., 104a through 104h) may be formed alternately and repeatedly on a substrate 100 to form a mold structure. The substrate 100 may include a semiconductor material silicon or germanium. In example embodiments, the substrate 100 may include a first region I, a second region II, and a third region III. For example, the first region I, the second region II, and the third region III may correspond to a cell region, an extension region, and a peripheral circuit region of the vertical memory device.

The insulating interlayer 102 may be formed of an oxide-based material, e.g., silicon dioxide, silicon oxycarbide, and/or silicon oxyfluoride. The sacrificial layer 104 may be formed of a material having an etching selectivity with respect to the insulating interlayer 102 and which may be easily removed by a wet etching process. For example, the sacrificial layer 104 may be formed of a nitride-based material, e.g., silicon nitride and/or silicon boronitride.

The insulating interlayer 102 and the sacrificial layer 104 may be formed by at least one of a chemical vapor deposition (CVD) process, a plasma enhanced chemical vapor deposition (PECVD) process, a high density plasma chemical vapor deposition (HDP-CVD) process, an atomic layer deposition (ALD) process, or a sputtering process.

In an embodiment, a lowermost insulating interlayer 102a may be formed by a thermal oxidation process or a radical oxidation process on a top surface of the substrate 100. The sacrificial layers 104 may be removed in a subsequent process to provide spaces for a GSL, a word line(s), and an SSL. Thus, the number of the insulating interlayers 102 and the sacrificial layers 104 may be determined in consideration of the number of the GSL, the word line(s), and the SSLs.

FIG. 4 illustrates that the sacrificial layers 104 and the insulating interlayers 102 are formed at 8 levels and 9 levels, respectively. However, the number of the insulating interlayers 102 and the sacrificial layers 104 may increase depending, for example, on a degree of integration of the vertical memory device.

Figure 5:
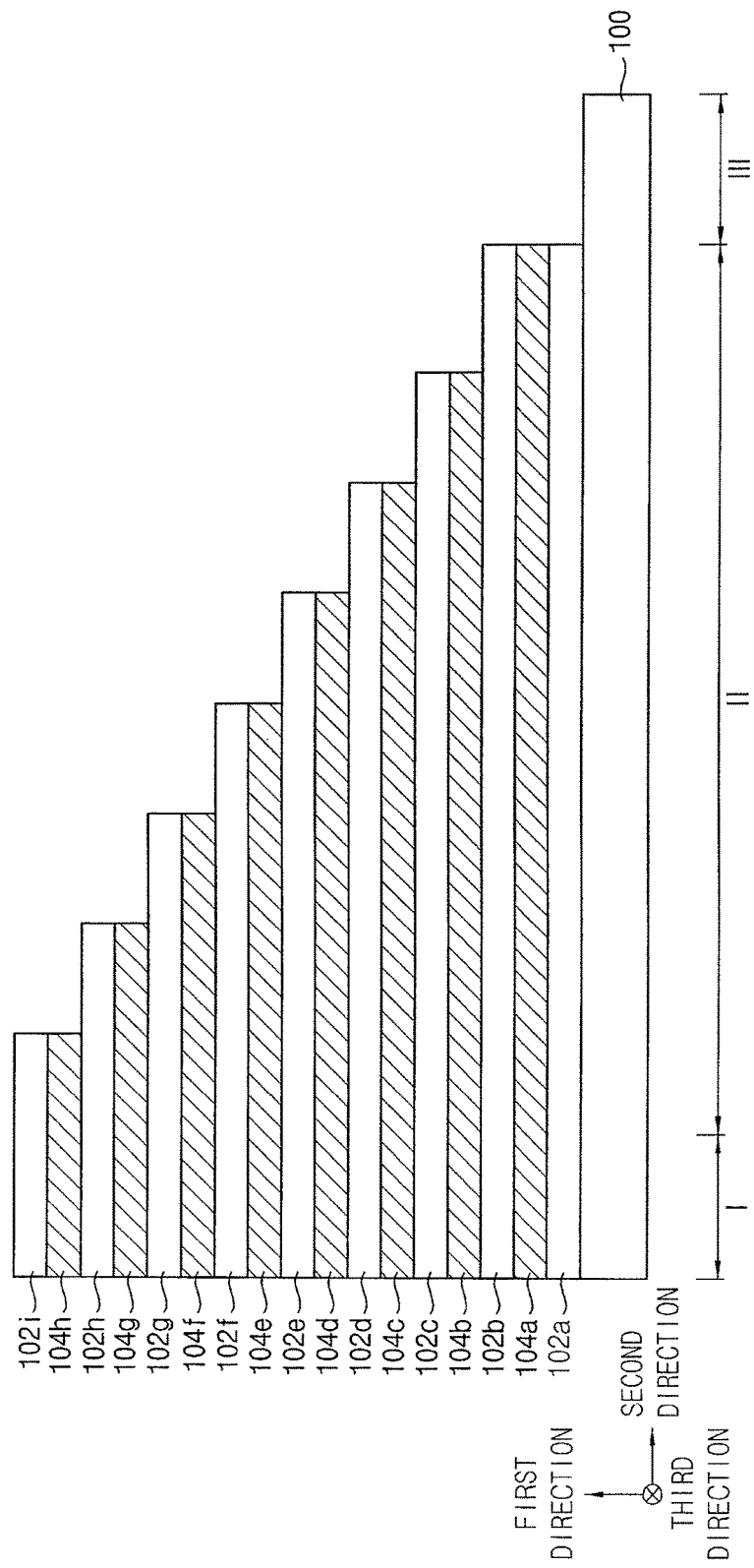

Referring to FIG. 5, a lateral portion of the mold structure may be partially etched in, e.g., a stepwise manner, to form a stepped mold structure. For example, a photoresist pattern covering the first region I and partially covering the second region II may be formed on an uppermost insulating interlayer 102i. Peripheral portions of the uppermost insulating interlayer 102i and an uppermost sacrificial layer 104h may be removed using the photoresist pattern as an etching mask. A peripheral portion of the photoresist pattern may be partially removed so that a width of the photoresist pattern may be reduced. Peripheral portions of insulating interlayers 102i and 102h, and sacrificial layers 104h and 104g may be etched using the photoresist pattern again as an etching mask. Etching processes may be repeated with a predetermined etching amount in a similar manner as described above to obtain the stepped mold structure in FIG. 5.

In some embodiments, as illustrated in FIG. 5, a portion of the lowermost insulating interlayer 102a on the third region III may be also removed while forming the stepped mold structure. In some embodiments, the lowermost insulating interlayer 102a may not be etched to remain on the third region III. The insulating interlayer 102 and the sacrificial layer 104 at each level in the stepped mold structure may include step portions protruding in the second direction on the second region II. A top surface of the step portion of the sacrificial layer 104 may be covered by the step portion of the insulating interlayer 102. The photoresist pattern may be removed by an ashing process and/or a strip process after forming the stepped mold structure.

Figure 6:
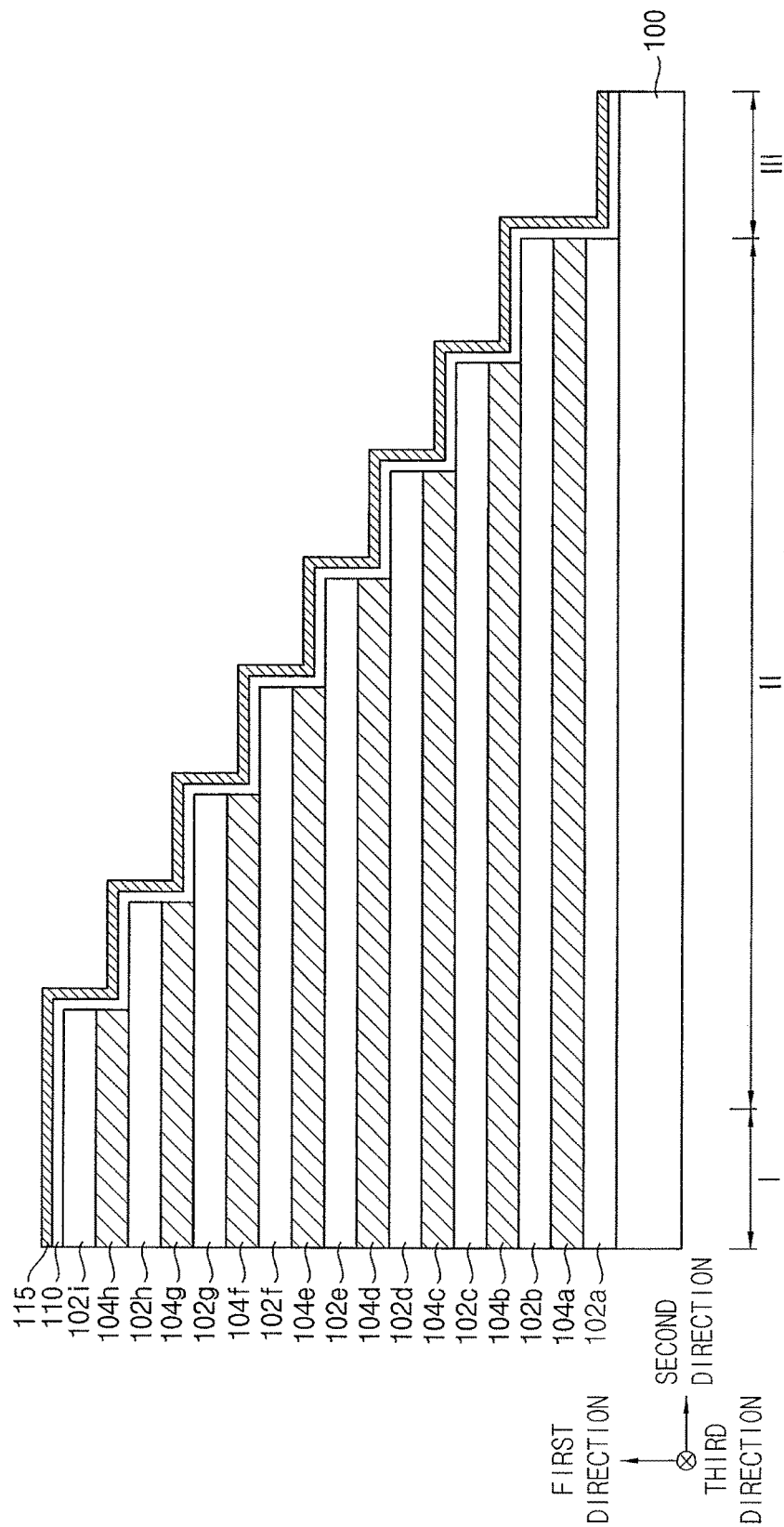

Referring to FIG. 6, a first etch-stop layer 110 may be formed along a surface of the stepped mold structure on the substrate 100. A preliminary second etch-stop layer 115 may be formed on the first etch-stop layer 110. In example embodiments, the first etch-stop layer 110 may be formed conformally along top surfaces and sidewalls of the insulating interlayers 102 and sidewalls of the sacrificial layers 104. The preliminary etch-stop layer 115 may be formed to have a shape substantially the same as or similar to that of the first etch-stop layer 110.

In example embodiments, the first etch-stop layer 110 may be formed of an oxide-based material, e.g., silicon oxide. For example, the first etch-stop layer 110 may include the oxide-based material substantially the same as or similar to that in the insulating interlayer 102. The preliminary second etch-stop layer 115 may be formed of a nitride-based material, e.g., silicon nitride. For example, the preliminary second etch-stop layer 115 may be formed of the nitride-based material substantially the same as or similar to that in the sacrificial layer 104.

The first etch-stop layer 110 and the preliminary second etch-stop layer 115 may be formed by, e.g., an ALD process or a sputtering process having an improved step-coverage property. The first etch-stop layer 110 and the preliminary second etch-stop layer 115 may have a thickness less than that of the insulating interlayer 102 and the sacrificial layer 104, respectively, as illustrated in FIG. 6. However, the first etch-stop layer 110 and the preliminary second etch-stop layer 115 may have a thickness substantially equal to or greater than that of the insulating interlayer 102 and the sacrificial layer 104, respectively.

Figure 7:
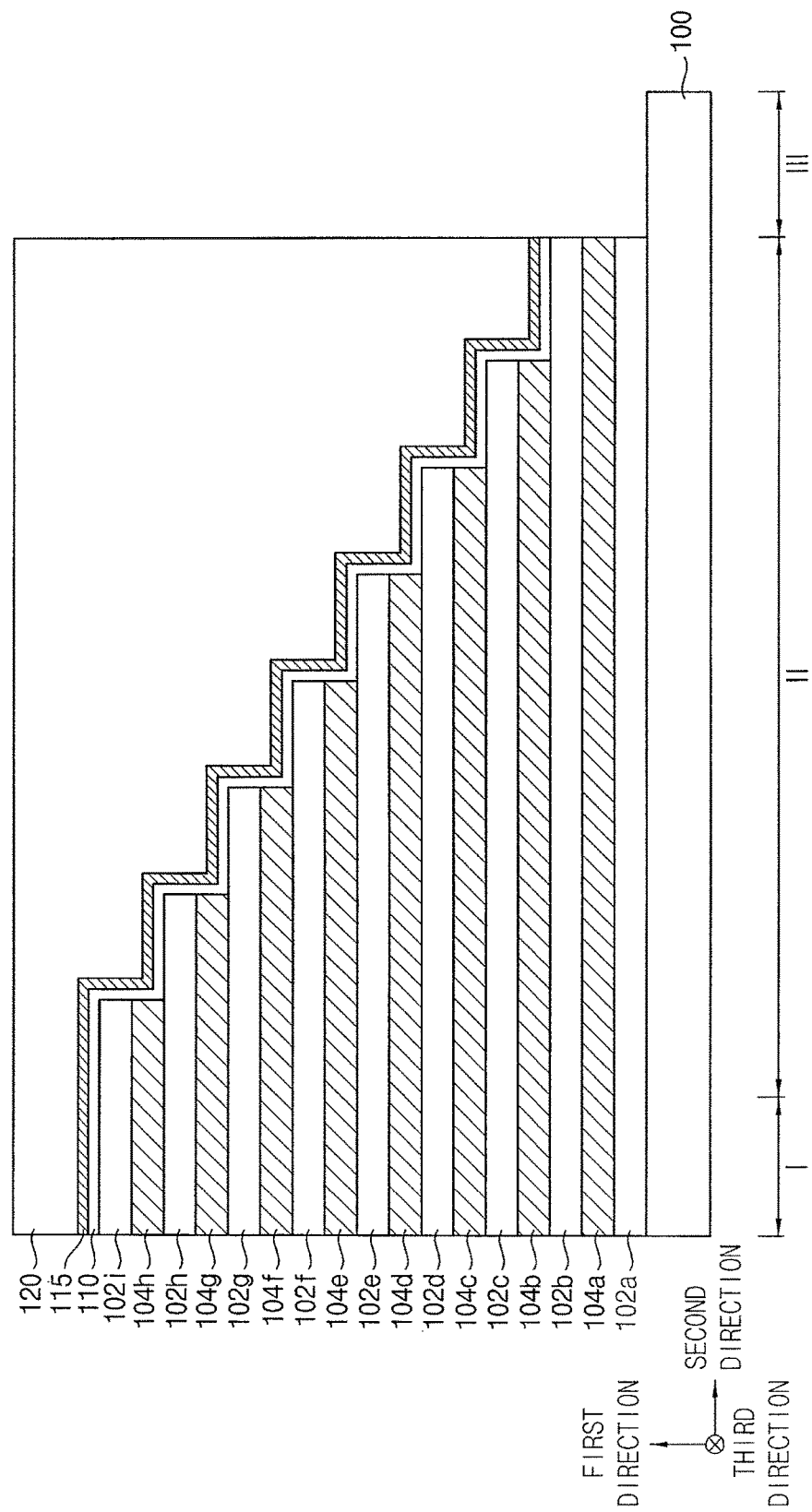

Referring to FIG. 7, portions of the first etch-stop layer 110 and the preliminary second etch-stop layer 115 formed on the third region III may be removed. In example embodiments, a photoresist pattern 120 covering the first region I and the second region II may be formed on the preliminary second etch-stop layer 115. The preliminary second etch-stop layer 115 and the first etch-stop layer 110 may be partially removed using the photoresist pattern as an etching mask. After the etching process described above, the top surface of the substrate 100 or a top surface of the lowermost insulating interlayer 102a may be exposed on the third region III, and the photoresist pattern 120 may be removed by an ashing process and/or a strip process.

Figure 8:
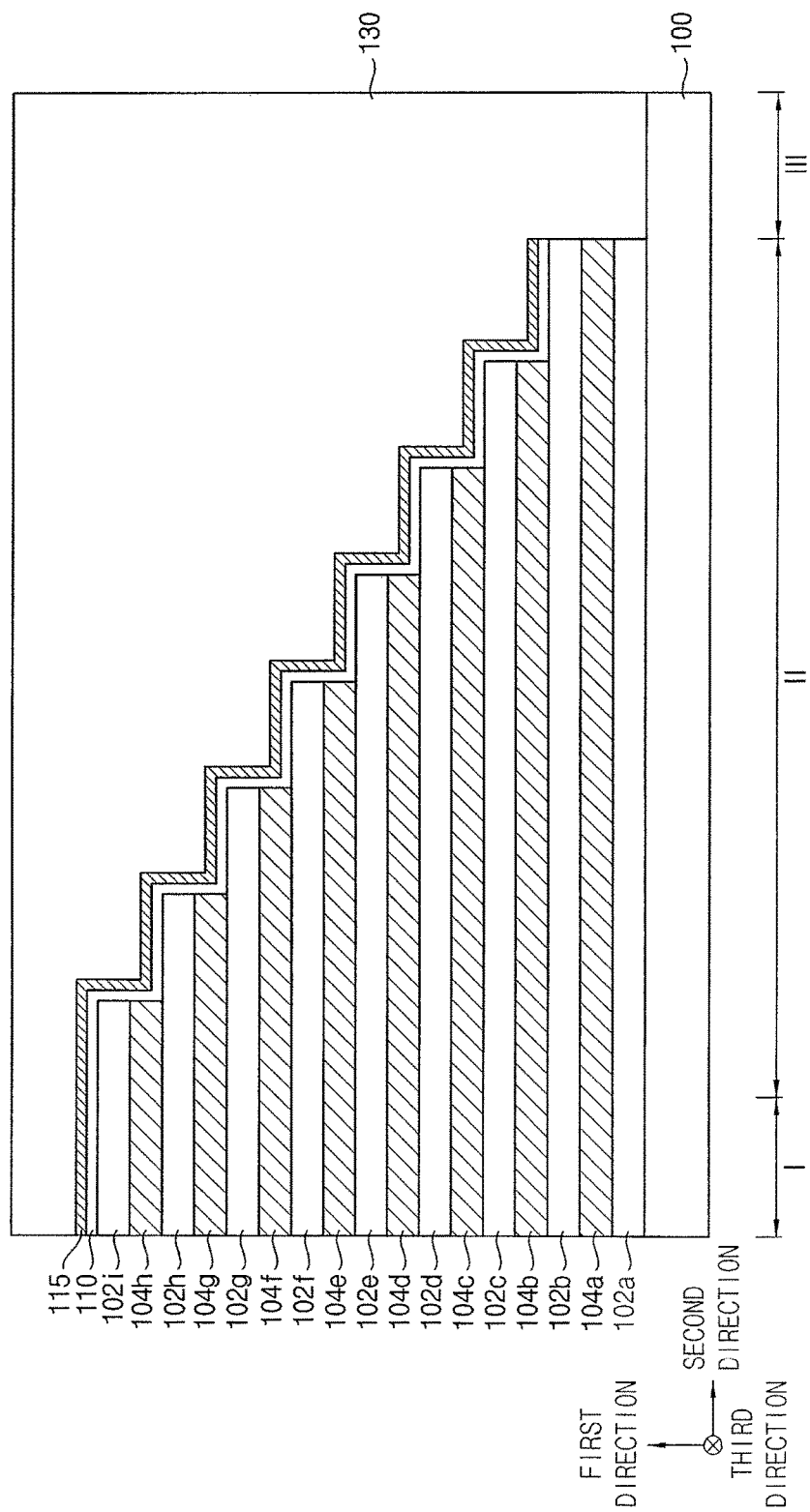

Referring to FIG. 8, a mold protection layer 130 covering the preliminary second etch-stop layer 115 may be formed on the substrate 100. In example embodiments, the mold protection layer 130 may entirely cover the stepped mold structure. In some embodiments, an upper portion of the mold protection layer 130 may be planarized by, e.g., a chemical mechanical polish (CMP) process.

Figure 9:
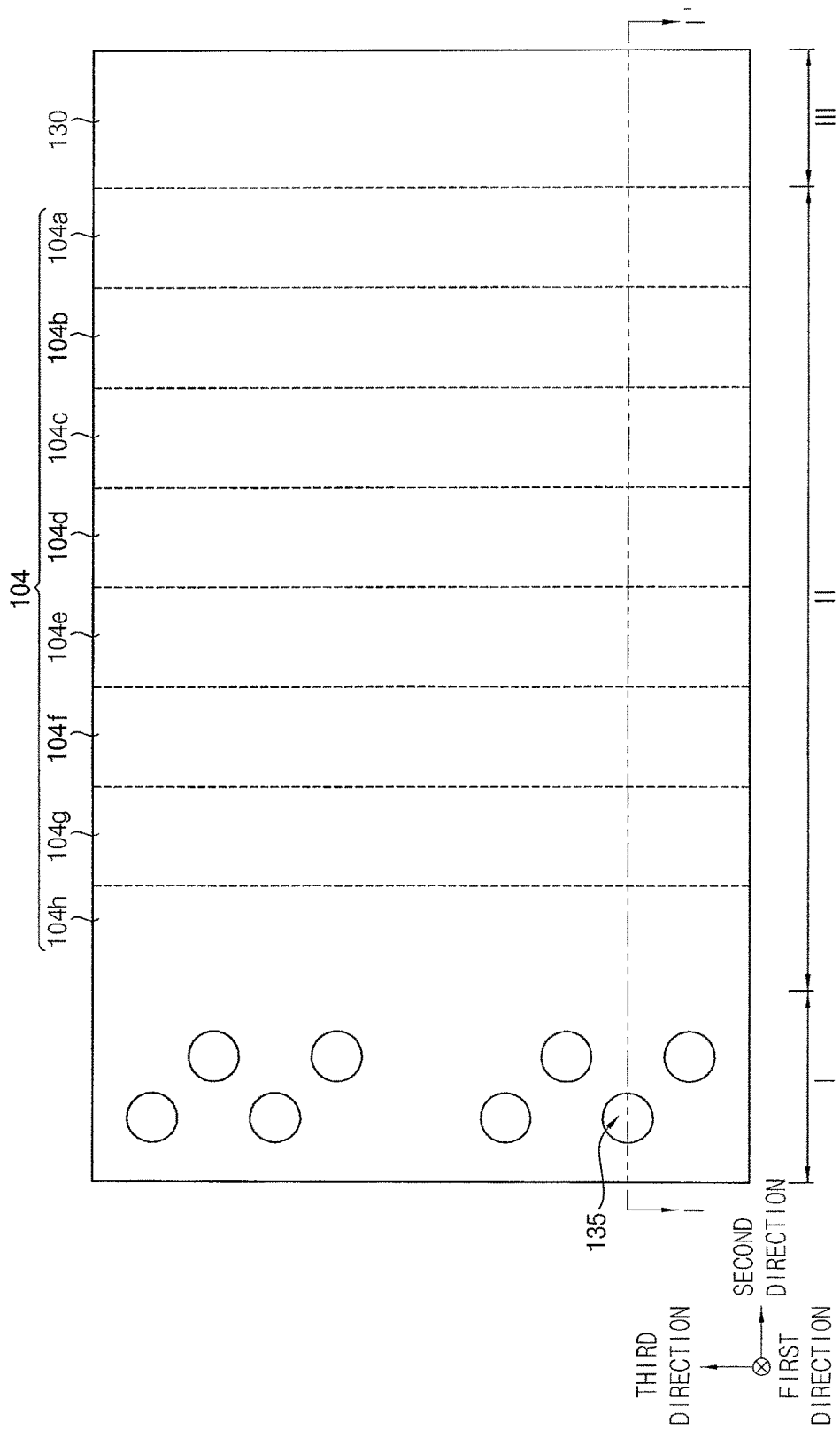
Figure 10:
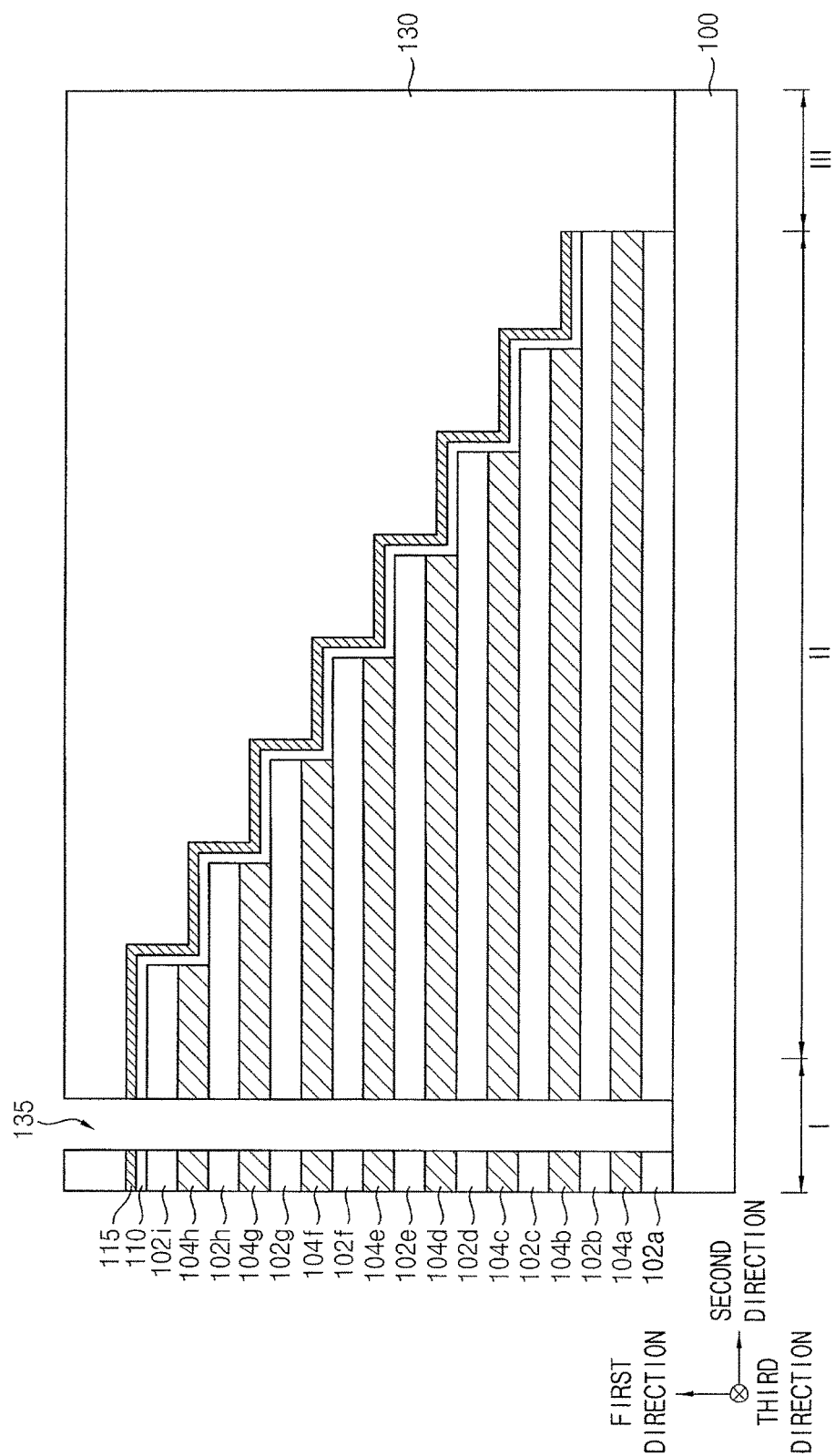

Referring to FIGS. 9 and 10, channel holes 135 may be formed through the stepped mold structure on the first region I. For example, a hard mask may be formed on the mold protection layer 130. The insulating interlayers 102 and the sacrificial layers 104 of the stepped mold structure may be partially etched on the first region I by performing, e.g., a dry etching process. The hard mask may be used as an etching mask to form the channel hole 135. The channel hole 135 may also extend through the preliminary second etch-stop layer 115 and the first etch-stop layer 110. The channel hole 135 may extend in the first direction from the top surface of the substrate 100, and the top surface of the substrate 100 may be partially exposed by the channel hole 135. The hard mask may be formed of silicon-based or carbon-based spin-on hardmask (SOH) materials, and/or a photoresist material.

In example embodiments, a plurality of the channel holes 135 may be formed along the second direction to form a channel hole row. A plurality of the channel hole rows may be formed along the third direction. The channel hole rows may be arranged such that the channel holes 135 in different channel hole rows may be formed in a predetermined (e.g., zigzag) arrangement along the second direction and/or the third direction. The hard mask may be removed by an ashing process and/or a strip process after the formation of the channel holes 135.

Figure 11:
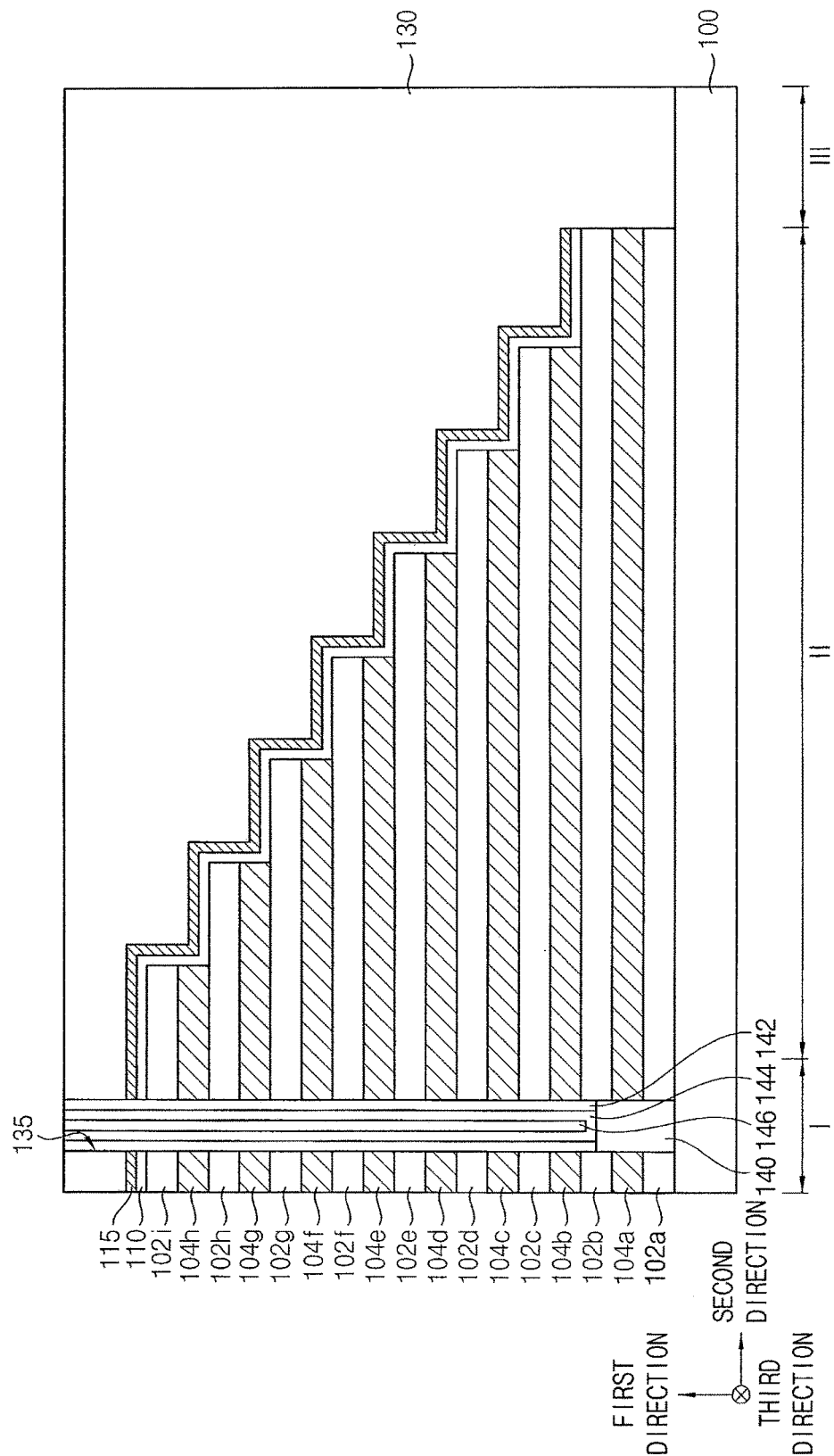

Referring to FIG. 11, a semiconductor pattern 140, a dielectric layer structure 142, a channel 144, and a filling insulation pattern 146 may be formed in each channel hole 135. In some example embodiments, a semiconductor pattern 140 may be formed at a lower portion of the channel hole 135. For example, the semiconductor pattern 140 may be formed by a selective epitaxial growth (SEG) process using the top surface of the substrate 100 exposed through the channel hole 135 as a seed. In some embodiments, an amorphous silicon layer filling the lower portion of the channel hole 135 may be formed, and a laser epitaxial growth (LEG) process or a solid phase epitaxi (SPE) process may be performed thereon to form the semiconductor pattern 140. In some embodiments, a top surface of the semiconductor pattern 140 may be positioned between the sacrificial layers 104a and 104b at two lower levels.

A dielectric layer may be formed along sidewalls of the channel holes 135 and top surfaces of the semiconductor pattern 140 and the mold protection layer 130. Upper and lower portions of the dielectric layer may be removed by an etch-back process to form the dielectric layer structure 142 on the sidewall of the channel hole 135.

A channel layer and a filling insulation layer filling remaining portions of the channel holes 135 may be sequentially formed. Upper portions of the channel layer and the filling insulation layer may be planarized by, e.g., a CMP process, until the mold protection layer 130 is exposed. Accordingly, the channel 144 and the filling insulation pattern 146 filling the channel hole 135 may be formed on the semiconductor pattern 140. A vertical channel structure including the dielectric layer structure 142, the channel 144, and the filling insulation pattern 146 may be formed in each channel hole 135.

The dielectric layer may be formed by sequentially forming a blocking layer, a charge storage layer, and a tunnel insulation layer. The blocking layer may be formed of, e.g., silicon oxide or a metal oxide. The charge storage layer may be formed of a nitride such as silicon nitride or a metal oxide. The tunnel insulation layer may include an oxide such as silicon oxide. For example, the dielectric layer may be formed as an oxide-nitride-oxide (ONO) layered structure. The blocking layer, the charge storage layer, and the tunnel insulation layer may be formed by a CVD process, a PECVD process, an ALD process, etc.

The channel layer may be formed of polysilicon or amorphous silicon which is optionally doped with impurities. In an embodiment, a heat treatment or a laser beam irradiation may be further performed on the channel layer. In this case, the channel layer may be transformed to include single crystalline silicon. The filling insulation layer may be formed of, e.g., silicon oxide or silicon nitride. The channel layer and the filling insulation layer may be formed by a CVD process, a PECVD process, an ALD process, a PVD process, a sputtering process, etc.

The dielectric layer structure 142 may have a straw shape or a cylindrical shell shape surrounding an outer sidewall of the channel 144. The channel 144 may have a substantially cup shape. The filling insulation pattern 146 may have a pillar shape inserted in the channel 144. In some embodiments, the formation of the filling insulation layer may be omitted, and the channel may have a pillar shape filling the channel 135.

Figure 12:
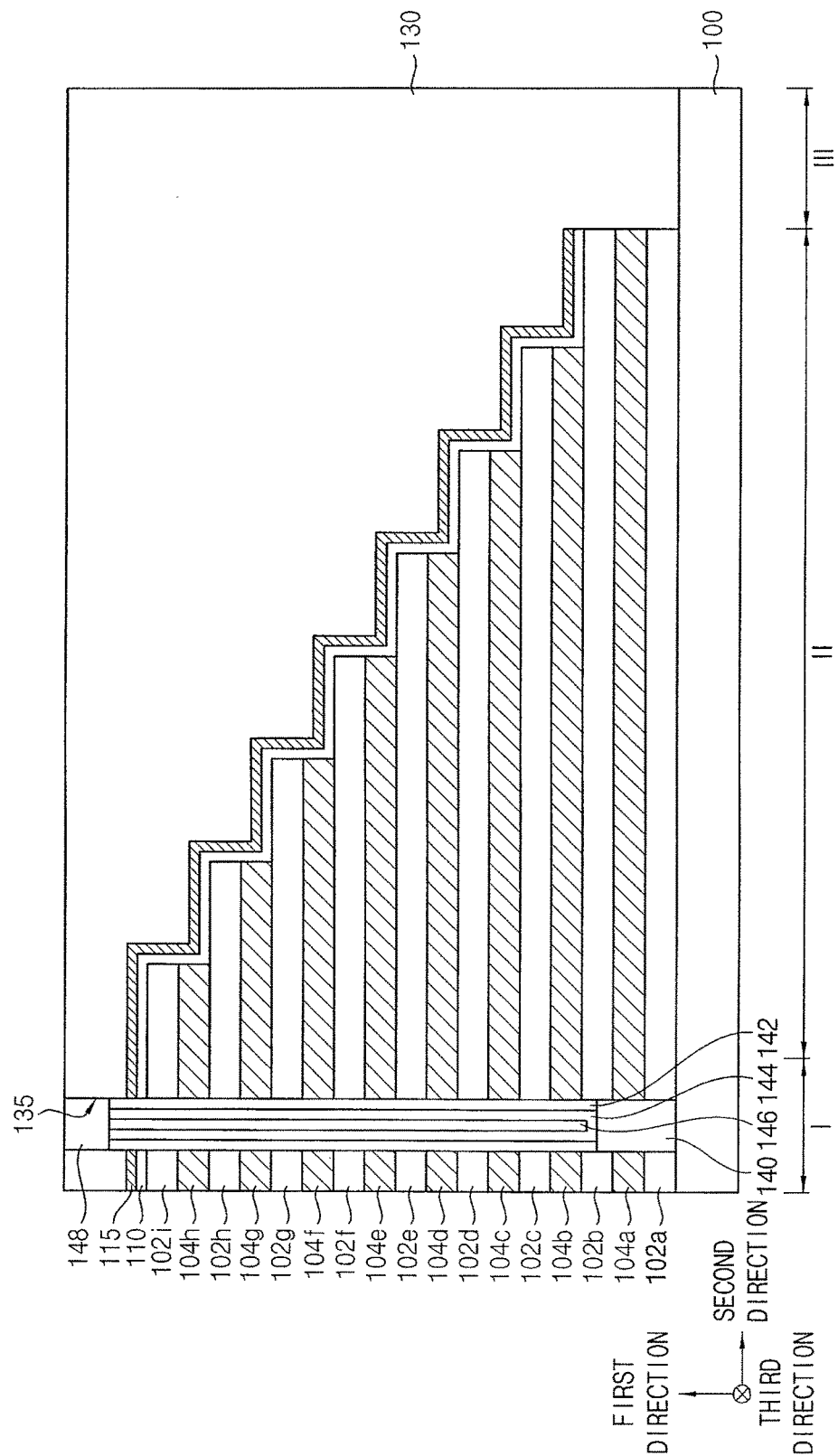

Referring to FIG. 12, a pad 148 capping an upper portion of the channel hole 135 may be formed. For example, an upper portion of the vertical channel structure may be partially removed by, e.g., an etch-back process to form a recess. A pad layer may be formed on the dielectric layer structure 142, the channel 144, the filling insulation pattern 146, and the mold protection layer 130 to sufficiently fill the recess. An upper portion of the pad layer may be planarized by, e.g., a CMP process, until a top surface of the mold protection layer 130 is exposed to form the pad 148 from a remaining portion of the pad layer.

The pad layer may be formed using polysilicon optionally doped with n-type impurities by a sputtering process or an ALD process. In an embodiment, a preliminary pad layer including amorphous silicon may be formed, and then a crystallization process may be performed thereon to form the pad layer.

According to the arrangement of the channel hole row, a plurality of pads 148 may define a pad row in an upper portion of the mold protection layer 130. A plurality of the pad rows may be formed along the third direction. A channel row may be defined under the pad row, and a plurality of the channel rows may be arranged along the third direction.

Figure 13:
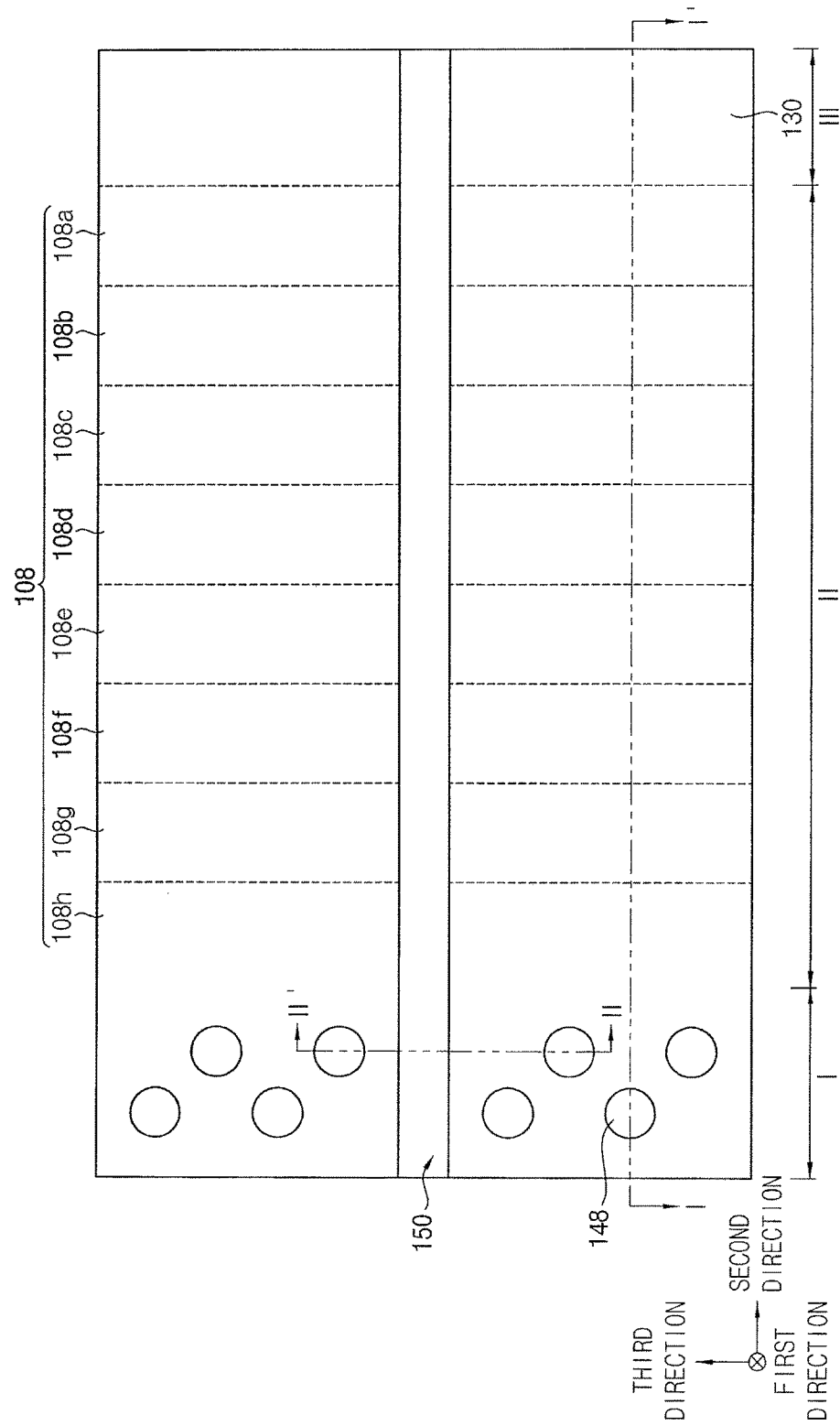
Figure 14:
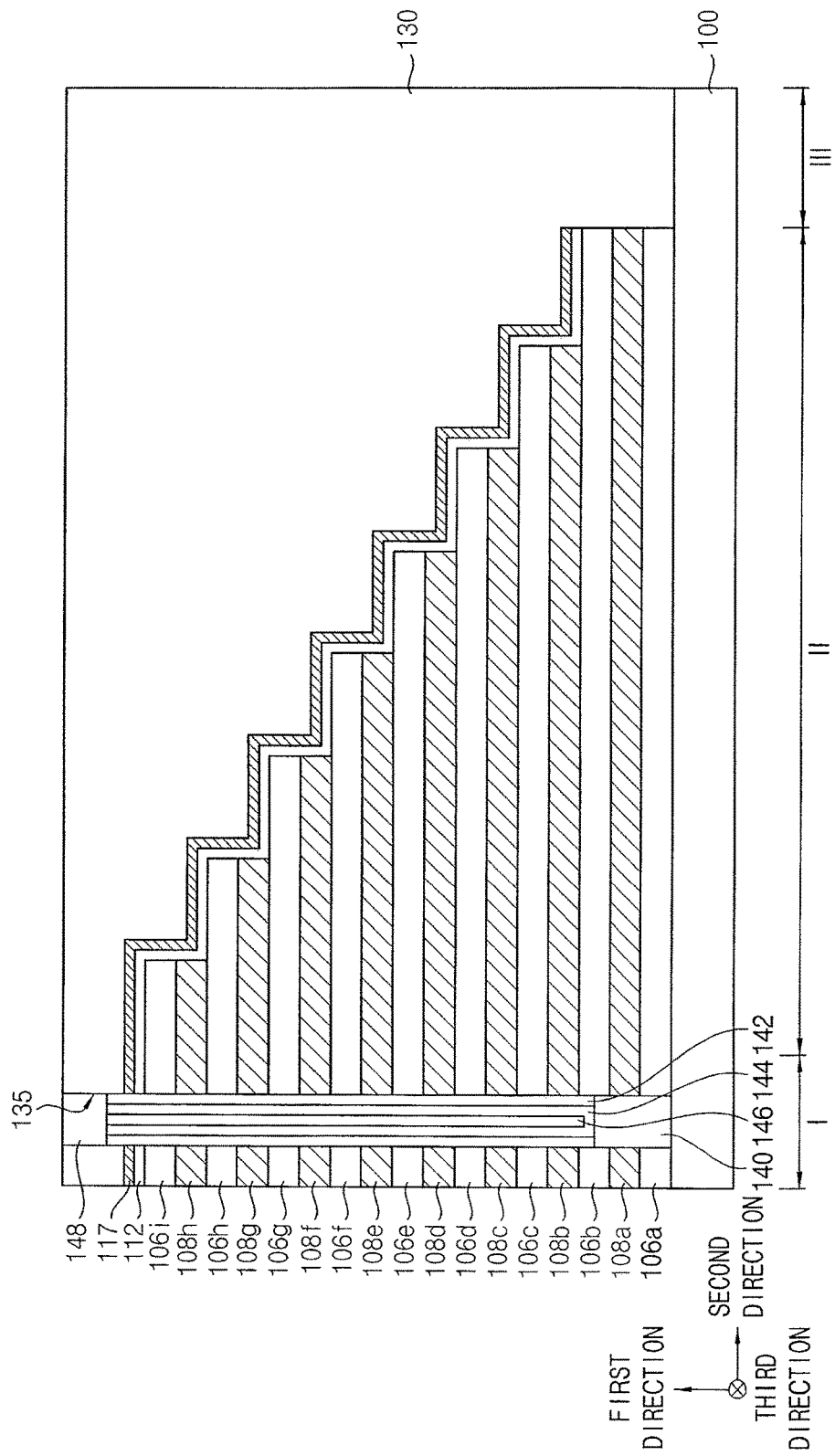
Figure 15:
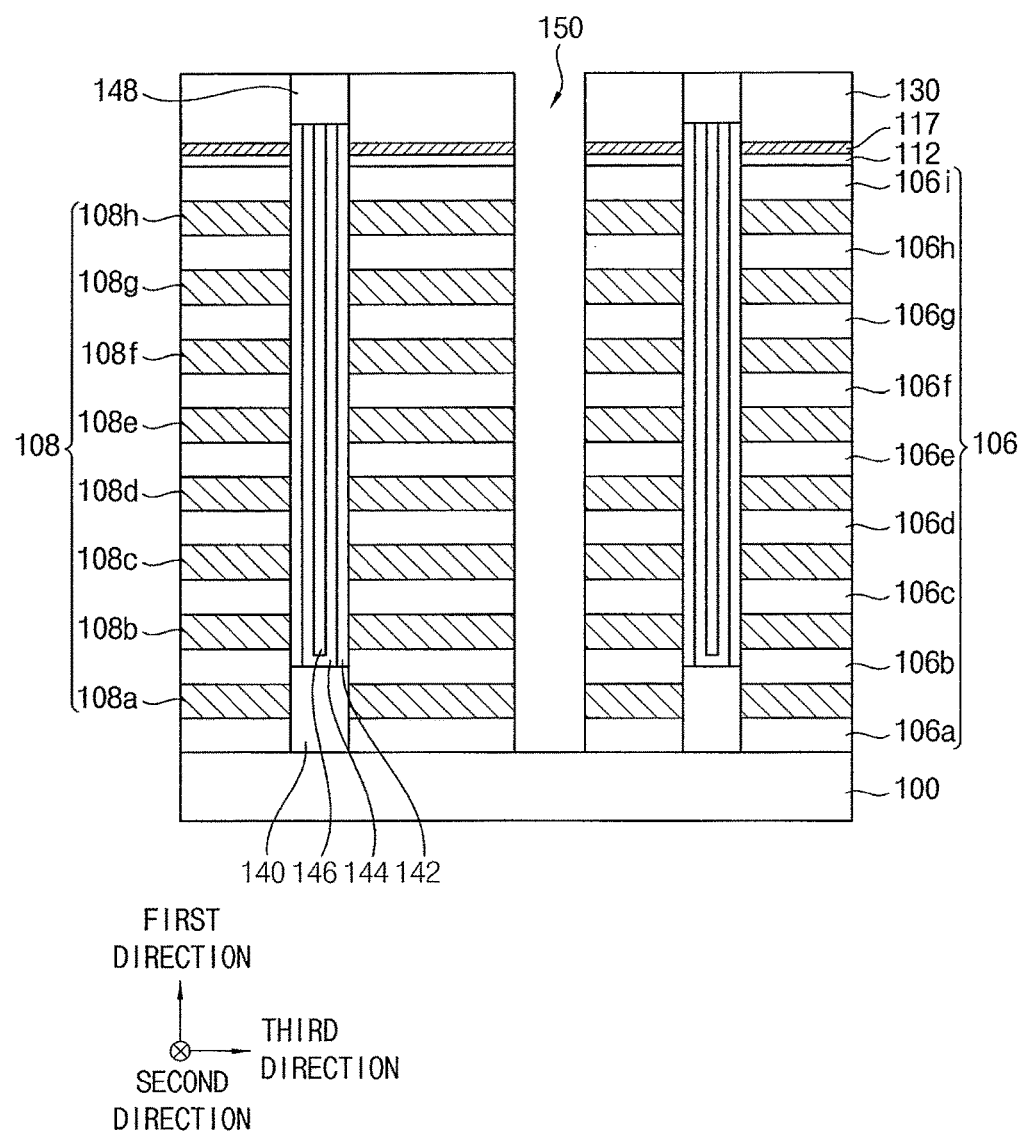

Referring to FIGS. 13 to 15, an opening 150 extending through the stepped mold structure may be formed. For example, a hard mask covering the pads 148 and partially exposing the mold protection layer 130 between some of the pad rows may be formed. The mold protection layer 130, the first etch-stop layer 110, the preliminary second etch-stop layer 115, the insulating interlayers 102, and the sacrificial layers 104 may be partially etched by, e.g., a dry etching process using the hard mask to form the opening 150. The hard mask may be formed using a photoresist material or an SOH material, and may be removed by an ashing process and/or a strip process after the formation of the opening 150.

The opening 150 may extend in, e.g., the second direction, and a plurality of the openings 150 may be formed along the third direction. The predetermined number of the channel rows may be arranged between the openings 150 neighboring in the third direction. For example, as illustrated in FIG. 13, four channel rows may be between the neighboring openings 150. However, the number of the channel rows between the openings 150 may be properly adjusted in consideration of circuit design or degree of integration of the vertical memory device.

As illustrated in FIG. 15, after formation of the opening 150, the insulating interlayers 102 and the sacrificial layers 104 may be changed to insulating interlayer patterns 106 (e.g., 106a through 106i) and sacrificial patterns 108 (e.g., 108a through 108h). The insulating interlayer pattern 106 and the sacrificial pattern 108 at each level may have a plate shape extending in the second direction. The top surface of the substrate 100 and sidewalls of the insulating interlayer patterns 106 and the sacrificial patterns 108 may be exposed through the opening 150.

In example embodiments, the first etch-stop layer 110 and the preliminary second etch-stop layer 115 may be also cut by the opening 150 to form a first etch-stop layer pattern 112 and a preliminary second etch-stop layer pattern 117. Sidewalls of the first etch-stop layer pattern 112 and the preliminary second etch-stop layer pattern 117 may be exposed through the opening 150.

Figure 16:
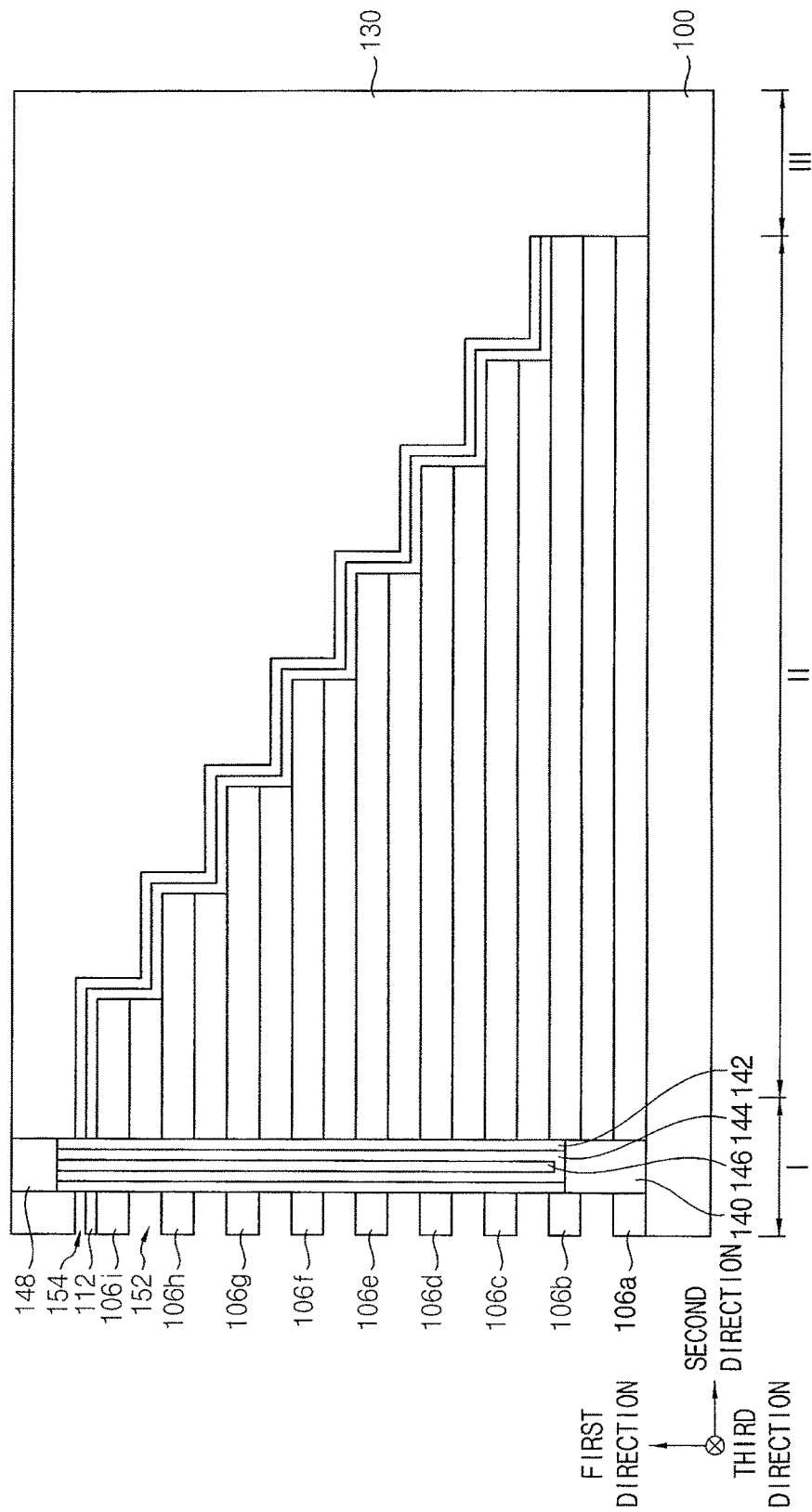
Figure 17:
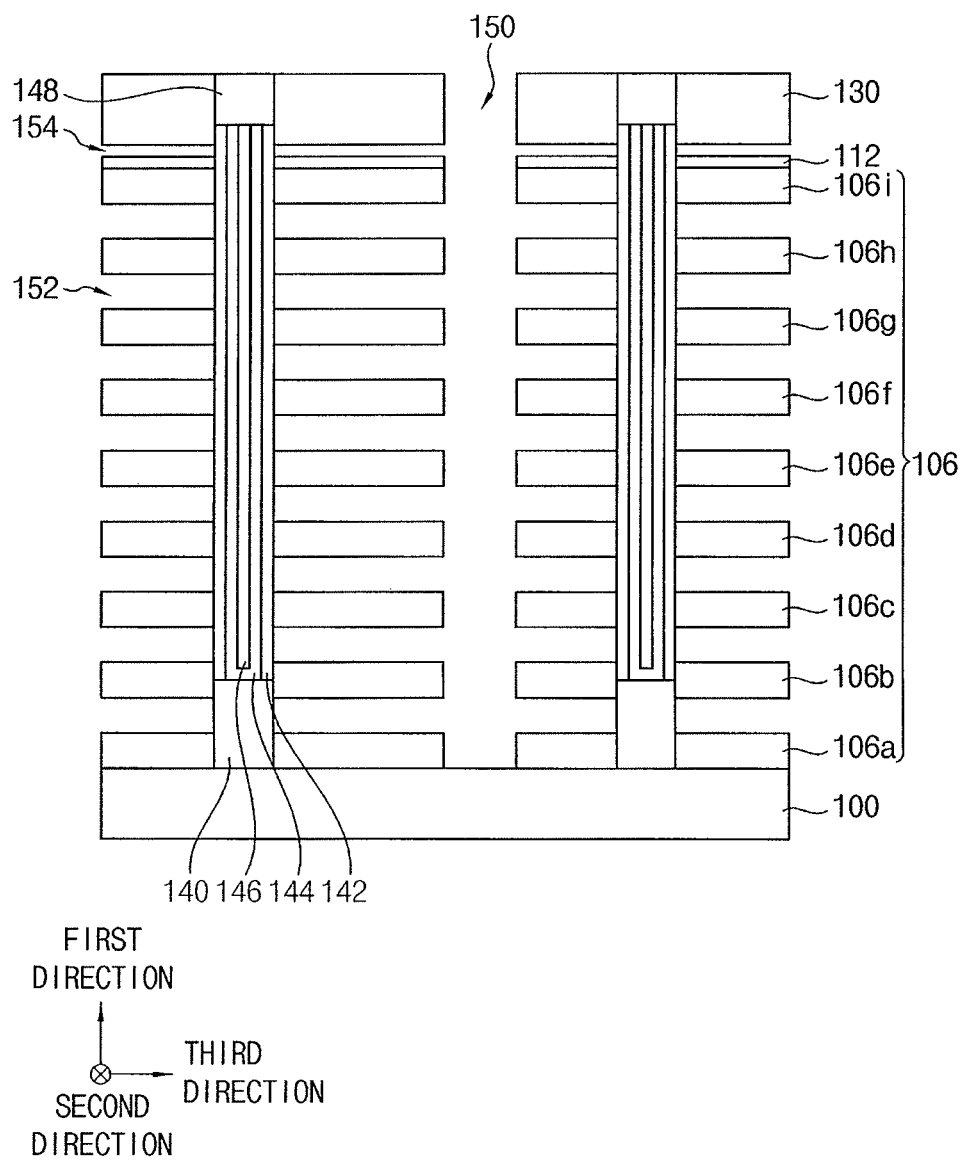

Referring to FIGS. 16 and 17, the sacrificial patterns 108 and the preliminary second etch-stop layer pattern 117 exposed by the opening 150 may be removed. In example embodiments, the sacrificial patterns 108 and the preliminary second etch-stop layer pattern 117 may be removed by a wet etching process using, e.g., phosphoric acid as an etchant solution that has an etching selectivity for silicon nitride.

A first gap 152 may be defined by a space from which the sacrificial pattern 108 is removed between the insulating interlayer patterns 106 neighboring in the first direction. A sidewall of the dielectric layer structure 142 may be partially exposed by the first gaps 152. In some embodiments, a sidewall of the semiconductor pattern 140 may be exposed by a lowermost first gap 152.

In example embodiments, a second gap 154 may be defined by a space from which the preliminary second etch-stop layer pattern 117 is removed. The second gap 154 may extend in a stepped shape between the mold protection layer 130 and the first etch-stop layer pattern 112. As illustrated in FIG. 17, an upper portion of the dielectric layer structure 142 may be exposed by an upper portion of the second gap 154.

Figure 18:
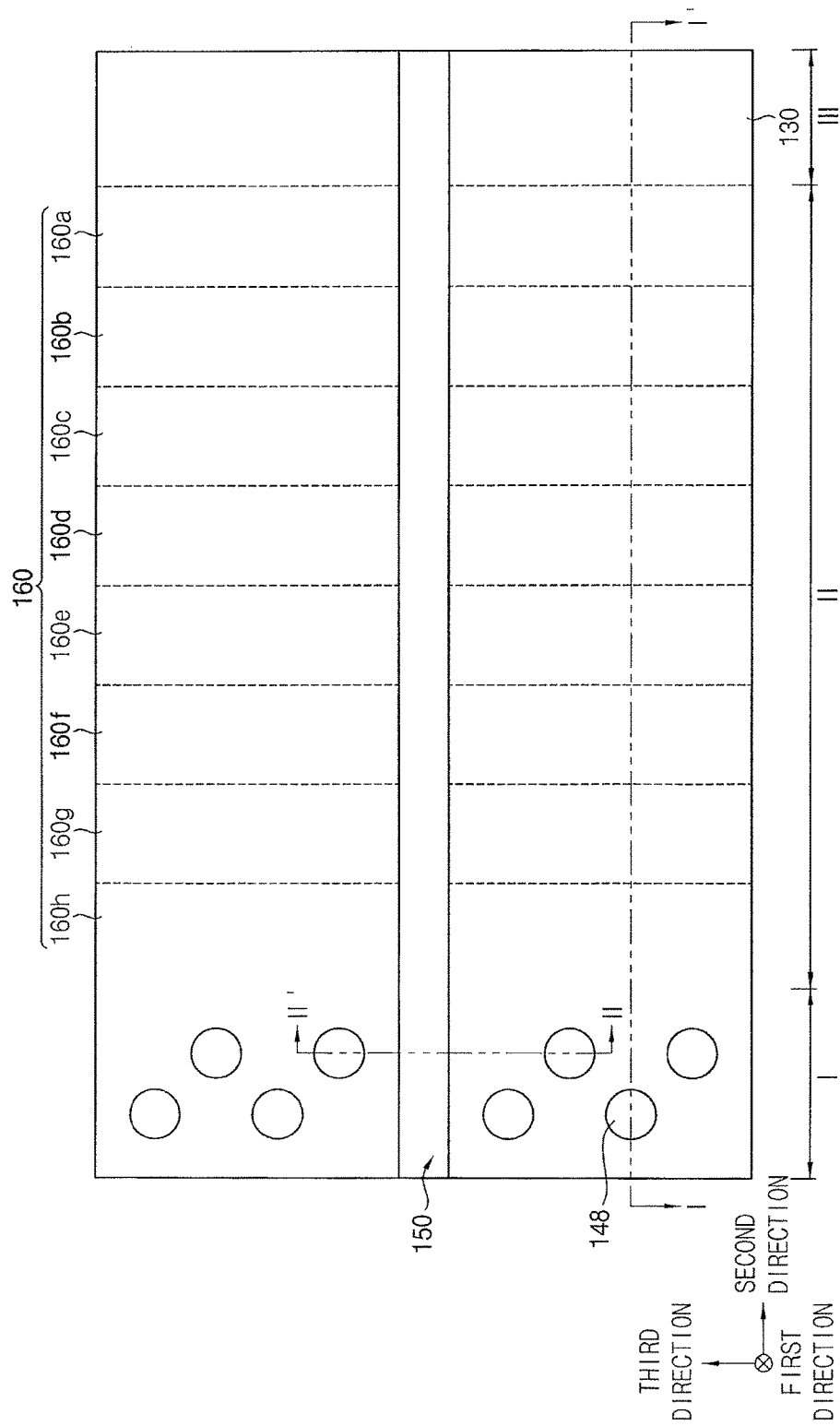
Figure 19:
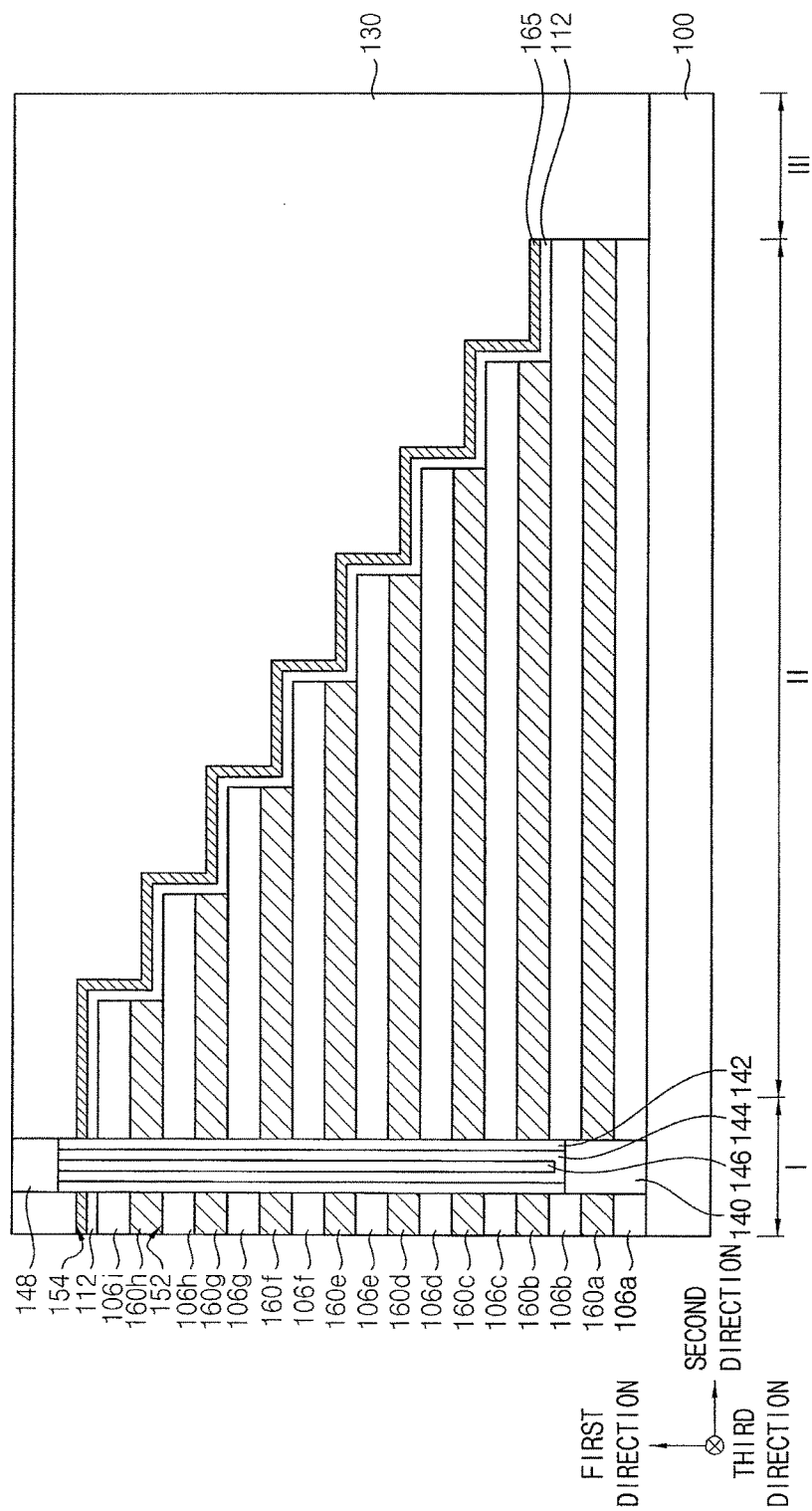
Figure 20:
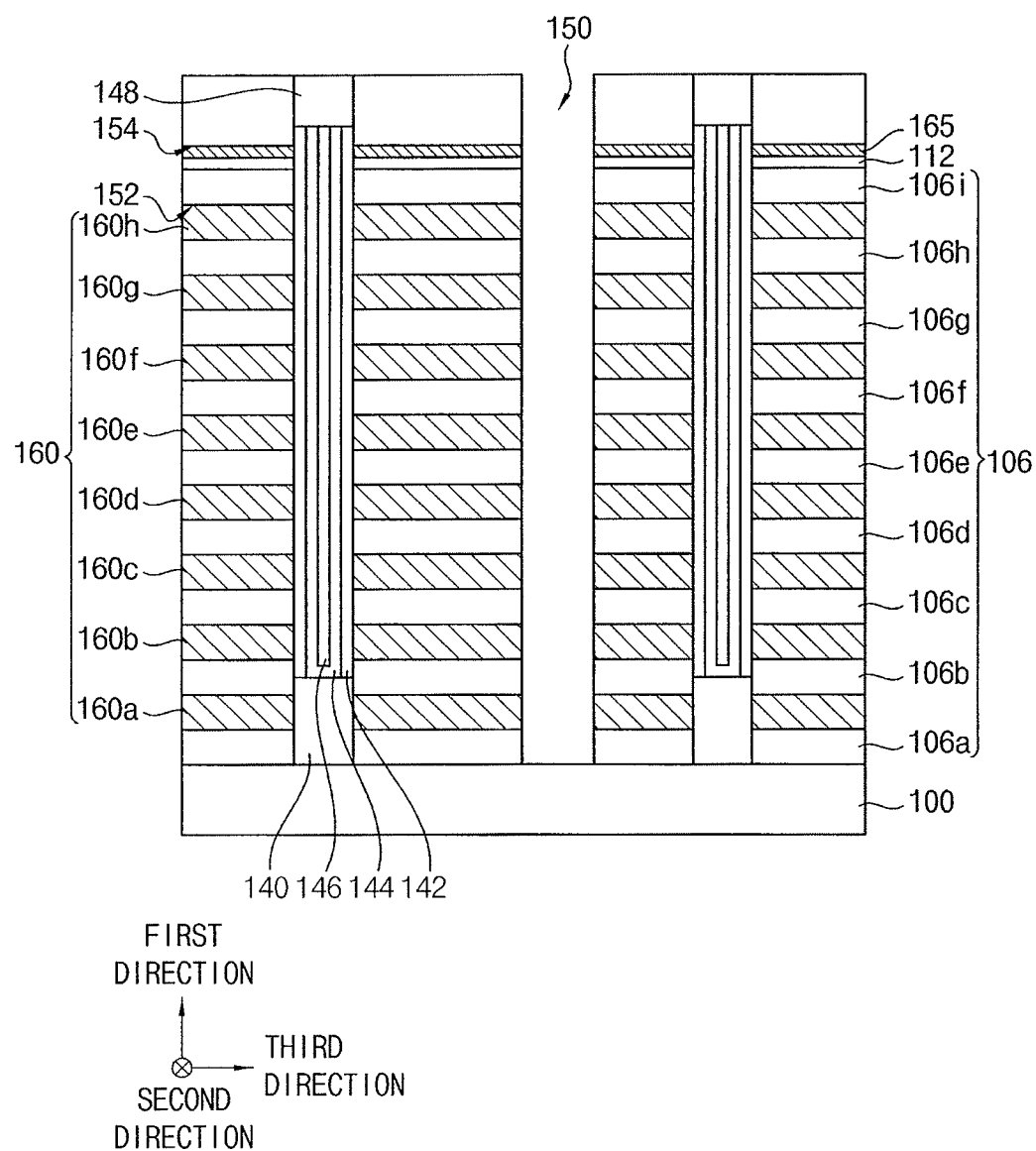

Referring to FIGS. 18 to 20, gate lines 160 (e.g., 160a through 160h) may be formed in the first gaps 152, and a second etch-stop layer pattern 165 may be formed in the second gap 154. In example embodiments, a first conductive layer substantially fully filling the first and second gaps 152 and 154 and at least partially filling the opening 150 may be formed. The first conductive layer may be also formed on the mold protection layer 130 and the pads 148.

The first conductive layer may be formed using a metal such as tungsten, aluminum, copper, titanium or tantalum, or a nitride of the metal. In some embodiments, the first conductive layer may be formed of tungsten. In an embodiment, the first conductive layer may be formed as a multi-layered structure including a barrier layer formed of a metal nitride, and a metal layer. The first conductive layer may be formed by a CVD process, a PECVD process, an ALD process, a PVD process, a sputtering process, etc.

In an embodiment, before forming the first conductive layer, an additional blocking layer including, e.g., a metal oxide may be formed on inner walls of the first and second gaps 152 and 154.

In example embodiments, an upper portion of the first conductive layer may be planarized by a CMP process until the mold protection layer 130 may be exposed. Portions of the first conductive layer formed in the opening 150 and on the top surface of the substrate 100 may be etched to obtain the gate lines 160 and the second etch-stop layer pattern 165 in the first gaps 152 and the second gap 154, respectively.

The gate lines 160 may include the GSL (e.g., the gate line 160a), the word lines (e.g., the gate lines 160b through 160g), and the SSL (e.g., the gate line 160h) sequentially stacked and spaced apart from one another along the first direction.

The gate line 160 and the insulating interlayer pattern 106 at each level may extend in the second direction and may surround the predetermined number of the channel rows (e.g., four channel rows). A gate line stack structure may be defined by the gate lines 160, the insulating interlayer patterns 106, and the channel rows in the gate lines 160 and the insulating interlayer patterns 106. A plurality of the gate line stack structures may be arranged along the third direction, and may be spaced apart from each other by the openings 150.

The gate line stack structure may have a pyramidal shape or a stepped shape substantially the same as or similar to that of the stepped mold structure. For example, the gate line 160 and the insulating interlayer pattern 106 at each level may include a step portion protruding in the second direction in a plane view.

In example embodiments, a multi-layered etch-stop layer including the first etch-stop layer pattern 112 and the second etch-stop layer pattern 165 may be formed on the gate line stack structure. As describe above, the second etch-stop layer pattern 165 and the gate lines 160 may be formed by substantially the same deposition and etching processes from the first conductive layer.

The etch-stop layer, as illustrated in FIG. 19, may be formed on uppermost and lowermost insulating interlayer pattern 106i and 106b, and continuously along the step portions of the gate line stack structure. As illustrated in FIG. 20, the etch-stop layer may surround a sidewall of an upper portion of the vertical channel structure.

Figure 21:
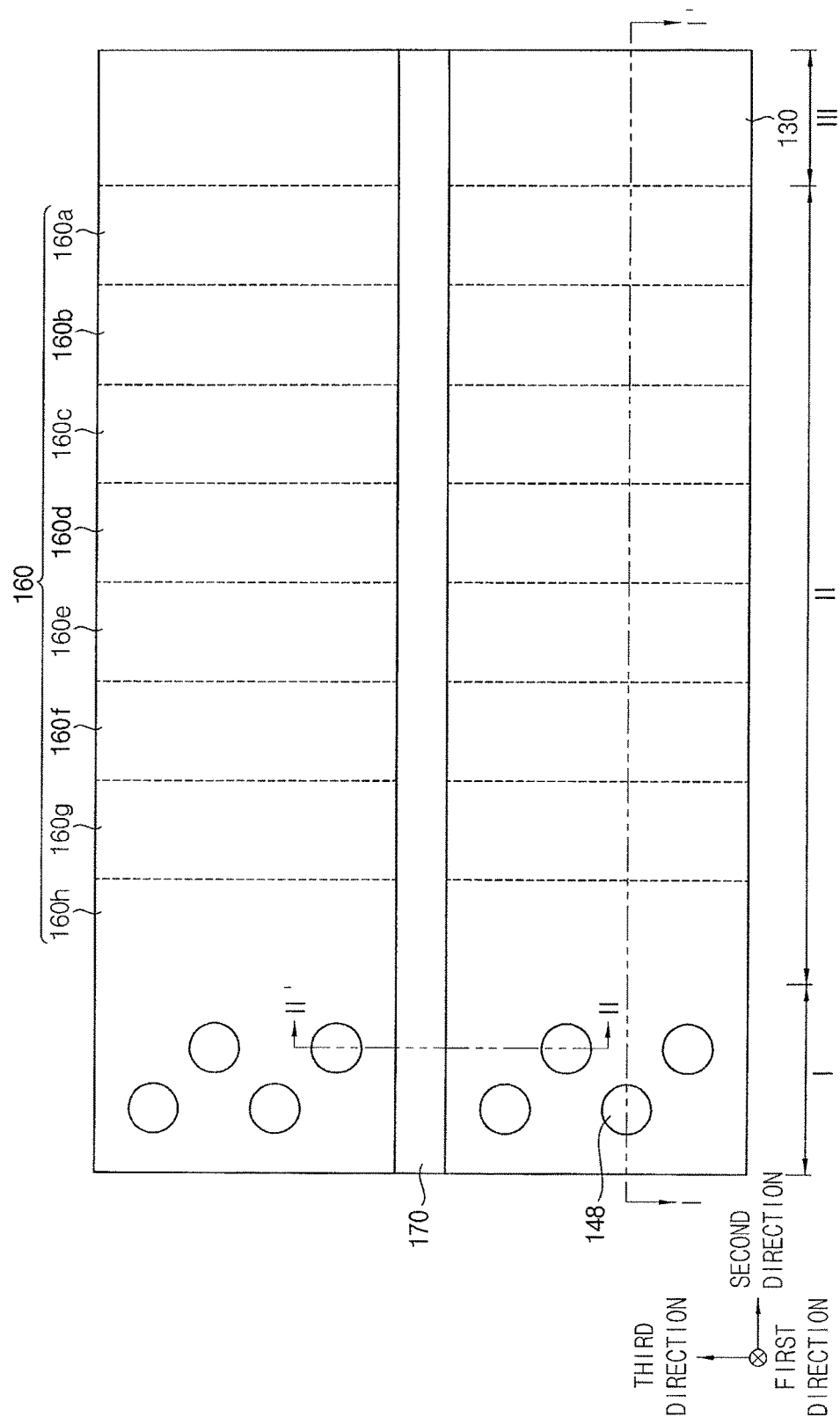
Figure 22:
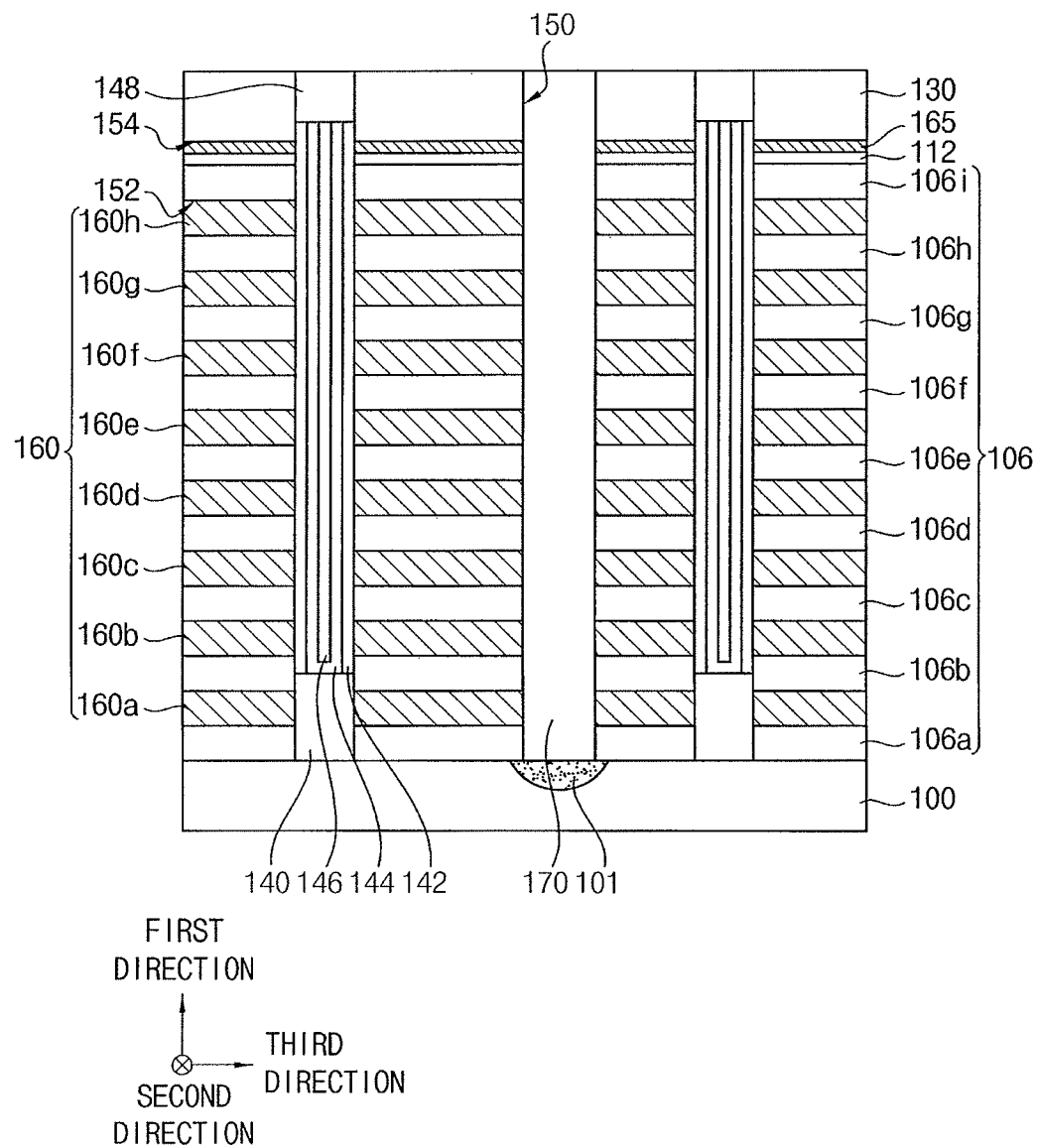

Referring to FIGS. 21 and 22, an ion-implantation process may be performed to form an impurity region 101 at an upper portion of the substrate 100 exposed through the opening 150. A cutting pattern 170 filling the opening 150 may be formed on the impurity region 101. The impurity region 101 may extend in the second direction, and may serve as, e.g., a CSL of the vertical memory device. A metal silicide pattern may be further formed on the impurity region 101 to reduce a resistance of the CSL. The cutting pattern 170 may be formed by filling or depositing an insulation material, e.g., silicon oxide in the opening 150. In some embodiments, the cutting pattern 170 may be substantially merged with the mold protection layer 130.

Figure 23:
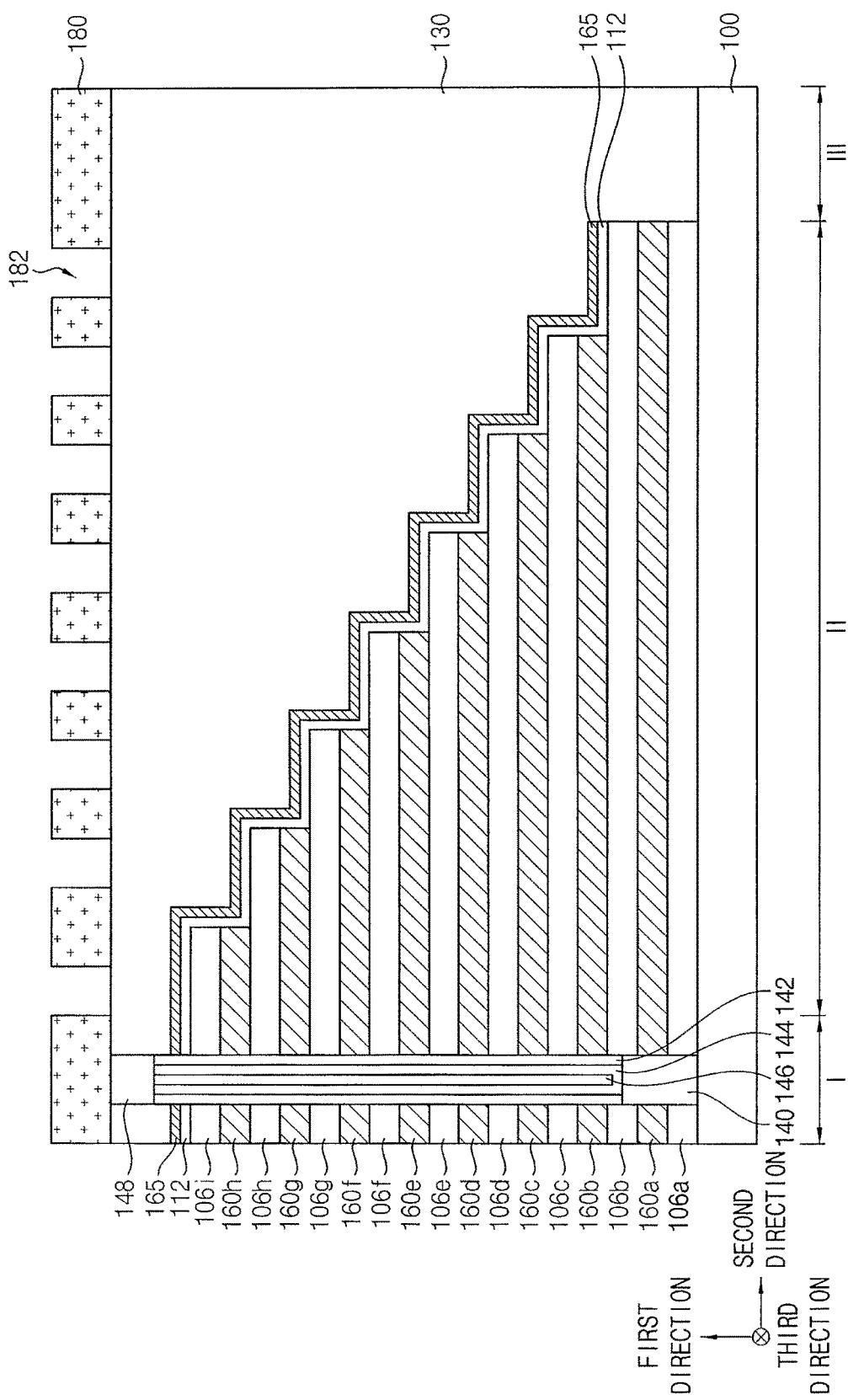

Referring to FIG. 23, a mask pattern 180 may be formed on the mold protection layer 130. The mask pattern 180 may substantially fully cover the first region I, and may include holes 182 exposing regions for forming contact holes by subsequent processes on the second region II. In some embodiments, the mask pattern 180 may substantially fully cover the third region III. In some embodiments, the holes 182 may be also formed on the third region III for forming, e.g., a peripheral circuit contact hole. The mask pattern 180 may be formed of, e.g., amorphous carbon layer (ACL), an SOH material or a photoresist material.

Figure 24:
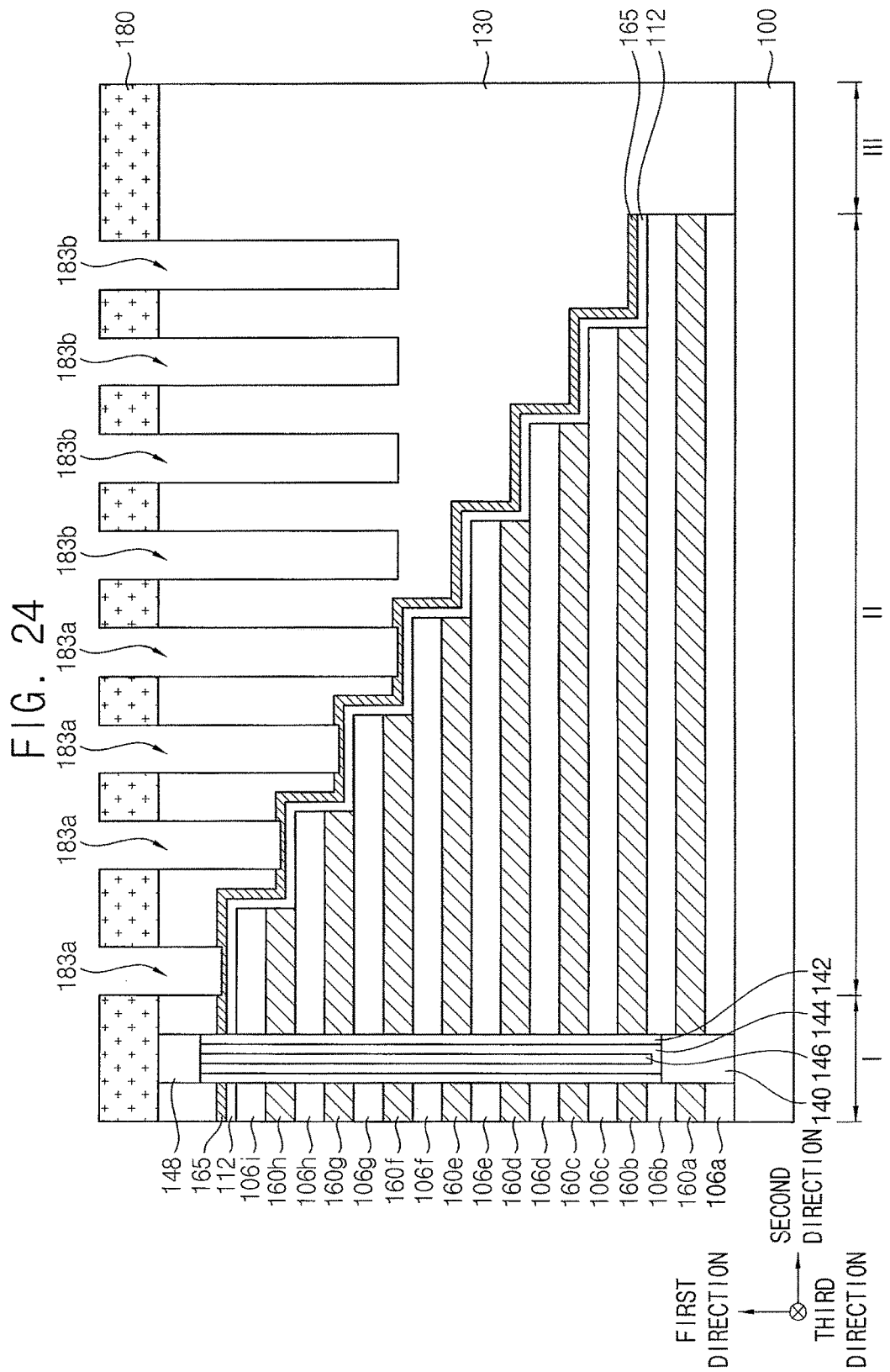

Referring to FIG. 24, a first etching process may be performed using the mask pattern 180. The mold protection layer 130 may be partially removed by the first etching process to form the contact holes. The first etching process may include a dry etching process having a high etching selectivity for an oxide. The contact holes formed by the first etching process may include first contact holes 183a and second contact holes 183b.

In example embodiments, the first contact holes 183a may be formed on the gate lines 160 at upper levels (e.g., the gate lines 160e to 160h) in the gate line stack structure. The second contact holes 183b may be formed on the gate lines 160 of lower levels (e.g., the gate lines 160d to 160a) except for the gate lines 160 of the upper levels.

The first etching process may be ceased before a bottom of the second contact hole 183b reaches a portion of the second etch-stop layer pattern 165 at the lower levels. Accordingly, a portion of the second etch-stop layer pattern 165 at the upper levels may be exposed through the first contact holes 183a that may have relatively small aspect ratios. The second etch-stop layer pattern 165 may include a conductive material (e.g., a metal such as tungsten) having a high etching selectivity with respect to the oxide. Thus, an extension of the first contact hole 183a may be substantially blocked or ceased by the second etch-stop layer pattern 165.

In some embodiments, as illustrated in FIG. 24, the first contact holes 183a may extend partially into the second etch-stop layer pattern 165.

Figure 25:
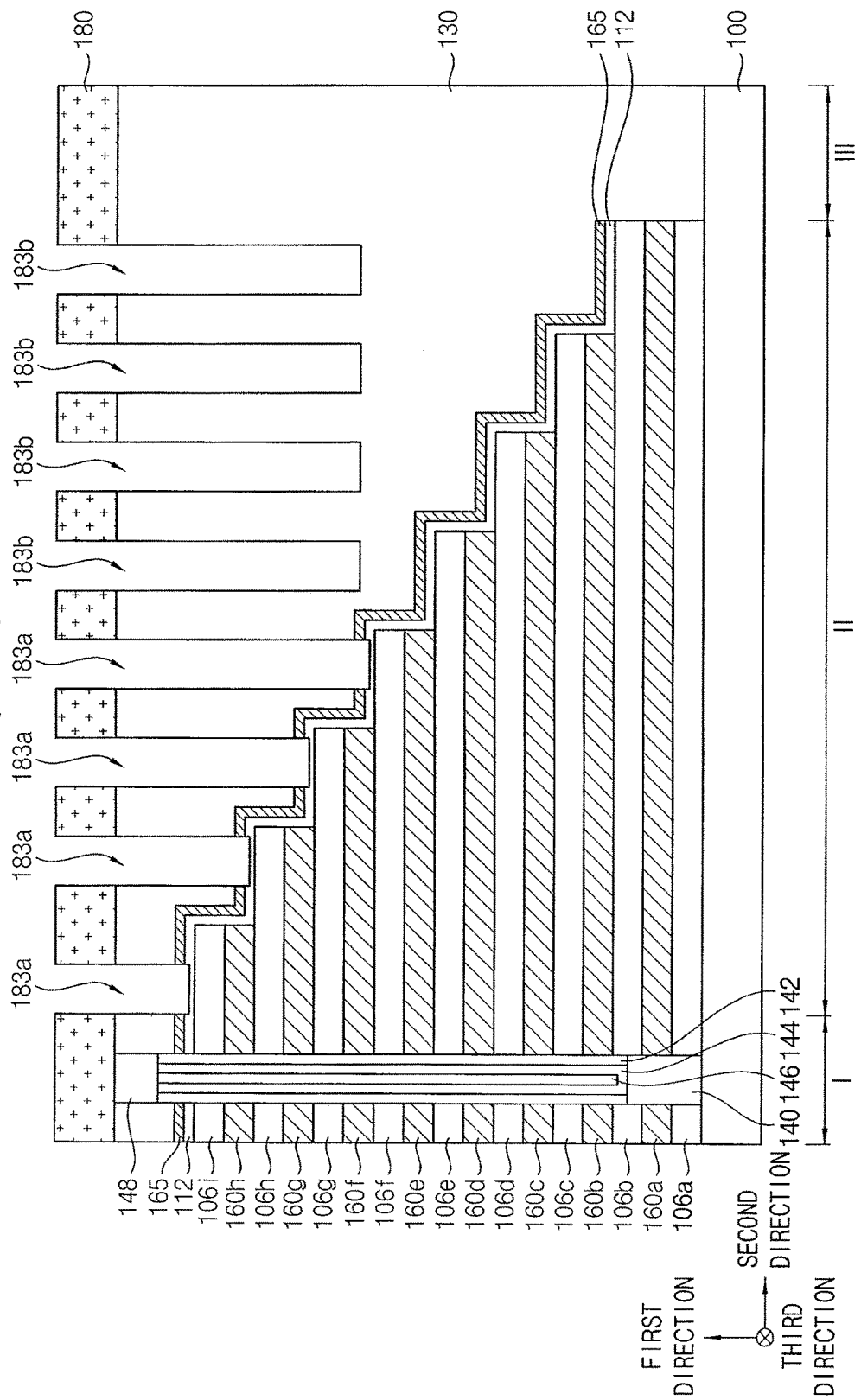

Referring to FIG. 25, a second etching process may be performed to remove the portion of the second etch-stop layer pattern 165 exposed through the first contact holes 183a. The second etching process may include a dry etching process having a relatively low etching selectivity for the oxide. Accordingly, the first contact holes 183a may be further expanded in the first direction and penetrate through the second etch-stop layer pattern 165. In some embodiments, the first contact holes 183 may extend partially into the first etch-stop layer pattern 112.

In some embodiments, lengths of the second contact holes 183b may also increase by the second etching process. In some embodiments, the bottom of the second contact hole 183b may not reach the second etch-stop layer pattern 165 at the lower levels even after the second etching process, and the second contact holes 183b may remain in the mold protection layer 130.

Figure 26:
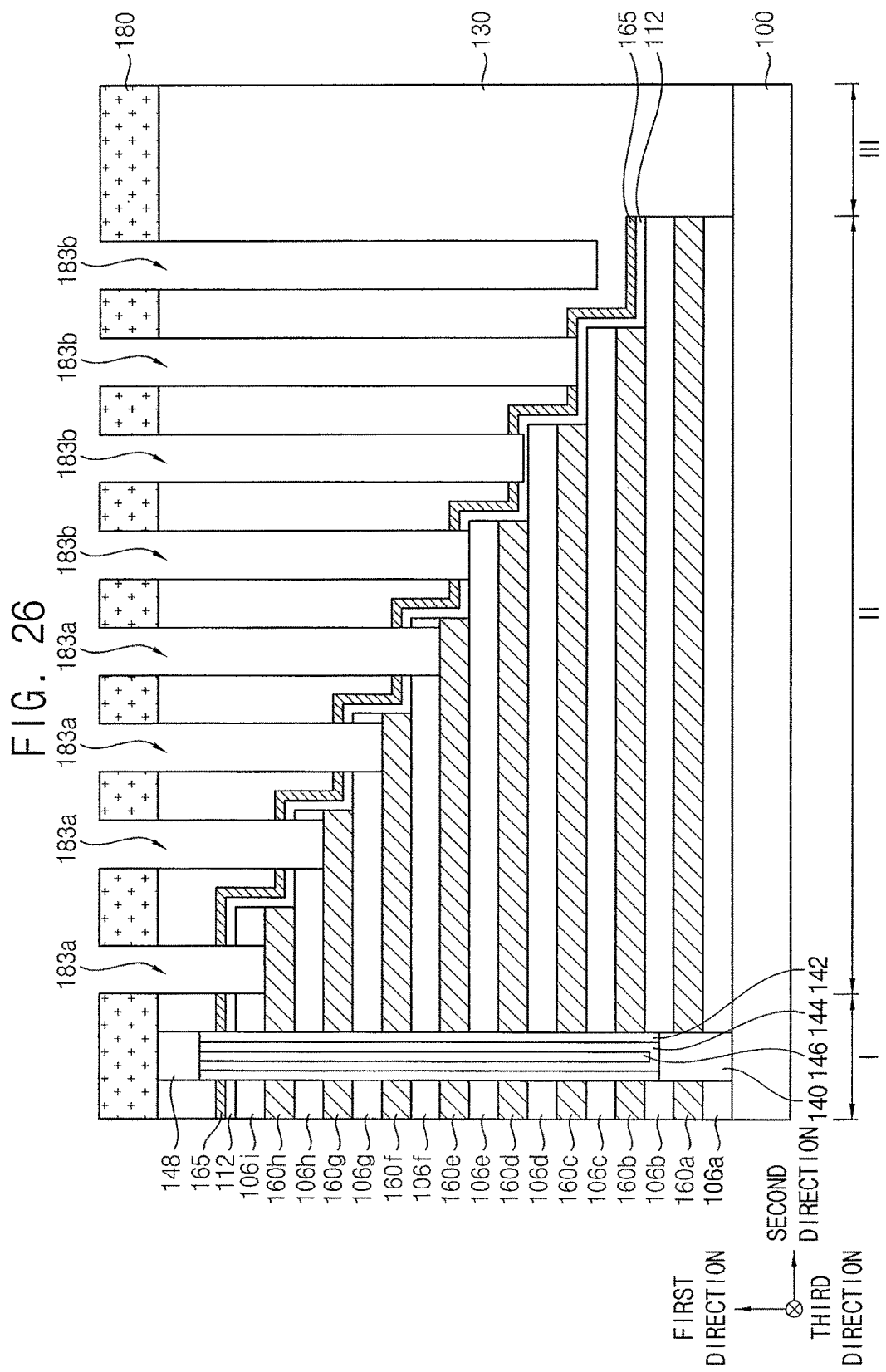

Referring to FIG. 26, a third etching process may be performed to further increase lengths of the contact holes. The third etching process may include a dry etching process having a high etching selectivity for the oxide.

In example embodiments, the first contact holes 183a may extend through the first etch-stop layer pattern 112 and the insulating interlayer patterns 106 at the upper levels (e.g., the insulating interlayer patterns 106f to 106i) by the third etching process. The third etching process may be performed until the top surfaces of the gate lines 160 at the upper levels (e.g., the gate lines 160e to 160h) may be exposed through the first contact holes 183a.

The lengths of the second contact holes 183b may further increase such that the second contact holes 183b may extend through the second etch-stop layer pattern 165. For example, an upper one of the second contact holes 183b may also extend at least partially through the first etch-stop layer pattern 112. In an embodiment, a lowermost second contact hole 183b formed over the GSL 160a may not reach the second etch-stop layer pattern 165, and may still remain in the mold protection layer 130.

Figure 27:
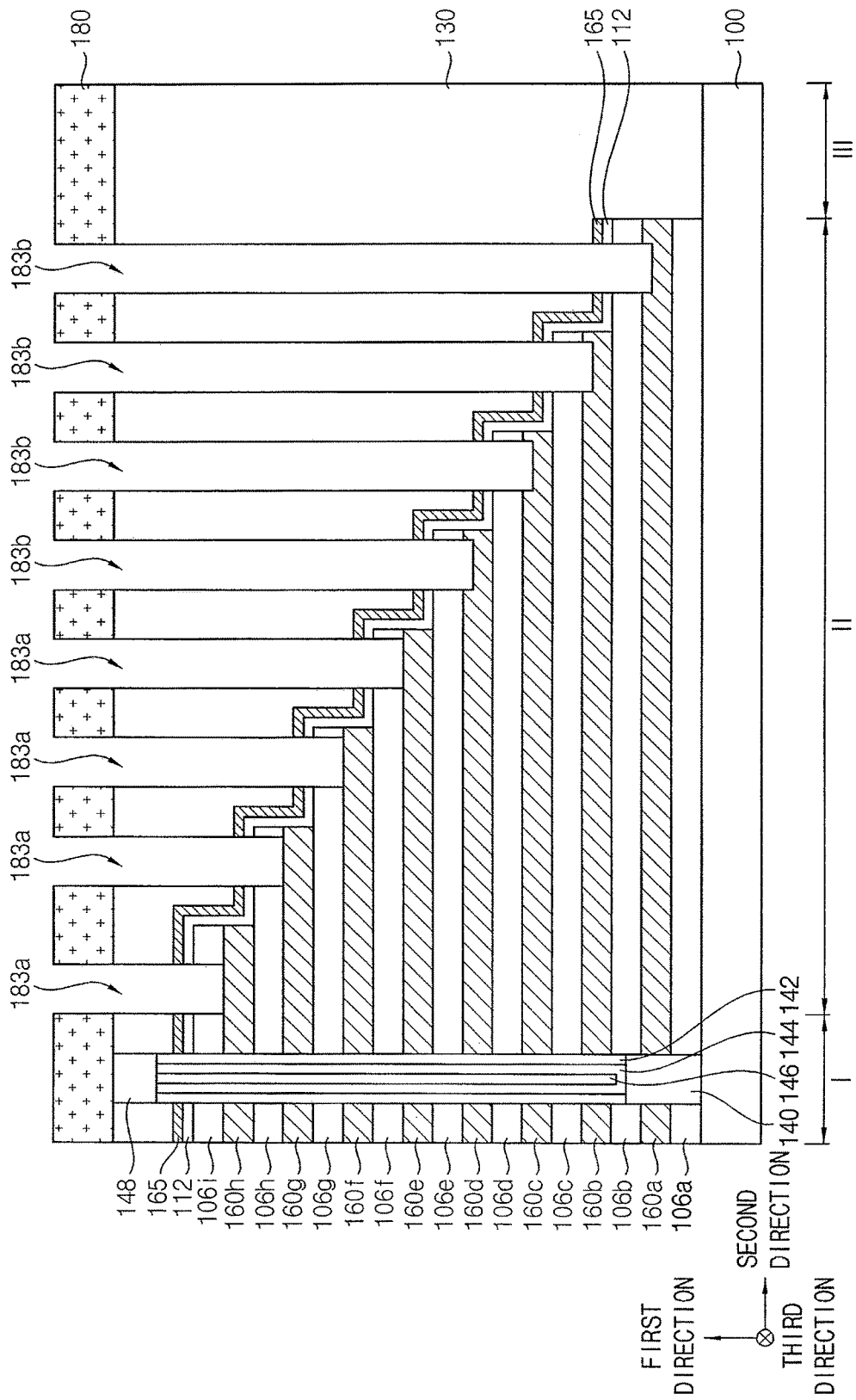

Referring to FIG. 27, a fourth etching process may be performed such that the second contact holes 183b may additionally extend in the first direction. In example embodiments, the lengths of the second contact holes 183b may further increase by the fourth etching process to expose the step portions of the gate lines 160 at the lower levels (e.g., the gate lines 160a to 160d).

In some embodiments, the gate lines 160 at the upper levels (e.g., the gate lines 160e to 160h) may substantially serve as an etch-stop layer, and the lengths of the first contact holes 183a may be maintained after the fourth etching process. In some embodiments, the gate lines 160a to 160d at the lower levels may be partially over-etched by the fourth etching process. Accordingly, the second contact holes 183b may extend partially into the gate lines 160a to 160d at the lower levels. After the first to fourth etching processes, the mask pattern 180 may be removed by, e.g., an ashing process and/or a strip process.

As described with reference to FIGS. 24 to 27, the first and second contact holes 183a and 183b may be formed without defects such as a punching or a not-open failure of the gate lines.

In a comparative example, if the contact holes 183a and 183b are formed by a single etching process, etching selectivity between the oxide and the conductive material in the gate lines 160 may be degraded while forming, e.g., the second contact holes 183b having relatively high aspect ratios. As a result, the second contact holes 183b may extend completely through the gate lines 160 (e.g., 160b to 160d) to cause the punching of the gate lines 160. Further, an etching rate may be excessively reduced over the lowermost gate line 160a (e.g., GSL), and the lowermost gate line 160a may not be exposed through the second contact hole 183b to cause a not-open failure. In effort to avoid punching and a not-open failure, the contact holes 183a and 183b may be formed by a plurality of photo-lithography processes. However, this may increase process costs and time by an excessive amount.

According to example embodiments as described above, the first etch-stop layer pattern 112 and the second etch-stop layer pattern 165 respectively including an oxide and a conductive material are formed on the gate line stack structure. Thus, degradation or reduction of etching selectivity may be reduced or prevented. Further, etching conditions may be finely controlled using a plurality of phases in a single etching process. Thus, lengths of the contact holes 183a and 183b may be also finely controlled.

Figure 28:
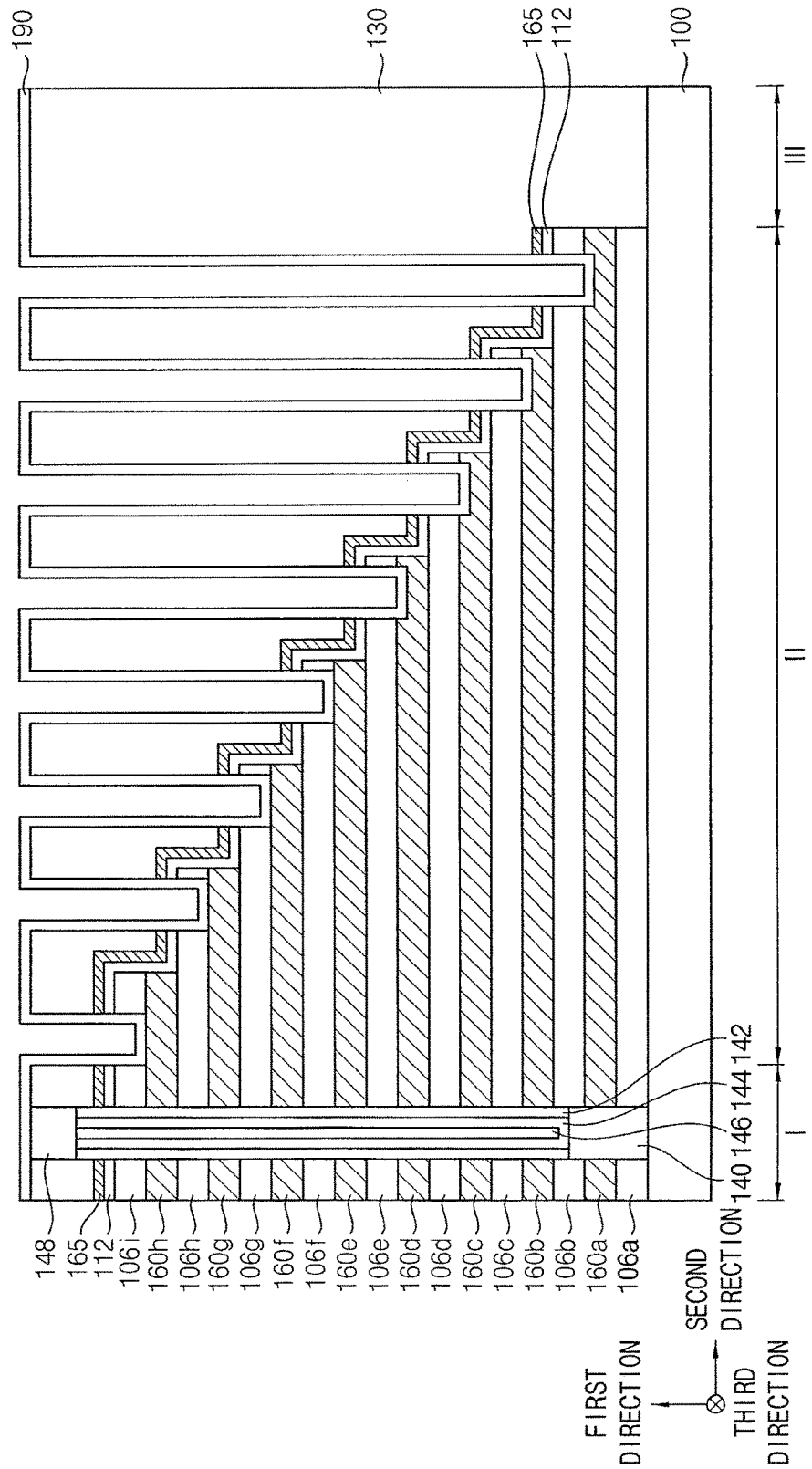

Referring to FIG. 28, a contact spacer layer 190 may be formed along the top surface of the mold protection layer 130, and sidewalls and bottom surfaces of the contact holes 183a and 183b. For example, the contact spacer layer 190 may be formed of silicon nitride or silicon oxynitride, and may be formed by an ALD process or a sputtering process having an improved step-coverage property.

Figure 29:
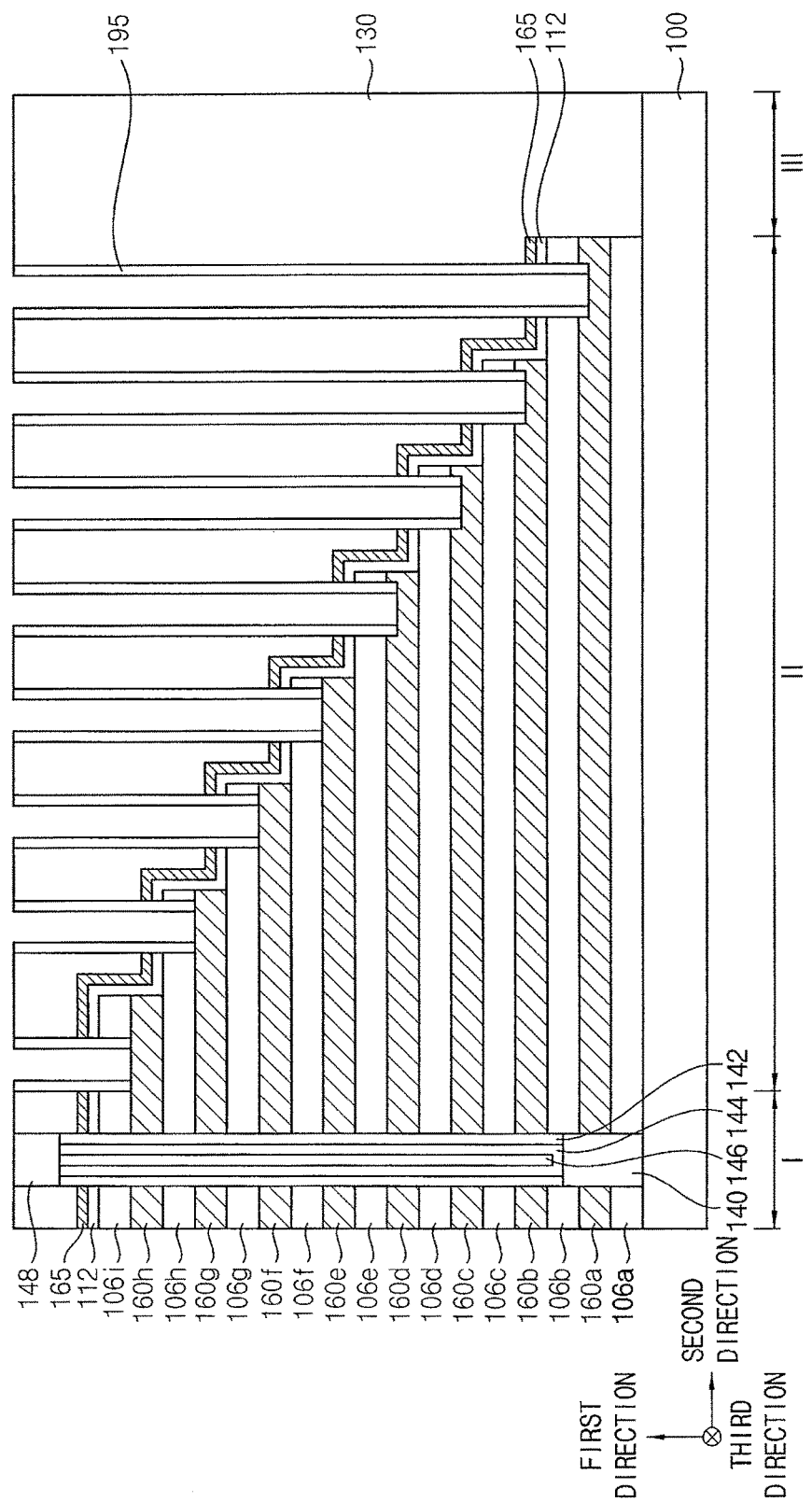

Referring to FIG. 29, portions of the contact spacer layer 190 formed on the top surface of the mold protection layer 130, and the bottom surfaces of the contact holes 183a and 183b may be removed by, e.g., an etch-back process. Accordingly, a contact spacer 195 may be formed on the sidewall of each of the contact holes 183a and 183b. In example embodiments, the contact spacer 195 may have a straw shape, and step portions of the gate lines 160 may be exposed again through the contact holes 183a and 183b.

Figure 30:
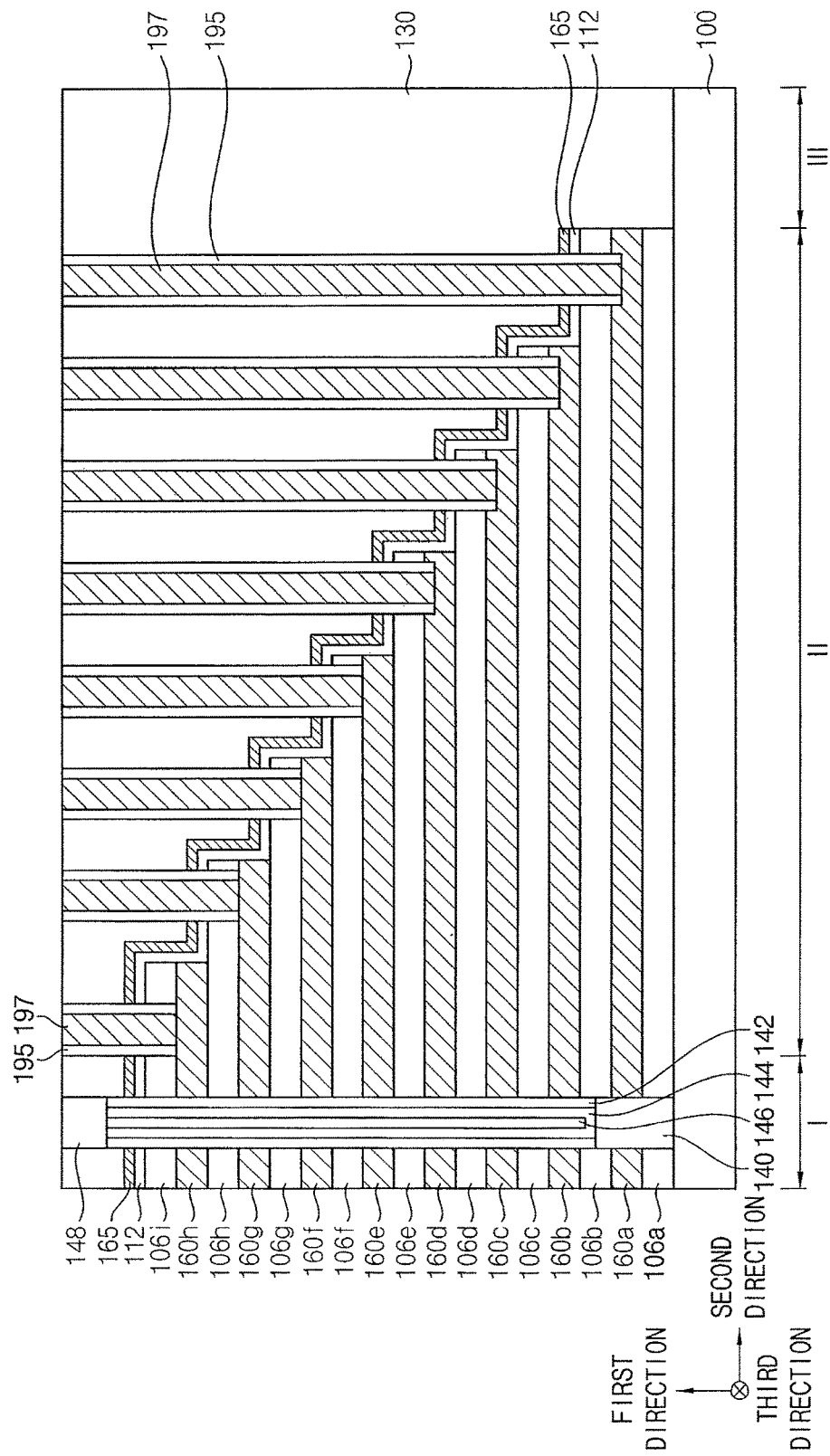

Referring to FIG. 30, the contacts 197 filling the contact holes 183a and 183b may be formed on the step portions of the gate lines 160.

In example embodiments, a second conductive layer sufficiently filling the contact holes 183a and 183b may be formed on the mold protection layer 130. An upper portion of the second conductive layer may be planarized until the top surface of the mold protection layer 130 may be exposed to form the contacts 197. The second conductive layer may be formed of a metal, a metal nitride, doped polysilicon and/or a metal silicide by an ALD process or a sputtering process.

The contact spacer 195 may surround a sidewall of the contact 197. Thus, the contact 197 may be insulated from the second etch-stop layer pattern 165 including the conductive material. In some embodiments, bit lines electrically connected to the pads 148, and wirings electrically connected to the contacts 197 may be further formed on the mold protection layer 130.

Figure 31:
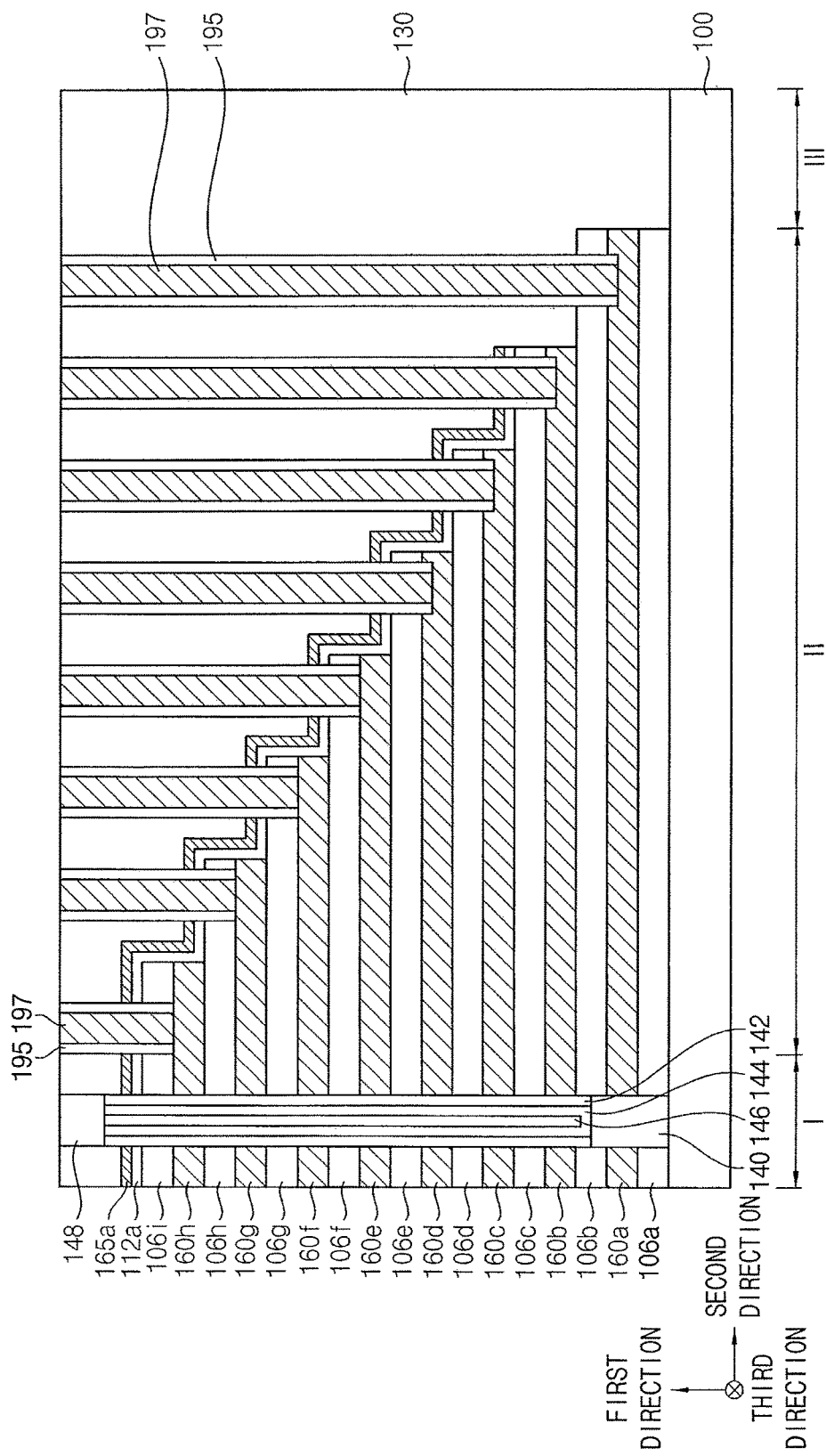
FIG. 31 illustrates another embodiment of a vertical memory device.

FIG. 31 illustrates a cross-sectional view of another embodiment of a vertical memory device. The vertical memory device of FIG. 31 may have elements and/or structures substantially the same as or similar to those illustrated in FIGS. 1 to 3, except for the shape of an etch-stop layer.

Referring to FIG. 31, as also described with reference to FIGS. 1 to 3, a multi-layered etch-stop layer including a first etch-stop layer pattern 112a and a second etch-stop layer pattern 165a may be formed on a top surface and a sidewall of a gate line stack structure. In example embodiments, the etch-stop layer may continuously extend from a top surface of an uppermost insulating interlayer pattern 106i to a top surface of a specific insulating interlayer pattern 106 at a lower level.

In some embodiments, the etch-stop layer may overlap some gate lines 160, e.g., from an uppermost gate line 160h (e.g., an SSL) to the gate lines 160 that may be vulnerable to a punching. In some embodiments, the etch-stop layer may overlap step portions of the SSL 160h and word lines (e.g., the gate lines 160g to 160b). In some embodiments, the etch-stop layer may be removed from a step portion of the gate line 160 that may be vulnerable to a not-open failure. In an embodiment, the etch-stop layer may be removed from a step portion of a lowermost gate line 160a (e.g., a GSL).

Contacts 197 on the word lines 160b to 160h and the SSL 160i may extend through a mold protection 130, the second etch-stop layer pattern 165a, the first etch-stop layer pattern 112a, and the insulating interlayer patterns 106i to 106c to be in contact with the gate lines 160. The contact on the GSL 160a may extend through the mold protection layer 130 and the insulating interlayer pattern 106b to be in contact with the GSL 160a.

Figure 32:
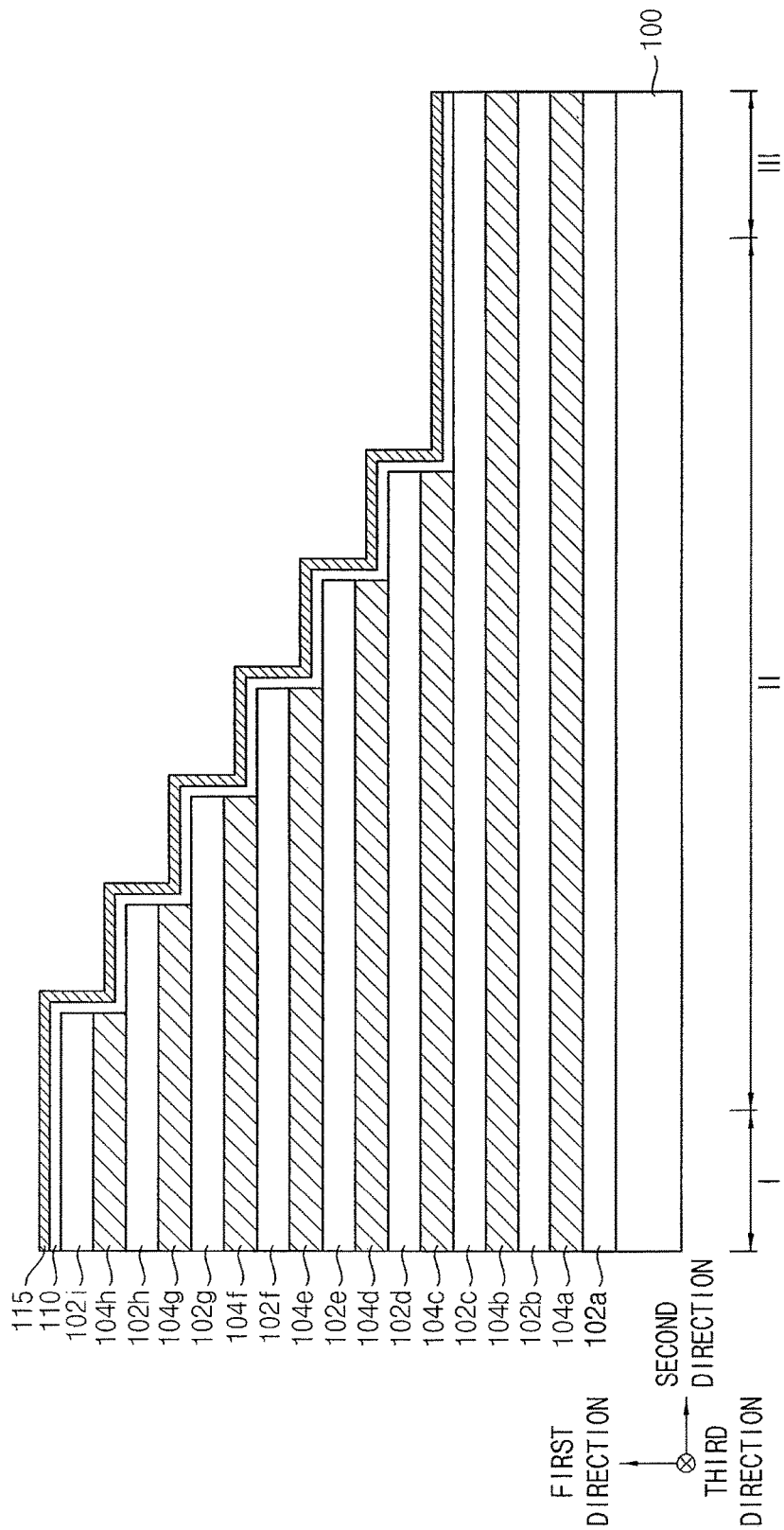
FIGS. 32 to 34 illustrate various stages in another embodiment of a method for manufacturing a vertical memory device.
Figure 33:
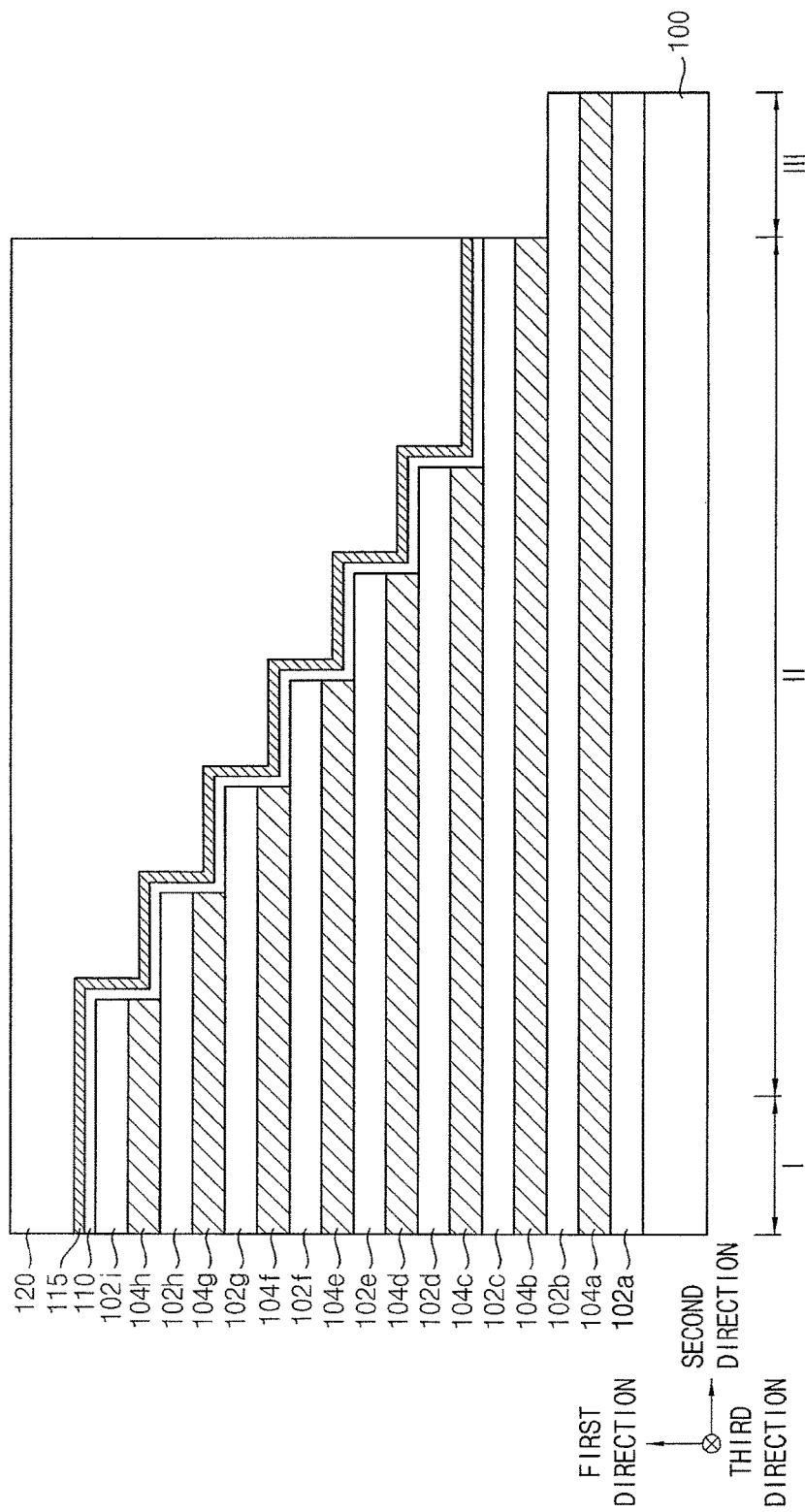
Figure 34:
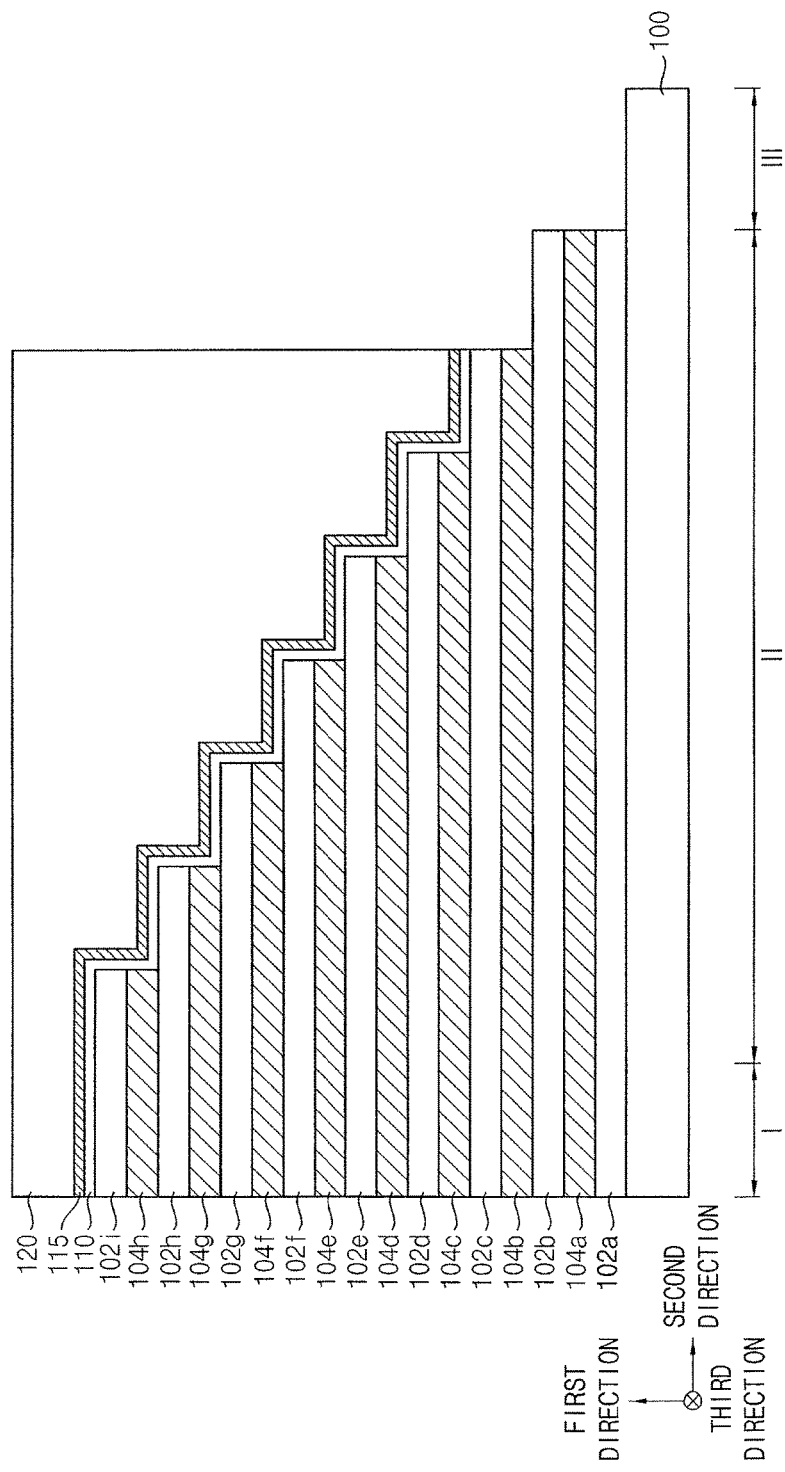

FIGS. 32 to 34 illustrate cross-sectional views of another embodiment of a method for manufacturing a vertical memory device. Referring to FIG. 32, processes substantially the same as or similar to those illustrated with reference to FIGS. 4 to 6 are performed. In example embodiments, insulating interlayers 102 (e.g., 102a through 102i) and sacrificial layers 104 (e.g., 104a through 104h) may be alternately and repeatedly on a substrate 100 including a first region I, a second region II and a third region III to form a mold structure.

A portion of the mold structure on the second region II and the third region III may be etched in a stepwise manner by a plurality of photo-lithography processes to form a preliminary stepped mold structure as illustrated in FIG. 32.

The number of the photo-lithography processes for forming the preliminary stepped mold structure may be less than that for forming the stepped mold structure illustrated in FIG. 5. Thus, the preliminary stepped mold structure may include step portions less than those of the stepped mold structure illustrated in FIG. 5.

In example embodiments, the mold structure may not be fully removed on the third region III. For example, insulating interlayers 102a to 102c and sacrificial layers 104a and 104b at lower levels may not be removed by the photo-lithography process to remain on the third region III.

Subsequently, a first etch-stop layer 110 and a preliminary second etch-stop layer 115 may be formed on the preliminary stepped mold structure as described with reference to FIG. 6.

Referring to FIG. 33, a photo-lithography process may be additionally performed to remove portions of the preliminary second etch-stop layer 115 and the first etch-stop layer 110 formed on the third region III.

In example embodiments, a photoresist pattern 120 selectively covering the first region I and the second region II may be formed on the preliminary second etch-stop layer 115. The portions of the preliminary second etch-stop layer 115 and the first etch-stop layer 110 formed on the third region III may be removed using the photoresist pattern 120. A portion of the preliminary stepped mold structure on the third region III may be also partially removed.

In some embodiments, the insulating interlayer 102c and the sacrificial layer 104b may be etched by the photo-lithography process such that a step portion may be added to the preliminary stepped mold structure.

Referring to FIG. 34, a width in the second direction of the photoresist pattern 120 may be reduced, and a photo-lithography process may be further performed.

In example embodiments, the preliminary second etch-stop layer 115 and the first etch-stop layer 110 may be additionally etched, and the insulating interlayers 102a to 102c and the sacrificial layers 104a and 104b may be also additionally etched by the photo-lithography process.

Accordingly, a step portion may be added again to the preliminary stepped mold structure of FIG. 33 such that a stepped mold structure may be obtained. The preliminary second etch-stop layer 115 and the first etch-stop layer 110 may cover step portions of the stepped mold structure except for a lowermost step portion.

After forming the stepped mold structure, the photoresist pattern 120 may be removed by an ashing process and/or a strip process. Subsequently, processes substantially the same as or similar to those illustrated with reference to FIGS. 8 to 30 may be performed to obtain the vertical memory device of FIG. 31.

According to example embodiments as described above, the etch-stop layer may be removed on a step portion of a gate line that may be vulnerable to a not-open failure (e.g., a GSL 160*a*). An addition of the step portion in the preliminary stepped mold structure may be also implemented by the photo-lithography process for partially removing the etch-stop layer. Thus, process costs or time may be saved or reduced.

Figure 35:
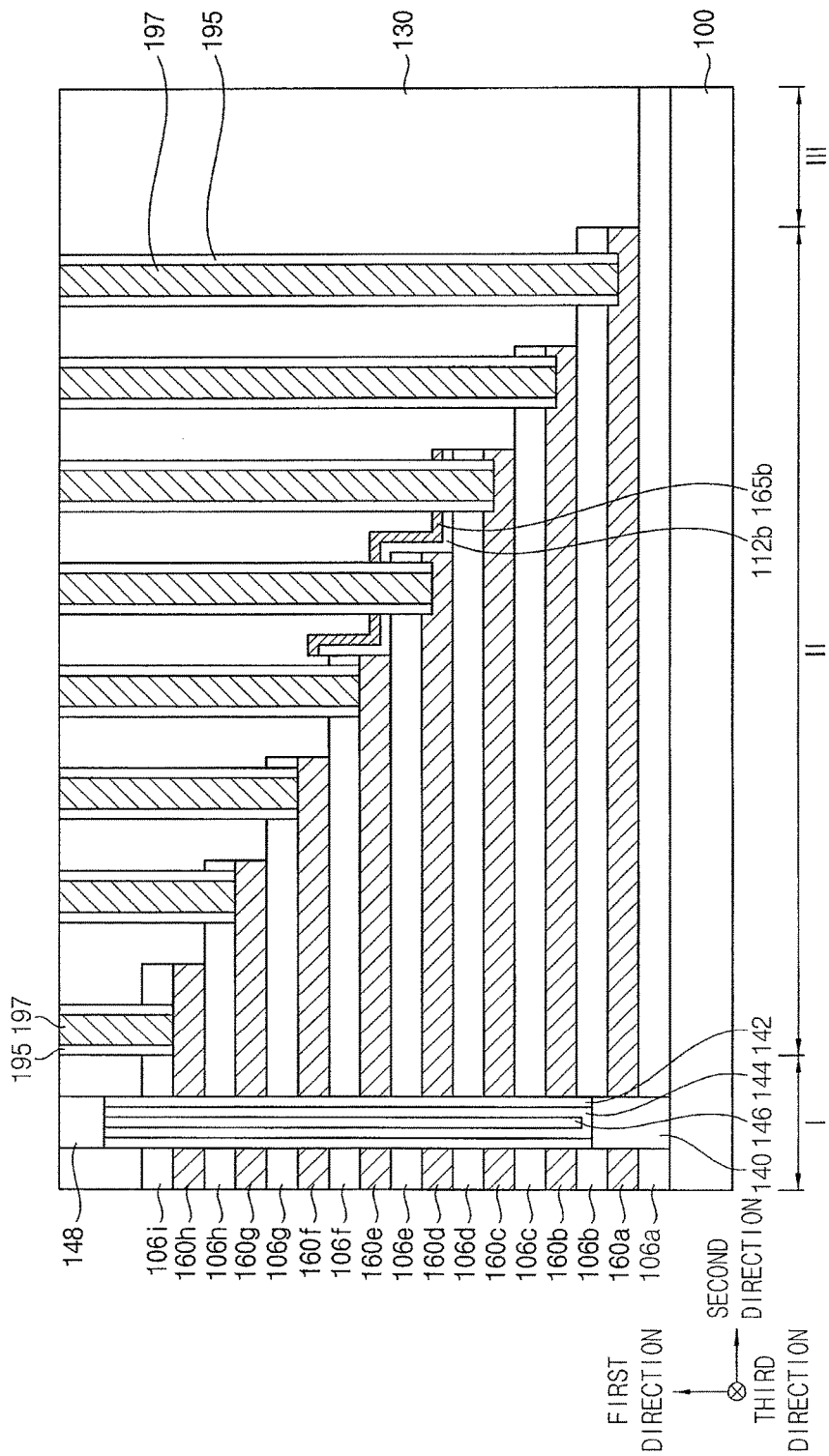
FIG. 35 illustrates another embodiment of a vertical memory device.

FIG. 35 illustrates a cross-sectional view of another embodiment of a vertical memory device. The vertical memory device of FIG. 35 may have elements and/or structures substantially the same as or similar to those illustrated in FIGS. 1 to 3, except for the shape of an etch-stop layer.

Referring to FIG. 35, as also described with reference to FIGS. 1 to 3, a multi-layered etch-stop layer including a first etch-stop layer pattern 112*b* and a second etch-stop layer pattern 165*b* may be formed on a gate line stack structure. In example embodiments, the etch-stop layer may selectively overlap step portions of some specific word lines. In some embodiments, the etch-stop layer may selectively cover step portions of gate lines that may be vulnerable to a punching (e.g., the gate lines 160*c* and 160*d*). In some embodiments, the etch-stop layer may be removed over an SSL (e.g., the gate line 160*h*), a GSL (e.g., the gate line 160*a*), and some word lines (e.g., the gate lines 160*e*, 160*f*, 160*g* and 160*b*).

Contacts 197 on the gate lines 160*c* and 160*d* that may be vulnerable to punching may extend through a mold protection layer 130, the second etch-stop layer pattern 165*b*, the first etch-stop layer pattern 112*b*, and insulating interlayer patterns 106*d* and 106*e* and contact gate lines 160. The contacts 197 on the SSL 160*h*, the GSL 160*a*, and the some word lines 160*e*, 160*f*, 160*g* and 160*b* may extend through the mold protection layer 130 and the insulating interlayer patterns 106*i*, 106*h*, 106*g*, 106*f*, 106*c* and 106*b* and contact the gate line 160.

Figure 36:
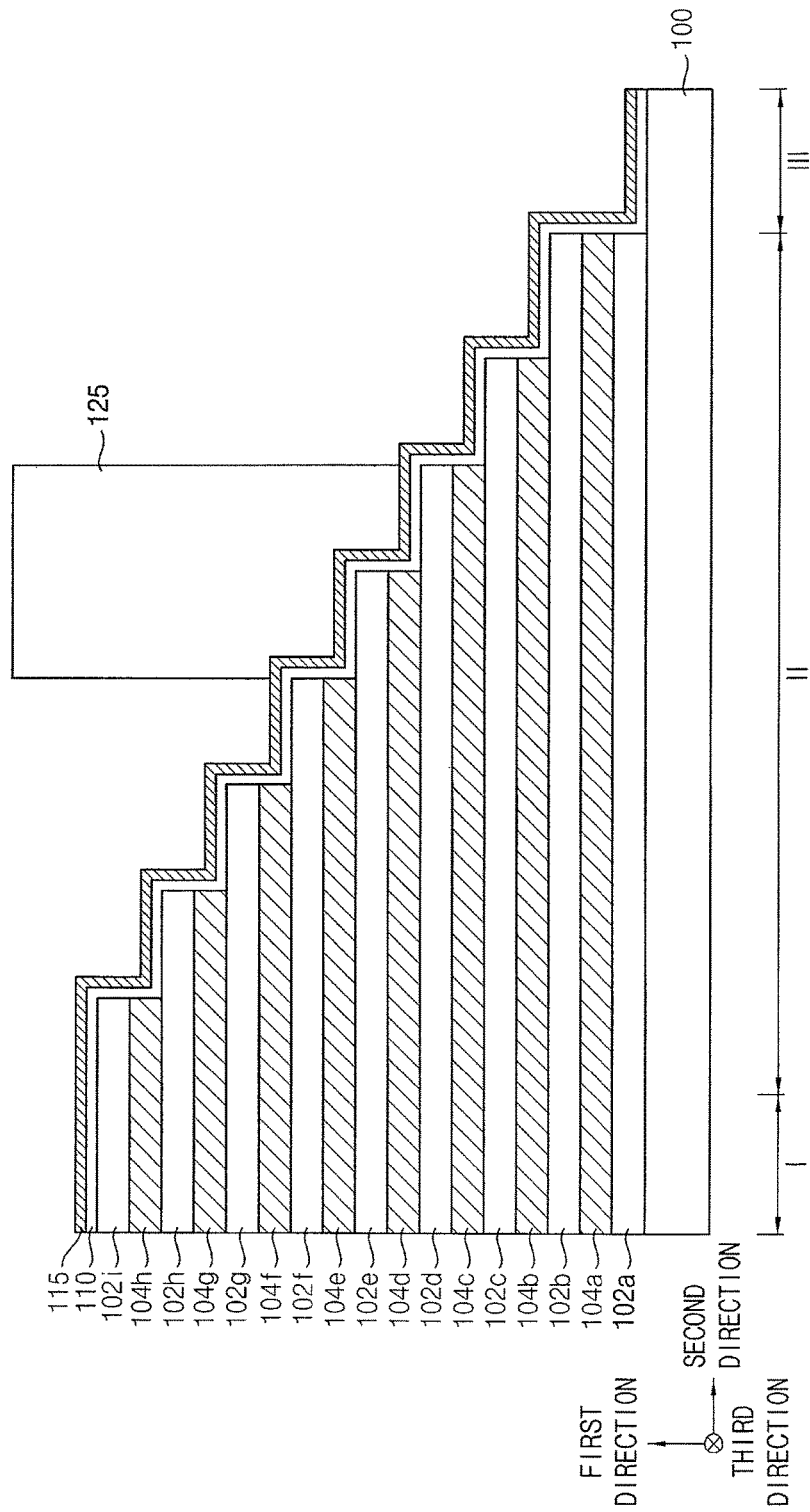
FIGS. 36 and 37 illustrate various stages in another embodiment of a method for manufacturing a vertical memory device.
Figure 37:
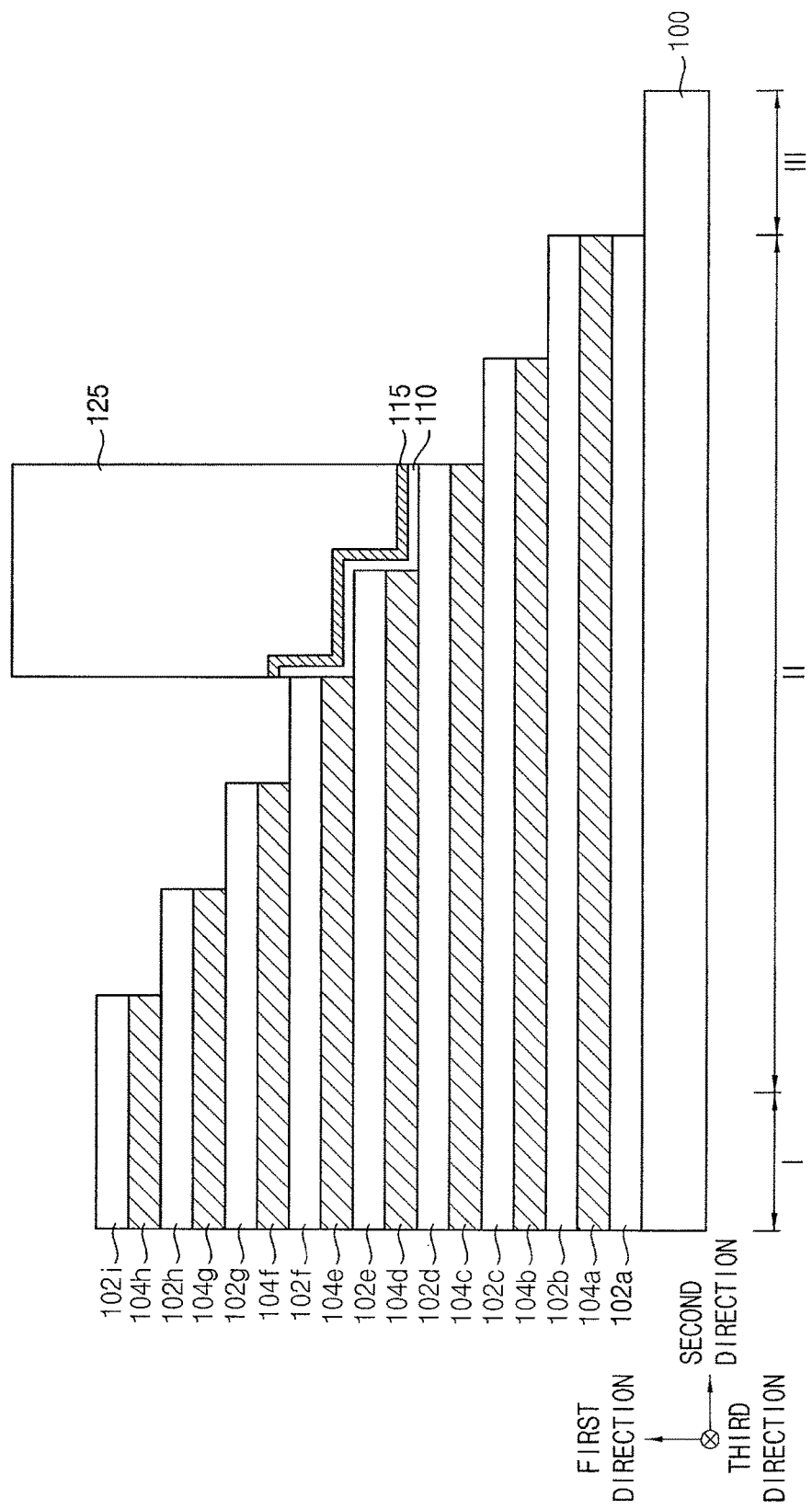

FIGS. 36 and 37 illustrate cross-sectional views of another embodiment of a method for manufacturing a vertical memory device. Many of the processes and/or materials of this method may be substantially the same as or similar to those illustrated with reference to FIGS. 4 to 30.

Referring to FIG. 36, processes substantially the same as or similar to those in FIGS. 4 to 6 may be performed. In example embodiments, insulating interlayers 102 (e.g., 102*a* through 102*i*) and sacrificial layers 104 (e.g., 104*a* through 104*h*) may be alternately and repeatedly on a substrate 100 including a first region I, a second region II, and a third region III to form a mold structure.

A portion of the mold structure on the second region II and the third region III may be etched in a stepwise manner by a plurality of photo-lithography processes to form a stepped mold structure. A first etch-stop layer 110 and a preliminary second etch-stop layer 115 may be sequentially formed along a surface of the stepped mold structure and a top surface of the substrate 100. A photoresist pattern 125 selectively overlapping step portions of, e.g., some sacrificial layers 104*c* and 104*d* that may be replaced with gate lines vulnerable to a punching, may be formed on the preliminary second etch-stop layer 115 of the second region II.

Referring to FIG. 37, portions of the preliminary second etch-stop layer 115 and the first etch-stop layer 110 that may not be covered by the photoresist pattern 125 may be removed by an etching process using the photoresist pattern 125. Accordingly, the second etch-stop layer 115 and the first etch-stop layer 110 may selectively remain on the step portions of the some sacrificial layers 104*c* and 104*d*. After the etching process, the photoresist pattern 125 may be removed by an ashing process and/or a strip process.

Subsequently, processes substantially the same as or similar to those illustrated with reference to FIGS. 8 to 30 may be performed to obtain the vertical memory device in FIG. 35.

Figure 38:
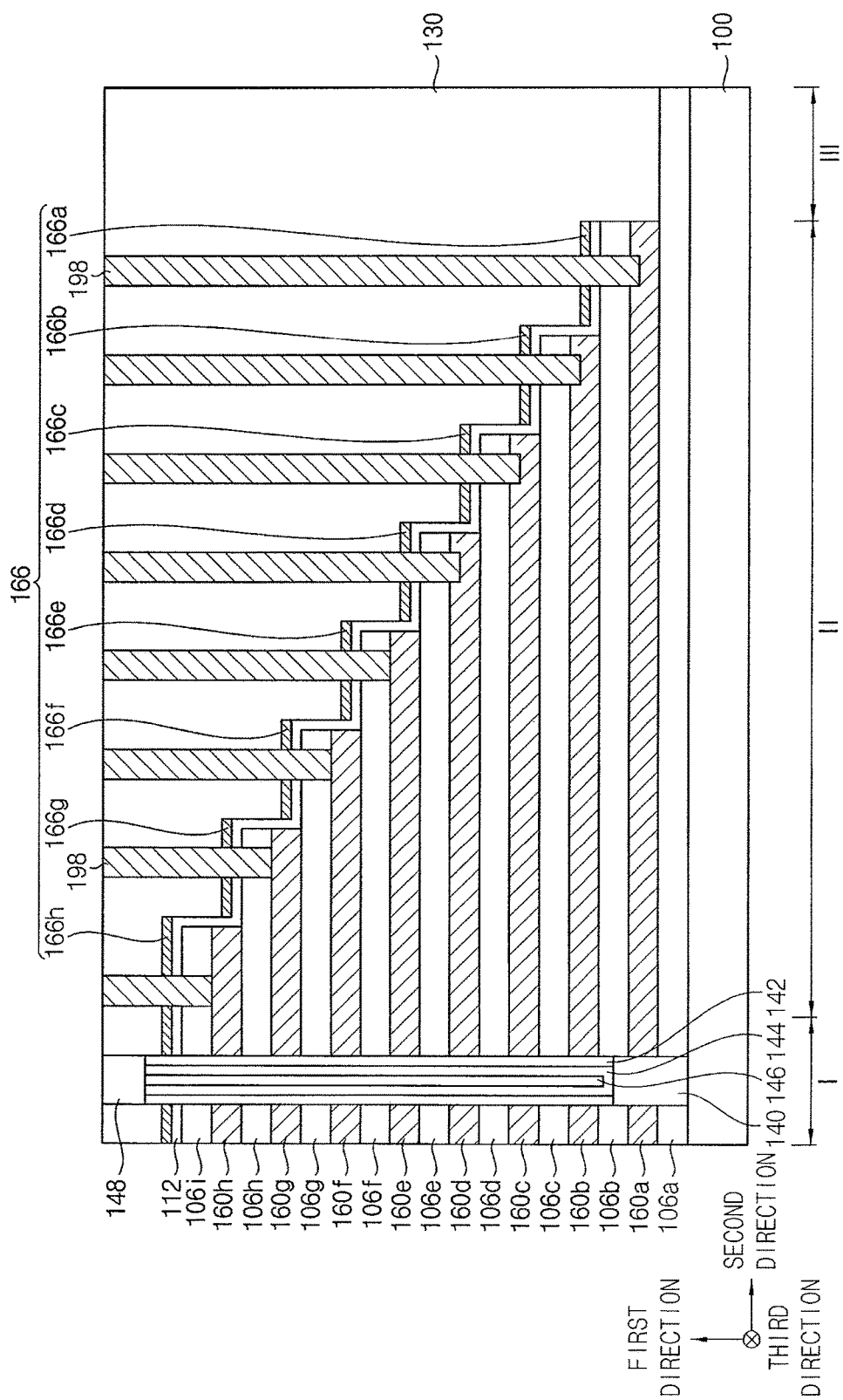
FIG. 38 illustrates another embodiment of a vertical memory device.

FIG. 38 illustrates a cross-sectional view of another embodiment of a vertical memory device. Many of the elements and/or structures of this embodiment may be substantially the same as or similar to those illustrated in FIGS. 1 to 3.

Referring to FIG. 38, as also described with reference to FIGS. 1 to 3, a multi-layered etch-stop layer including a first etch-stop layer pattern 112 and a second etch-stop layer pattern 166 may be formed on a top surface and a sidewall of a gate line stack structure. The first etch-stop layer pattern 112 may continuously extend on step portions from an uppermost gate line 160*h* to a lowermost gate line 160*a*.

In example embodiments, the second etch-stop layer pattern 166 may be individually divided per each step portion of the gate lines 160. For example, each of the second etch-stop layer patterns 166 (e.g., 166*a* through 166*h*) may individually cover the step portions from the lowermost gate line 160*a* to the uppermost gate line 160*h*

Contacts 198 may extend through a mold protection layer 130, the second etch-stop layer pattern 166, the first etch-stop layer pattern 112 and insulating interlayer patterns 106 to be in contact with the gate lines 160.

In some embodiments, the contact spacer 195 in FIGS. 1 to 3 may be omitted.

In an embodiment, the second etch-stop layer pattern 166 may be individually separated per each level. Thus, the second etch-stop layer pattern 166 may be directly connected to the contact 198. An efficient area of the contact 198 may be increased by the second etch-stop layer pattern 166 so that electrical resistance through the contact 198 may be reduced.

Figure 39:
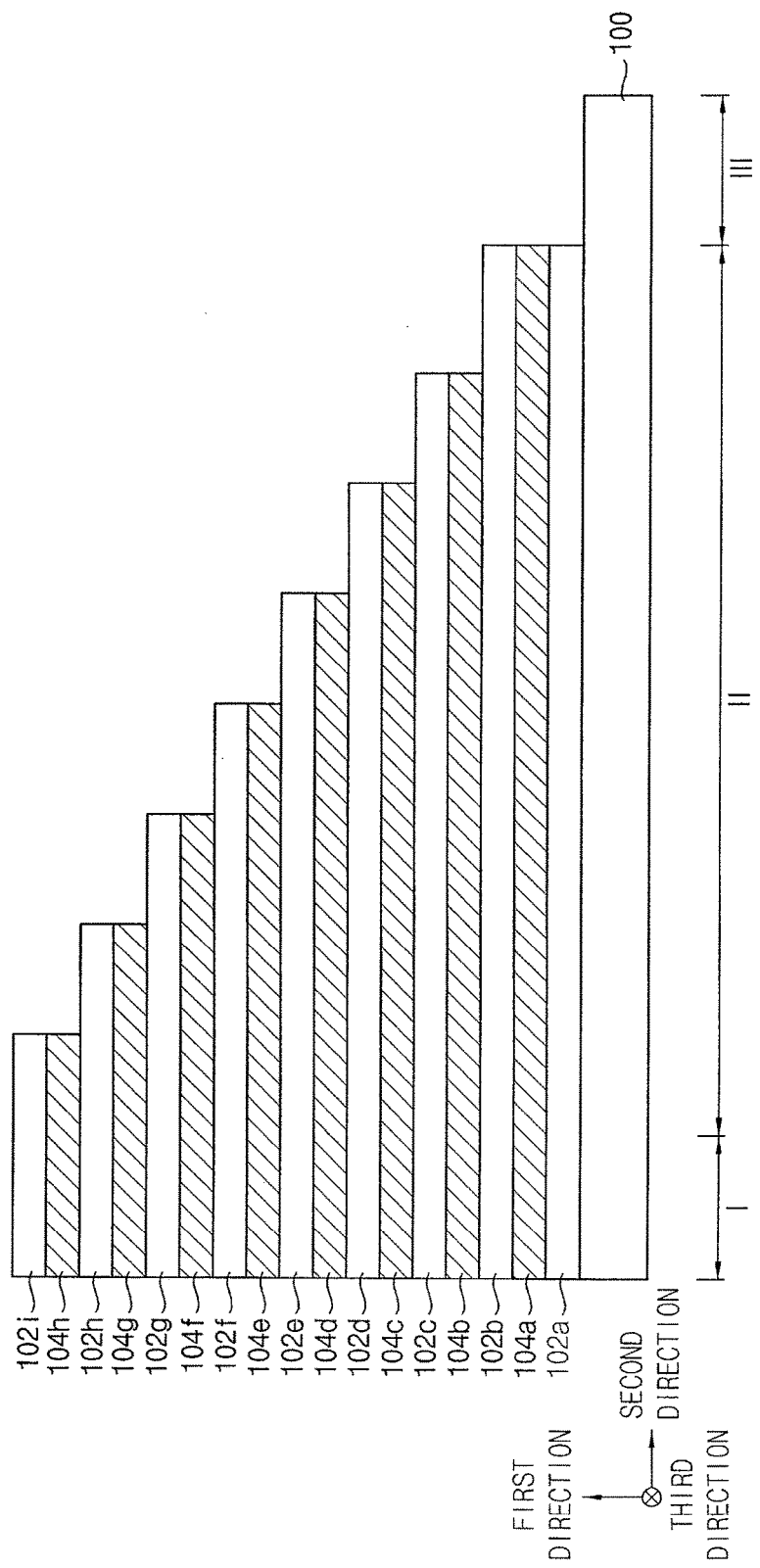
FIGS. 39 to 41 illustrate various stages in another embodiment of a method for manufacturing a vertical memory device.
Figure 40:
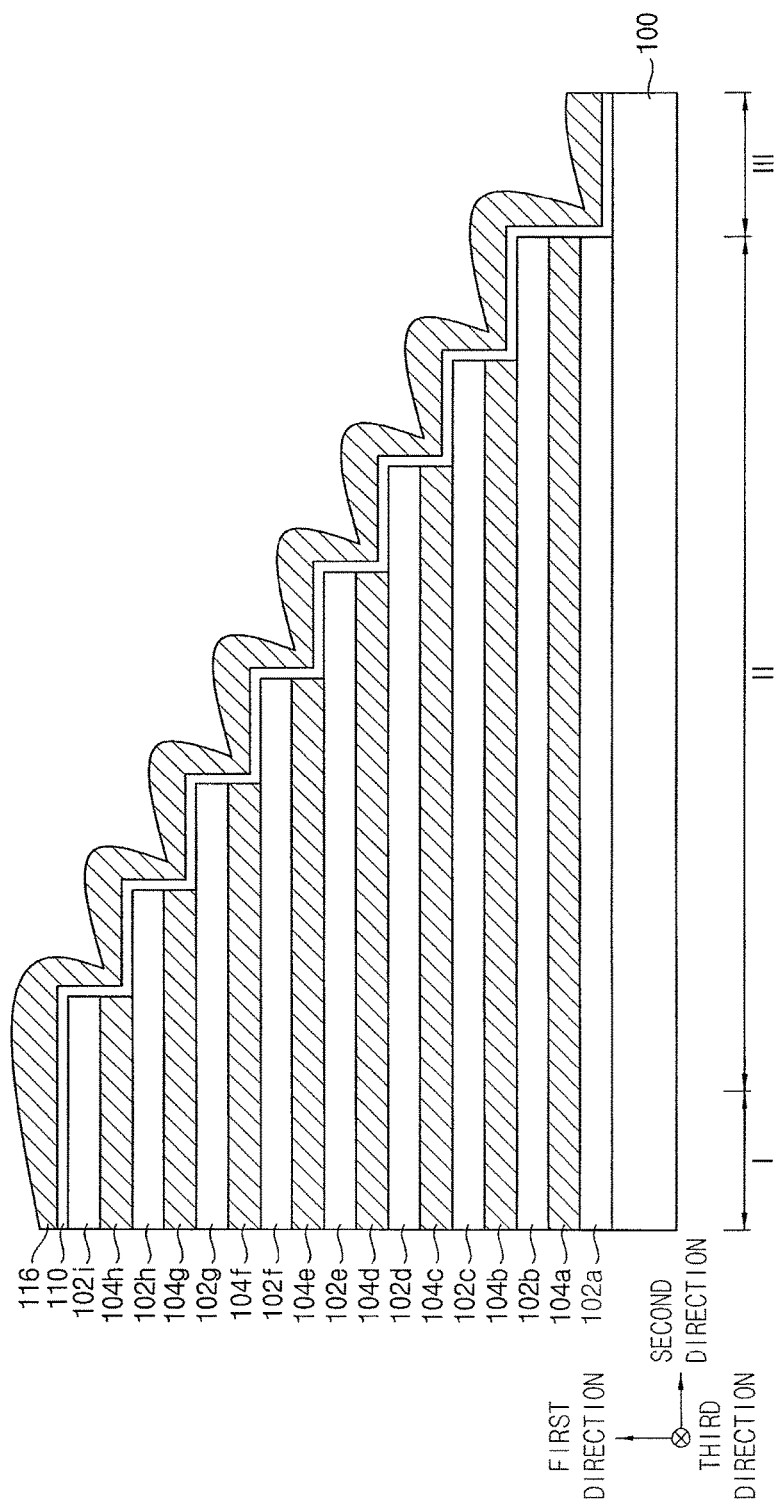
Figure 41:
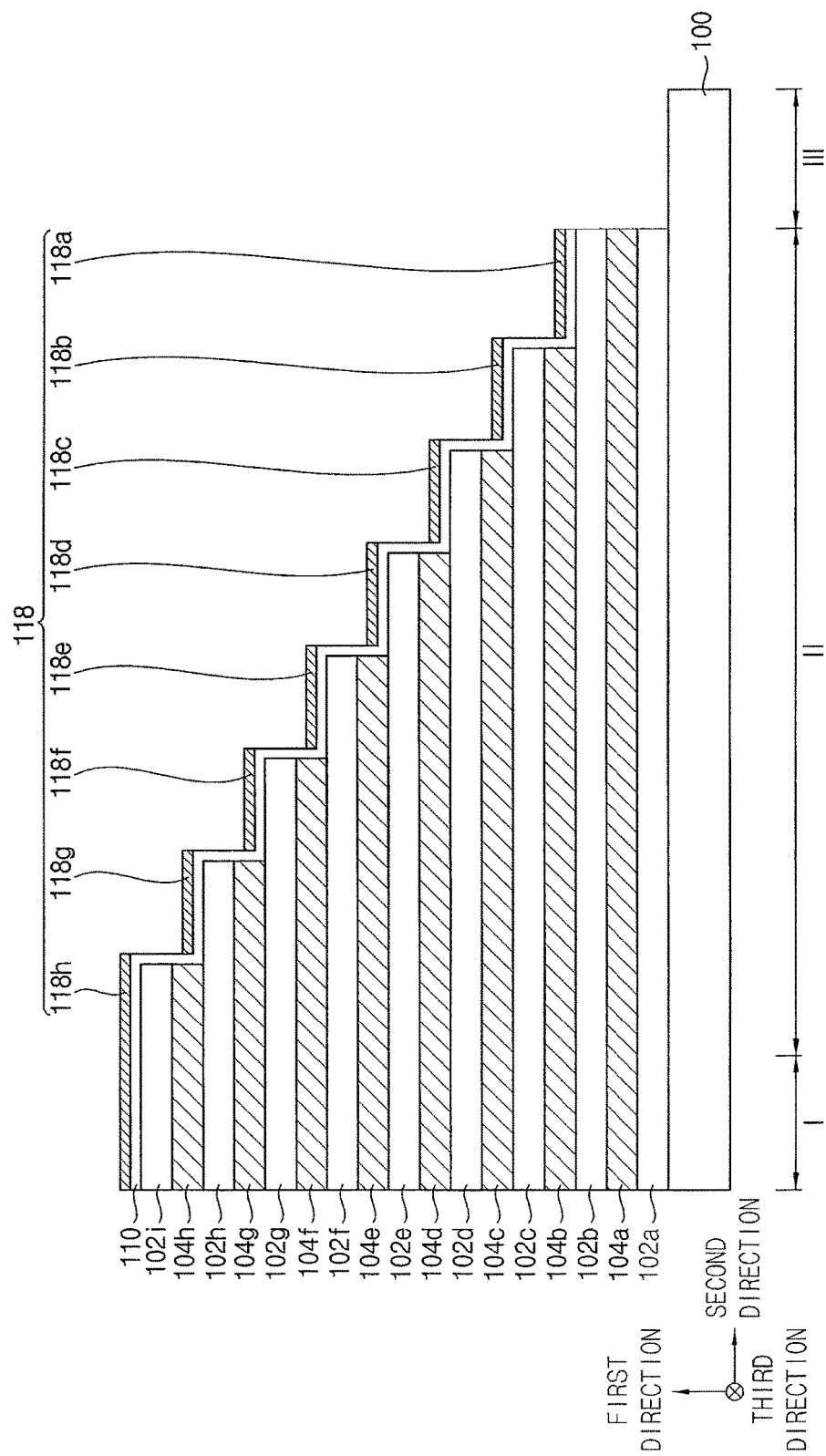

FIGS. 39 to 41 illustrate cross-sectional views of another embodiment of a method for manufacturing a vertical memory device. Processes and/or materials of this embodiment may be substantially the same as or similar to those in FIGS. 4 to 30.

Referring to FIG. 39, processes substantially the same as or similar to those illustrated with reference to FIGS. 4 and 5 may be performed. In example embodiments, insulating interlayers 102 (e.g., 102*a* through 102*i*) and sacrificial layers 104 (e.g., 104*a* through 104*h*) may be alternately and repeatedly on a substrate 100 including a first region I, a second region II, and a third region III to form a mold structure. A portion of the mold structure on the second region II and the third region III may be etched in a stepwise manner by a plurality of photo-lithography processes to form a stepped mold structure as in FIG. 39.

Referring to FIG. 40, a first etch-stop layer 110 and a preliminary second etch-stop layer 116 may be formed along a top surface of the substrate 100 and a surface of the stepped mold structure. The first etch-stop layer 110 may have a shape and a profile substantially the same as those illustrated in FIG. 6. In example embodiments, the preliminary second etch-stop layer 116 may be formed of silicon nitride by a deposition process performed under a low step-coverage condition. Accordingly, the preliminary second etch-stop layer 116 may be relatively thin on sidewalls of the stepped mold structure, and may be relatively thick on top surfaces of the stepped mold structure.

Referring to FIG. 41, a process substantially the same as or similar to that of FIG. 7 may be performed to remove portions of the preliminary second etch-stop layer 116 and the first etch-stop layer 110 formed on the third region III. Subsequently, the preliminary second etch-stop layer 116 may be additionally etched to form preliminary second etch-stop layer patterns 118 (e.g., 118a through 118h) individually separated per each level. In example embodiments, a portion of the preliminary second etch-stop layer 116 formed on the sidewall of the stepped mold structure may be removed by the etching process. A portion of the preliminary second etch-stop layer 116 formed on the top surface of the stepped mold structure may partially remain to form the preliminary second etch-stop layer patterns 118.

Processes substantially the same as or similar to those of FIGS. 8 to 30 may be further performed to obtain the vertical memory device of FIG. 38. In some embodiments, processes for forming a contact spacer as in FIGS. 28 and 29 may be omitted. In example embodiments, the sacrificial layers 104 may be replaced with gate lines 160, and the preliminary second etch-stop layer patterns 118 may be replaced with second etch-stop layer patterns 166 separated per each level.

Figure 42:
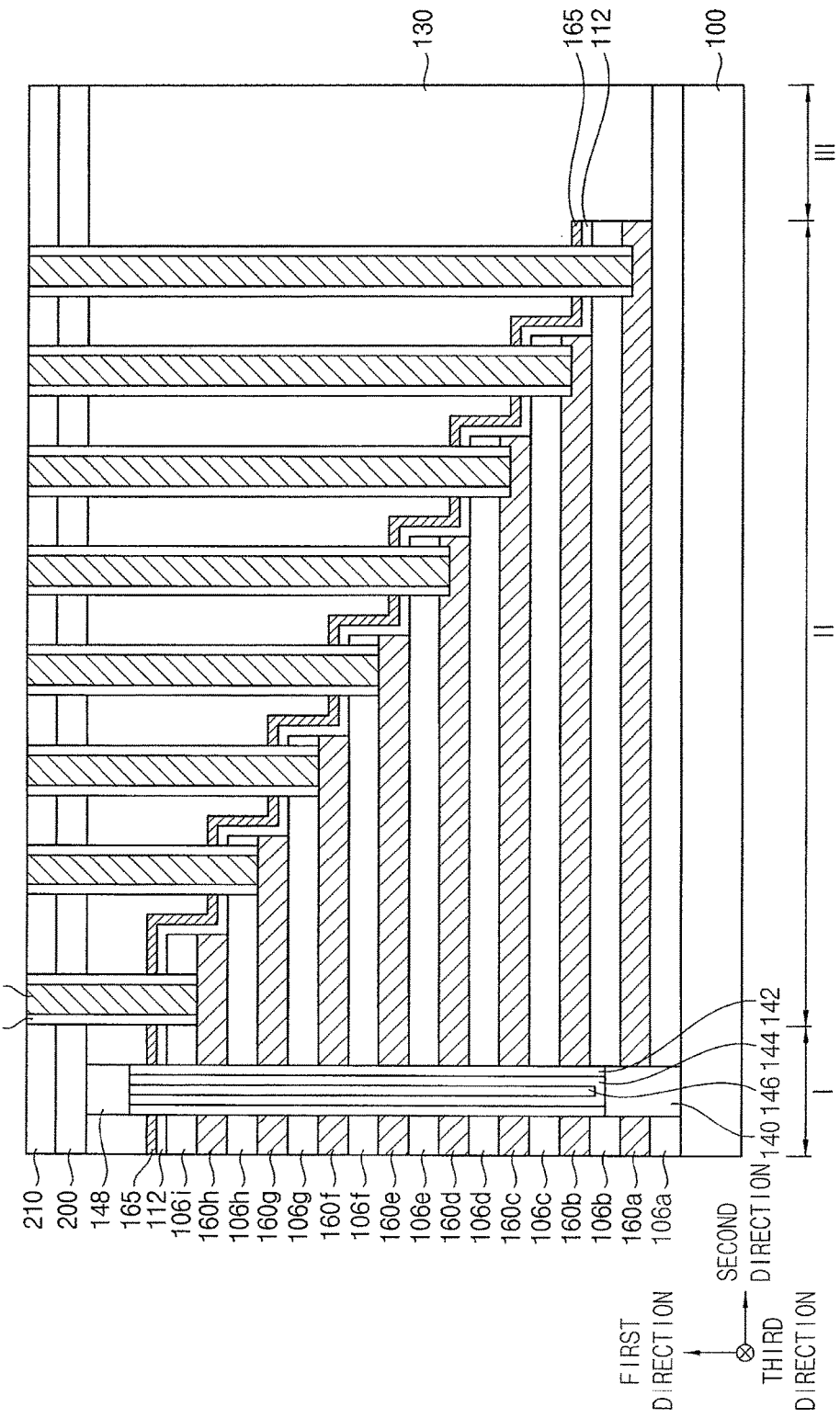
FIGS. 42 and 43 illustrate another embodiment of a vertical memory device.
Figure 43:
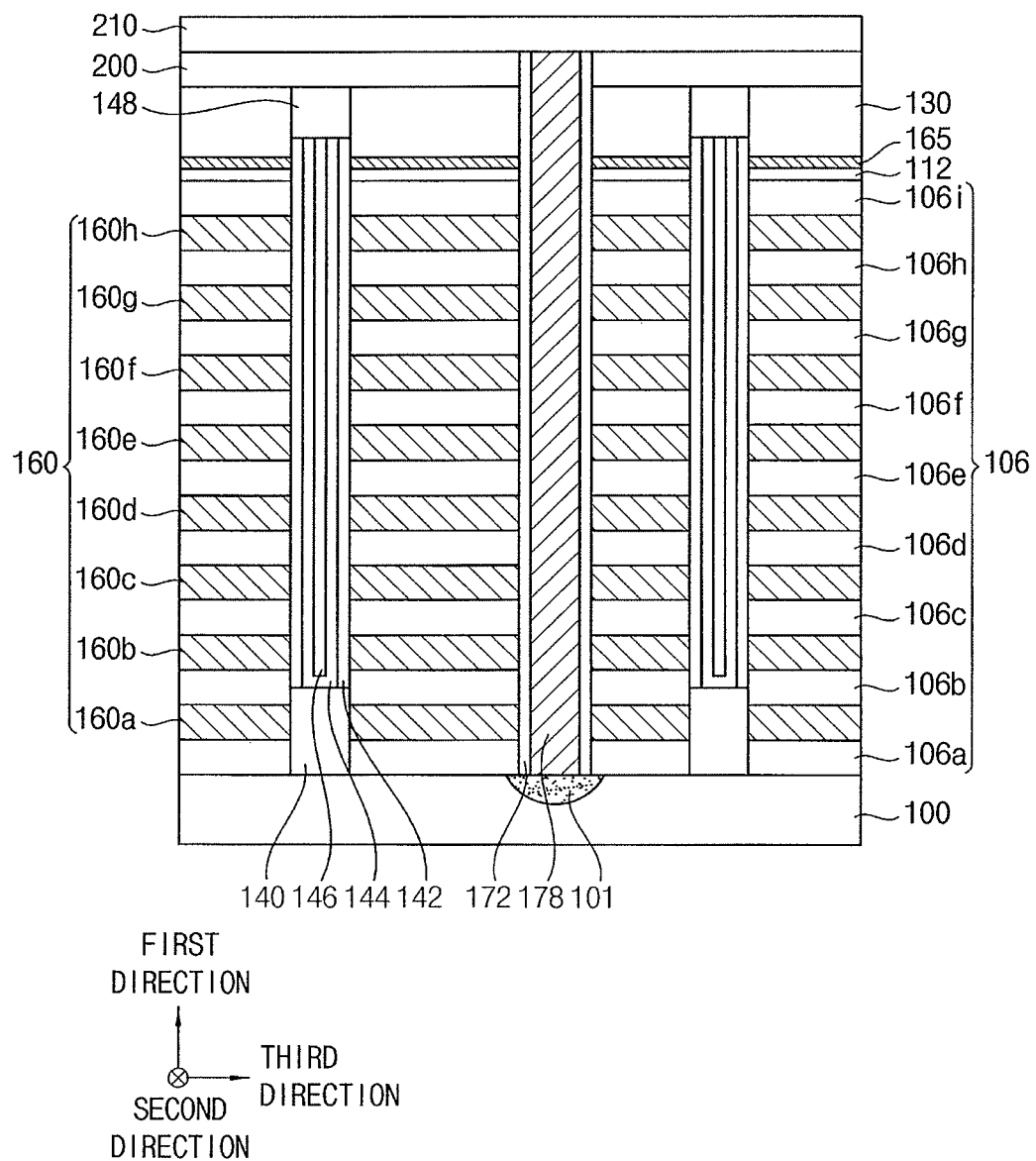

FIGS. 42 and 43 illustrate cross-sectional views of another embodiment of a vertical memory device. Many elements and/or structures of this embodiment may be substantially the same as or similar to those in FIGS. 1 to 3.

Referring to FIGS. 42 and 43, a first upper insulation layer 200 may be formed on the mold protection layer 130. The first upper insulation layer 200 may be formed commonly on the first to third regions I, II, and III, and may cover the pads 148.

A conductive pattern 178 may extend through the first upper insulation layer 200 and between gate lines stack structures neighboring each other. In example embodiments, the conductive pattern 178 may extend in the second direction to contact the impurity region 101. In some embodiments, a metal silicide pattern including, e.g., cobalt silicide (CoSi) or nickel silicide (NiSi), may be formed between the conductive pattern 178 and the impurity region 101.

The conductive pattern 178 may serve as a CSL or a CSL contact of the vertical memory device. A cutting pattern 172 may be formed on a sidewall of the conductive pattern 178, and may extend between the gate line structures together with the conductive pattern 178.

The pad 148 may be protected by the first upper insulation layer 200 while performing an etching process and/or a deposition process for forming the conductive pattern 178.

A second upper insulation layer 210 may be formed on the first upper insulation layer 200. A contact 199 and a contact spacer 196 may extend through the second and first upper insulation layers 210 and 200, the mold protection layer 130, the second etch-stop layer pattern 165, the first etch-stop layer pattern 112, and the insulating interlayer pattern 106 and contact a step portion of the gate line 160 at each level.

The conductive pattern 178 may be protected by the second upper insulation layer 210 while performing a deposition process and/or an etching process for forming the contact 199 and the contact spacer 196.

The first and second upper insulation layers 200 and 210 may include an oxide-based material substantially the same as or similar to that of mold protection layer 130.

In accordance with one or more of the aforementioned embodiments, a first etch-stop layer including an oxide and a second etch-stop layer including a conductive material equal to that included in a gate line may be formed on a surface of a gate line stack structure. An etch-stop layer having a structure substantially the same as or similar to a stack structure of an insulating interlayer and the gate line may be formed, and damage of, e.g., lower word lines, caused by an insufficient etching selectivity may be prevented while forming contact holes through which a step portion of each gate line may be exposed.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area above the substrate and circuitry associated with operation of those memory cells, whether such associated circuitry is above or within the substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels with word lines and/or bit lines shared between levels: U.S. Pat. Nos. 7,679,133; 8,553,466; 8,654,587; 8,559.235; and US Pat. Pub. No. 2011/0233648.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A vertical memory device, comprising:
    a substrate;
    a plurality of gate lines stacked and spaced apart from each other along a first direction that extends vertically with respect to a surface of the substrate, each of the gate lines including a gate step portion protruding in a second direction that is different from the first direction;
    at least one etch-stop layer covering the gate step portion of at least one of the gate lines and including a conductive material;
    channels extending through the gate lines in the first direction; and
    contacts extending through the at least one etch-stop layer and on the gate step portions, wherein the contacts are physically separated from the at least one etch-stop layer.

2. The vertical memory device as claimed in claim 1, further comprising: insulating interlayer patterns spaced apart from each other by the gate lines along the first direction, each of the insulating interlayer patterns including an insulating step portion protruding in the second direction.

3. The vertical memory device as claimed in claim 2, wherein the at least one etch-stop layer includes:
a first etch-stop layer arranged along the insulating step portions, the first etch-stop layer including an oxide; and
a second etch-stop layer on the first etch-stop layer and including a conductive material.

4. The vertical memory device as claimed in claim 3, wherein the second etch-stop layer includes a same metal as in the gate lines.

5. The vertical memory device as claimed in claim 3, wherein the first etch-stop layer includes a same oxide as in the insulating interlayer patterns.

6. The vertical memory device as claimed in claim 3, wherein the second etch-stop layer is divided per each insulating step portion of the insulating interlayer patterns.

7. The vertical memory device as claimed in claim 1, further comprising: a plurality of contact spacers surrounding sidewalls of the contacts.

8. The vertical memory device as claimed in claim 1, wherein the at least one etch-stop layer covers gate step portions of at least some of the gate lines.

9. The vertical memory device as claimed in claim 8, wherein the gate lines include a ground selection line (GSL), word lines, and a string selection line (SSL) sequentially stacked from the surface of the substrate.

10. The vertical memory device as claimed in claim 9, wherein the at least one etch-stop layer only covers gate step portions of the gate selection line and the word lines.

11. The vertical memory device as claimed in claim 9, wherein the at least one etch-stop layer only covers gate step portions of predetermined ones of the word lines.

12. The vertical memory device as claimed in claim 1, wherein the substrate includes:
a cell region on which the channels are disposed;
an extension region on which the step portions of the gate lines are disposed; and
a peripheral circuit region, wherein the at least one etch-stop layer is only on the cell region and the extension region.

13. A vertical memory device, comprising:
a substrate;
a gate line stack structure on the substrate and including:
gate lines stacked and spaced apart from each other in a first direction that extends vertically with respect to a surface of the substrate;
insulating interlayer patterns stacked and spaced apart from each other by the gate lines in the first direction; and
channels extending through the insulating interlayer patterns and the gate lines in the first direction;
a first etch-stop layer on the gate line stack structure and including an insulation material;
a second etch-stop layer on the first etch-stop layer and including a conductive material; and
contacts extending through the second etch-stop layer and the first etch-stop layer, the contacts being electrically connected to the gate lines.

14. The vertical memory device as claimed in claim 13, wherein:
the insulating interlayer patterns and the gate lines are alternately stacked along the first direction in a stepped shape,
the insulating interlayer patterns and the gate lines include step portions protruding in a second direction that is different from the first direction, and
the step portions of the gate lines are covered by the step portions of the insulating interlayer patterns.

15. A memory device, comprising:
a substrate;
a plurality of gate lines stacked on the substrate;
a plurality of insulating layers between the gate lines respectively, the gate lines and insulating layers arranged in steps;
a first etch-stop layer on the steps and including a first material;
a second etch-stop layer on the first etch-stop layer and including a second material different from the first material, wherein the second material is a conductive material;
channels extending through the gate lines; and
contacts extending through the first and second etch-stop layers to contact respective ones of the gate lines through corresponding ones of the insulating layers.

16. The memory device as claimed in claim 15, wherein:
the first material is an insulation material.

17. The memory device as claimed in claim 16, wherein:
the first etch-stop layer and the insulating layers include an oxide, and
the second-etch stop layer and the gate lines include a metal.

18. The memory device as claimed in claim 15, wherein the gate lines include a ground selection line, word lines, and a string selection line sequentially stacked from the substrate.

19. The memory device as claimed in claim 18, wherein the first and second etch-stop layers cover only step portions of predetermined ones of the ground selection line and the word lines.

\* \* \* \* \*